United States Patent
Honda et al.

(10) Patent No.: US 6,838,153 B2
(45) Date of Patent: Jan. 4, 2005

(54) LAYERED PRODUCT, CAPACITOR AND A METHOD FOR PRODUCING THE LAYERED PRODUCT

(75) Inventors: Kazuyoshi Honda, Takatsuki (JP); Noriyasu Echigo, Kobe (JP); Masaru Odagiri, Kawanishi (JP); Nobuki Sunagare, Matsue (JP); Shinichi Suzawa, Nita-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 10/313,227

(22) Filed: Dec. 6, 2002

(65) Prior Publication Data

US 2003/0087037 A1 May 8, 2003

Related U.S. Application Data

(62) Division of application No. 09/554,161, filed as application No. PCT/JP98/05154 on Nov. 16, 1998, now Pat. No. 6,576,523.

(30) Foreign Application Priority Data

Nov. 18, 1997 (JP) .............................. 9-317412
Nov. 18, 1997 (JP) .............................. 9-317416

(51) Int. Cl.$^7$ .............................................. B41M 3/12
(52) U.S. Cl. ..................... 428/147; 428/144; 428/148; 438/496; 438/497; 438/500; 438/503; 438/507; 118/107; 118/300; 427/446; 427/447; 427/448
(58) Field of Search .................... 438/381–387, 438/239, 250, 393–396; 257/298–313

(56) References Cited

U.S. PATENT DOCUMENTS

| | | | |
|---|---|---|---|
| 4,349,862 A | * | 9/1982 | Bajorek et al. ............. 361/762 |
| 4,622,058 A | | 11/1986 | Leary-Renick et al. |
| 4,857,383 A | * | 8/1989 | Greschner et al. ........... 428/156 |
| 4,929,295 A | * | 5/1990 | Kohno et al. ............... 156/230 |
| 5,032,461 A | | 7/1991 | Shaw et al. |
| 5,036,424 A | * | 7/1991 | Yokotani et al. .......... 361/321.4 |
| 5,037,691 A | * | 8/1991 | Medney et al. ............. 428/137 |
| 5,125,138 A | | 6/1992 | Shaw et al. |
| 5,153,813 A | | 10/1992 | Oehrlein et al. |
| 5,171,718 A | * | 12/1992 | Ishibashi et al. ............ 438/571 |
| 5,214,844 A | * | 6/1993 | McWilliams et al. ......... 29/840 |
| 5,290,606 A | * | 3/1994 | Hestevik et al. ............ 427/453 |
| 5,388,328 A | * | 2/1995 | Yokono et al. ............... 29/852 |
| 5,583,359 A | | 12/1996 | Ng et al. |
| 5,623,160 A | | 4/1997 | Liberkowski |

(List continued on next page.)

FOREIGN PATENT DOCUMENTS

| | | |
|---|---|---|
| EP | 147 696 | 7/1985 |
| JP | 55-79867 | 6/1980 |
| JP | 55-47113 | 11/1980 |
| JP | 57-91516 | 6/1982 |
| JP | 60-50053 | 11/1985 |

(List continued on next page.)

*Primary Examiner*—Matthew Smith
*Assistant Examiner*—Granvill D. Lee, Jr.
(74) *Attorney, Agent, or Firm*—Merchant & Gould P.C.

(57) ABSTRACT

A method for producing a laminate having resin layers and thin metal layers by repeating a process unit comprising a step of laminating a resin layer by applying a resin material, a step of depositing a patterning material on the resin layer and a step of laminating a thin metal layer, predetermined times on a turning support (511), wherein the patterning material is stuck on the surface of the resin layer in a noncontact way. A laminate comprising a large number of laminate units each comprising a resin layer and a thin metal layer divided at an electric insulation stripe part can be produced stably. The laminate is applicable to production of a high performance small capacitor at low cost.

38 Claims, 35 Drawing Sheets

U.S. PATENT DOCUMENTS

| | | | |
|---|---|---|---|
| 5,652,022 A | | 7/1997 | Achtner et al. |
| 5,691,209 A | | 11/1997 | Liberkowski |
| 5,856,068 A | * | 1/1999 | Magera et al. ............... 430/312 |
| 5,858,871 A | | 1/1999 | Jeng |
| 5,898,215 A | * | 4/1999 | Miller et al. ................ 257/679 |
| 5,917,157 A | * | 6/1999 | Remsburg ................... 174/252 |
| 5,945,203 A | | 8/1999 | Soane |
| 5,946,566 A | | 8/1999 | Choi |
| 5,972,439 A | * | 10/1999 | Tsunashima et al. ....... 428/1.33 |
| 6,100,574 A | | 8/2000 | Norstrom et al. |
| 6,150,726 A | | 11/2000 | Feilchenfeld et al. |
| 6,236,572 B1 | | 5/2001 | Teshome et al. |
| 6,278,871 B1 | | 8/2001 | Jovenin et al. |
| 6,576,523 B1 | * | 6/2003 | Honda et al. ............... 438/381 |

FOREIGN PATENT DOCUMENTS

| | | |
|---|---|---|
| JP | 61-42903 | 3/1986 |
| JP | 61-183913 | 8/1986 |
| JP | 63-31570 | 2/1988 |
| JP | 63-70411 | 3/1988 |
| JP | 63-31929 | 6/1988 |
| JP | 2-43042 | 2/1990 |
| JP | 3-34512 | 2/1991 |
| JP | 4-14450 | 3/1992 |
| JP | 5-98424 | 4/1993 |
| JP | 5-267091 | 10/1993 |
| JP | 9-190946 | 7/1997 |
| JP | 9-195048 | 7/1997 |

* cited by examiner

LAYERED PRODUCT, CAPACITOR AND A METHOD FOR PRODUCING THE LAYERED PRODUCT

This is a divisional application of Ser. No. 09/554,161 filed May 10, 2000, now U.S. Pat. No. 6,576,528.

TECHNICAL FIELD

A first aspect of the present invention relates to a method for producing a layered product comprising resin layers and metal thin film layers. In particular, the present first invention relates to a method for producing a layered product that is suitable for producing a layered product by depositing a plurality of deposition units, each of which includes a resin layer and a metal thin film layer deposited in an arbitrary shape on the resin layer.

A second aspect of the present invention relates to a layered product including dielectric layers and metal thin film layers, in particular, a layered product suitably used for an electronic component such as a capacitor.

BACKGROUND ART

Regarding the First Invention

A layered product comprising resin layers and metal thin film layers is used in a wide range of applications, for example, as a magnetic recording medium such as a magnetic tape, a wrapping material or an electronic component.

The resin layers used in such a layered product are produced by melting and stretching a resin material into a self-supported film or by applying a solution of a resin material diluted with a solvent to a supporting base and drying the resin for curing. However, the smallest thickness of the resin layer obtained by these methods is only about 1 $\mu$m, and neither of the above methods can produce thinner resin layers stably. Moreover, the former method tends to require large scale equipment. In the latter method, some solvents are not preferable to be used for environmental reasons, and defects tend to be generated in the coating film after drying.

As a method for producing thin resin layers stably that does not cause any of the above problems, a method of forming a resin thin film on a supporting base in a vacuum has been proposed. In this method, a resin material is evaporated in a vacuum and applied to a supporting base to produce thin films. It is said that this method allows resin thin film layers without void defects to be formed.

On the other hand, for formation of metal thin film layers, a method of vacuum evaporation on a surface of a supporting base that is moving at high speed is advantageous for mass production and is put in industrially practical use.

Primarily in the application as electronic components and other applications as well, patterning of metal thin film layers, namely forming metal thin film layers only on a specific region, is performed. For example, a metal thin film layer can be divided into a plurality of sections by forming an insulating region where no metal thin film layer is formed, so that metal thin film layers having different electric potentials can be formed in a layered product.

Oil margin is a known method for patterning the metal thin film layer. This method utilizes the following principle. When a patterning material such as oil is previously formed in a small thickness on a supporting base, and then a metal thin film is formed by metal evaporation or the like, a metal thin film layer is not formed on the patterning material.

The recent needs for a layered product including resin layers and metal thin film layers are directed to further degrees of compactness, high performance and low cost. For example, various required characteristics are satisfied or a specific function is provided by depositing a plurality of deposition units comprising resin layers and patterned metal thin film layers. In this manner, efforts have been made to achieve both compactness and high performance. Moreover, efforts have been made also to achieve a low cost by depositing layers for a layered product comprising resin layers and metal thin film layers continuously on a rotating supporting base.

However, in production of a layered product by depositing a number of layers alternating a resin layer and a metal thin film layer on a rotating supporting base, when depositing a metal thin film layer in a specific region by applying a patterning material in a specific shape after deposition of the resin layer and before deposition of the metal thin film layer, problems such as chapping of the surface of the deposited layers, pinholes (lack of deposition) of the resin layer or the metal thin film layer, instability of the deposition region of the metal thin film layer (e.g., deposition is beyond the limit of the desired deposition region or is short of the desired deposition region) or the like turned out to be caused. These problems were not caused in a conventional method for producing a two-layered product simply by applying a patterning material to a resin layer and then forming a metal thin film layer. In addition, these problems tend to be more significant with decreasing deposition thickness of each layer.

Regarding the Second Invention

The current need for compactness and high performance of electronic components is increasingly strengthened, and this is the case also for capacitors. The capacitance of the capacitor is in proportion to the area of the dielectric and in inverse proportion to the square of the thickness of the dielectric layer when the dielectric constant of the dielectric is the same. Therefore, in order to achieve a compact capacitor and maintain or increase the capacitance thereof, it is effective to make the dielectric layer thin and increase an effective area of a region where capacitance is generated.

One known example of a layered product comprising dielectric layers and metal thin film layers used for electronic components such as capacitors is a layered product for a film capacitor. This layered product is formed by layering or winding a metallized film obtained by depositing a metal thin film such as aluminum on a resin film such as polyester (e.g., PEN, PET), polyolefin (e.g., PP) or PPS by vacuum evaporation, sputtering or the like.

However, there is a limit for the thickness of the resin film due to various constraints such as handling properties or processability of the film during or after production. The smallest thickness of currently used film capacitors is about 1.2 $\mu$m. Thus, making a thinner dielectric layer and increasing the effective area of the capacitance generation portion while maintaining the volume of the capacitor have reached the limit, thereby preventing the achievement of both compactness and high capacitance of the film capacitor.

On the other hand, a layered product for a capacitor comprising a dielectric layer and a metal thin film layer produced by a method totally different from that for the conventional film capacitor, which allows the thickness of a dielectric layer to be about 1am, has been proposed (Japanese Patent (Tokko-Sho) No. 63-31929, U.S. Pat. No. 5,125,138 or the like).

However, the capacitor disclosed in Japanese Patent (Tokko-Sho) No. 63-31929 has a structure where a metal thin film layer (electrode layer) is inclined to the deposition direction so as to be in contact with the side of the capacitor, thereby forming electrodes. Therefore, the metal thin film layer is likely to be ruptured in the inclined portion of the metal thin film layer. In addition, the appearance thereof is significantly different from that of a conventional chip film capacitor, so that special consideration for mounting is required.

On the other hand, U.S. Pat. No. 5,125,138 discloses a layered product where the metal thin film layer (electrode layer) is exposed at the side of the layered product without being inclined. However, the deposition thickness is significantly different between a portion where a small number of metal thin film layers are deposited and the other portions in the overall layered product. Therefore, a recess is generated on the upper surface in the deposition direction in the portion where a small number of metal thin film layers are deposited. This recess deteriorates the handling properties when mounting the layered product onto a printed circuit board with a solder and adversely affects the wettability of the solder. Moreover, since the dielectric layer and the metal thin film layer are inclined or curved in the vicinity of the recess, the deposition thickness is small, thus leading to a drop of the withstand voltage, pinholes of the dielectric layer, poor conductivity of the metal thin film layer or the like, when the layered product is used as a capacitor. Furthermore, such a recess makes it difficult to produce the layered product itself. The recess is generated more significantly with decreasing thickness of the dielectric layer (e.g., 1 μm or less) and with increasing the number of depositions (e.g., 100 or more, particularly 1000 or more). Therefore, in such a layered product, it was still difficult to achieve both compactness and high capacitance of the capacitor.

DISCLOSURE OF INVENTION

Regarding the First Invention

It is an object of the first invention to provide a method for producing stably a layered product formed by depositing a plurality of deposition units, each of which includes a resin layer and a metal thin film layer deposited in a specific region, thus satisfying the requirements for compactness, high performance and low cost.

In order to achieve the above object, the first invention has the following embodiments.

A first method for producing a layered product of the present first invention includes repeating a process unit on a rotating supporting base a predetermined number of times, the process unit including applying a resin material so as to deposit a resin layer; applying a patterning material on the resin layer; and depositing a metal thin film layer, thereby producing a layered product comprising resin layers and metal thin film layers. The patterning material is applied onto a surface of the resin layer in a contactless manner.

A second method for producing a layered product of the present first invention includes repeating a process unit on a rotating supporting base a predetermined number of times, the process unit including applying a resin material so as to deposit a resin layer; applying a patterning material on the resin layer; and depositing a metal thin film layer, thereby producing a layered product comprising resin layers and metal thin film layers. Residual patterning material is removed, after the metal thin film layer is deposited and before the resin layer is deposited.

Furthermore, a third method for producing a layered product of the present first invention includes repeating a process unit on a rotating supporting base a predetermined number of times, the process unit including applying a resin material so as to deposit a resin layer, applying a patterning material on the resin layer, and depositing a metal thin film layer, thereby producing a layered product comprising resin layers and metal thin film layers. The patterning material is at least one oil selected from the group consisting of ester oils, glycol oils, fluorocarbon oils and hydrocarbon oils.

The first, second and third methods for producing a layered product provide a layered product having no problems such as chapping of the surface of the deposited layer, a pin-hole in the resin layer or the metal thin film layer, instability of the deposited regions of the metal thin film layer or the like. Therefore, the layered product produced by the methods of the present invention can be used in a wide range of applications that require compactness, high performance and low cost, for example, a magnetic recording medium such as a magnetic tape, a wrapping material, or an electronic component.

Regarding the Second Invention

It is an object of the second invention to provide a layered product comprising dielectric layers and metal thin film layers that hardly has rupture of the metal thin film layer, and requires no special consideration for mounting when it is used as a capacitor, because it has an appearance and configuration similar to those of a conventional film capacitor and, at the same time, satisfies the requirements for both compactness and high capacitance and to provide a capacitor using the layered product. Furthermore, it is another object of the second invention to provide a method for producing a layered product having such characteristics.

In order to achieve the above object, the second invention has the following embodiments.

A first layered product of the second present invention includes at least 100 deposition units, each of which includes a dielectric layer having a thickness not more than 1 μm, and a first metal thin film layer and a second metal thin film layer deposited on one surface of the dielectric layer, the first metal thin film layer and the second metal thin film layer being separated by a belt-shaped electrically insulating portion. The deposition position of the electrically insulating portion of the deposition unit is different from that of the deposition unit adjacent thereto, and the electrically insulating portions of every other deposition unit are not deposited in the same position in the overall layered product.

A second layered product of the second present invention includes 100 or more deposition units, each of which includes a dielectric layer having a thickness not more than 1 μm and a metal thin film layer deposited on one surface of the dielectric layer except a portion where a belt-shape electrically insulating portion is present on an end of the surface of the dielectric layer. The electrically insulating portions of adjacent deposition units are positioned on opposite sides, and the widths of the electrically insulating portions of every other deposition unit are not the same in the overall layered product.

A capacitor of the second present invention is formed with the first or second layered product.

Furthermore, a method for producing the layered product of the second present invention includes repeating a process unit a predetermined number of times, the process unit including applying a resin material so as to deposit a dielectric layer; applying a patterning material on the dielectric layer; and depositing a metal thin film layer, thereby producing a layered product comprising dielectric layers and metal thin film layers. The position of the $2n^{th}$ (n is a natural number) application of the patterning material is different from that of the $2n-1^{th}$ application of the patterning material, and all the positions of the $2n^{th}$ application of the patterning material are not the same, and all the positions of the $2n-1^{th}$ application of the patterning material are not the same.

With the above described embodiments, the second present invention has the following advantages.

In the first and second embodiments of the layered product of the second present invention, the metal thin film layer is hardly ruptured, and when it is used as a capacitor, a special consideration for mounting is not required, because it has an appearance and configuration similar to those of a conventional film capacitor, and compactness and high capacitance can be achieved.

Furthermore, the method for producing the layered product of the second present invention allows the above-described layered product to be produced in a simple method, efficiently and inexpensively.

BEST MODE FOR CARRYING OUT THE INVENTION

Regarding the First Invention

Embodiment 1

Figure 1:
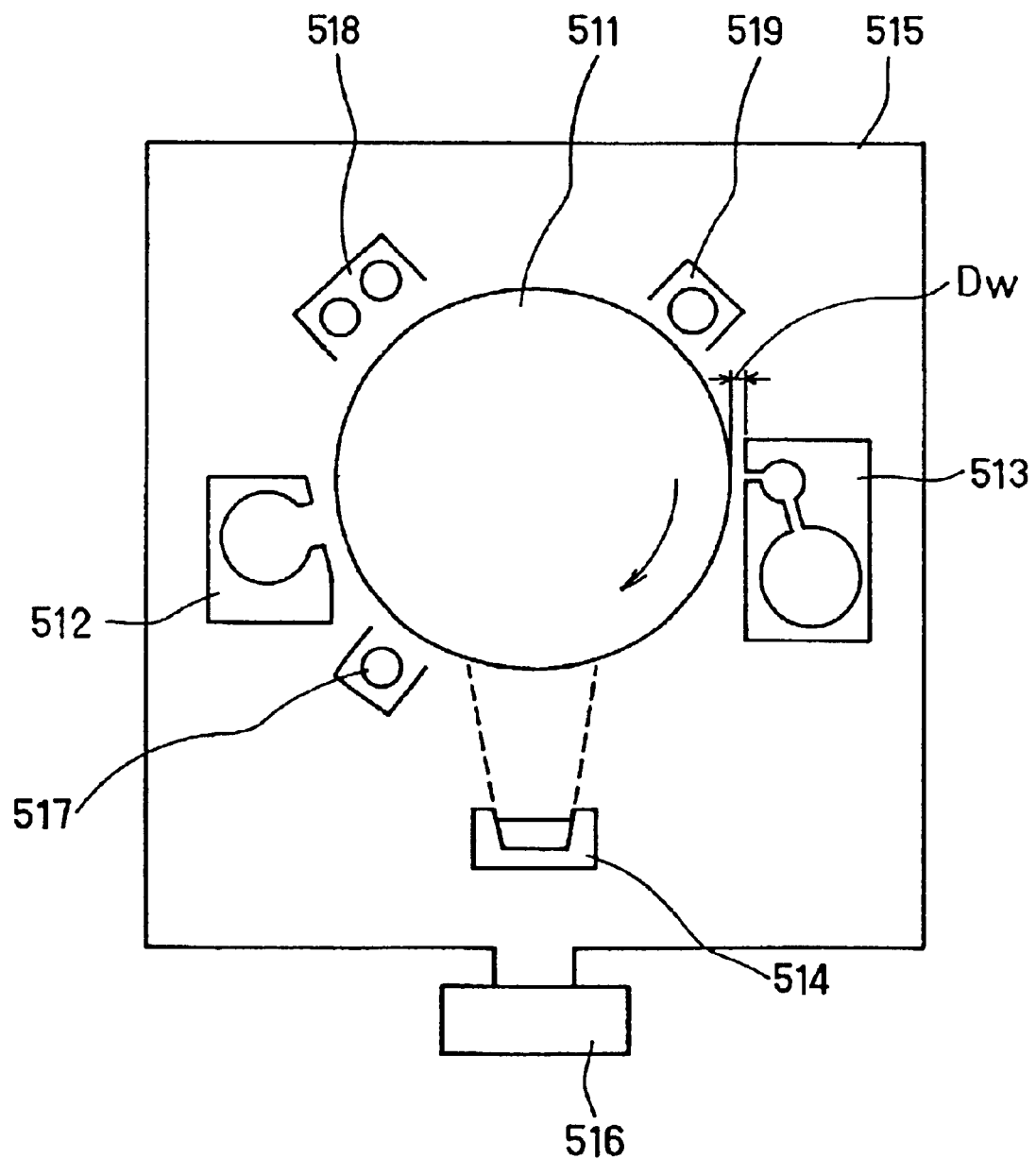
FIG. 1 is a schematic view showing an example of an apparatus with which a method of the present first invention is performed.

FIG. 1 is a schematic view showing an example of an apparatus with which the method of the first invention is performed.

An apparatus 514 for forming a metal thin film layer is provided at a lower portion of a cylindrical can roller 511, which rotates in the direction of the arrow in FIG. 1 with constant angular velocity or constant circumferential velocity. An apparatus 512 for forming a resin layer is provided downstream in the rotation direction of the can roller 511, and an apparatus 513 for applying patterning material is provided upstream.

The circumferential surface of the can roller 511 is smooth, preferably mirror-finished, and cooled preferably to −20° C. to 40° C., more preferably −10° C. to 10° C. The rotation velocity can be adjusted freely, but preferably is about 15 to 70 rpm. The circumferential velocity is preferably 20 to 200 m/min.

The apparatus 512 for forming a resin layer evaporates or atomizes a resin material for forming a resin layer and releases the resin material toward the surface of the can roller 511. The resin material adheres onto the circumferential surface of the can roller 511 and forms a resin layer. As the resin material, any material can be used, as long as it can be deposited and forms a thin film after being evaporated or atomized in this manner. The material can be selected suitably depending on the use of the layered product, but preferably is a reactive monomer resin. For example, for the resin thin film layer of the layered product to be used as an electronic component, a material comprising an acrylate resin or a vinyl resin as a main component is preferable. More specifically, polyfunctional (meth)acrylate monomer or polyfunctional vinyl ether monomer is preferable. In particular, cyclopentadiene dimethanol diacrylate, cyclohexane dimethanol divinyl ether monomer or monomer with substituted hydrocarbon groups is preferable because of their electrical properties. The resin material can be scattered by heating means such as a heater, ultrasonic waves, or an evaporating or atomizing technique such as spraying. In particular, it is preferable to evaporate the resin material by heating means such as a heater.

The deposited resin material can be cured to a desired curing degree by an apparatus 518 for curing resin, if necessary. The curing treatment is performed, for example by polymerizing and/or cross-linking the resin material. As the apparatus for curing resin, an electron beam irradiation device, a UV beam irradiation device, a thermosetting device or the like can be used, for example. The curing degree can be changed suitably depending on the required characteristics of the layered product to be produced, but for example, the curing degree is preferably 50–95%, and more preferably 50–75%, when producing a layered product for an electronic component such as a capacitor. If the curing degree is below these ranges, the layered product easily can be deformed, or the metal thin film is ruptured or short-circuited by external pressure applied in the step of pressing the layered product obtained by the method of the present invention or mounting it on a circuit board as an electronic component. On the other hand, if the curing degree is above the above ranges, the layered product may break, for example when the cylindrical layered product is removed from the can roller after production of the layered product, or thereafter when the layered product is pressed to obtain a flat layered base element. To determine the curing degree of the present invention, the ratio of the absorbance of the C=O groups and the C=C groups (1600 $cm^{-1}$) is determined with an infrared spectrophotometer, the ratio of each monomer and the cured product is determined, and the curing degree is defined as 1 minus the reduced absorption ratio.

There is no particular limitation regarding the thickness of the resin layer, but the thickness is preferably 1 $\mu$m or less, more preferably 0.7 $\mu$m or less, and most preferably 0.4 $\mu$m or less. A thinner resin layer can fulfill the requirement for compactness and high performance of the layered product obtained by the method of the present invention. For example, when the layered product obtained by the method of the present invention is used as a capacitor, as the thickness of the resin layer that serves as the dielectric layer is smaller, the capacitance of the capacitor increases in inverse proportion to the thickness thereof. Even if the thickness is small, the effects of the present invention can be achieved, or rather when it is small, the effects of the present invention can be provided more significantly.

The surface of the formed resin layer is treated with an apparatus 519 for treating a resin surface, if necessary. For example, the surface of the resin layer can be activated with an oxygen plasma or the like to increase the adhesiveness with the metal thin film layer.

The apparatus 513 for applying patterning material deposits a patterning material on the surface of the resin layer in a predetermined shape. At the portions where the patterning material has been deposited, no metal thin film is formed. In this embodiment, the patterning material is deposited on the surface of the resin layer formed on the can roller 511 in a predetermined position in the circumferential direction and in a predetermined shape for a predetermined number of patternings.

Thereafter, a metal thin film layer is formed with an apparatus 514 for forming a metal thin film layer. The metal thin film can be formed by a technique of evaporation, sputtering, ion plating or other known techniques, but evaporation, especially electron beam evaporation, is preferable because a film having excellent humidity resistance can be produced with high productivity. As the material of the metal thin film layer, aluminum, copper, zinc, nickel, a compound thereof, an oxide thereof or an oxide of an compound thereof can be used. Among these, aluminum is preferable because of its adhesiveness and cost-efficiency. The metal thin film layer can contain a component other than those described above.

There is no particular limitation regarding the thickness of the metal thin film layer, and the thickness can be determined suitably by the use to which the layered product is applied. However, in the case where the layered product is used as an electronic component, the thickness is preferably 50 nm or less, more preferably 10 to 50 nm, and most preferably 20 to 40 nm. Furthermore, the film resistance is preferably 15$\Omega/\square$ or less, more preferably 10$\Omega/\square$ or less, and most preferably 1 to 8$\Omega/\square$, and most suitably 2 to 6$\Omega/\square$.

Furthermore, when the layered product is used as an electronic component, especially a capacitor, the ratio of the thickness of the resin layer to the thickness of the metal thin film layer is preferably 20 or less, and more preferably 15 or less, because in the case where a pinhole in the resin layer causes the opposing metal thin film layer to be electrically short-circuited, the metal thin film layer is burnt or leached by overcurrent. Thus, a self-healing function of removing a defect works well.

These apparatuses are installed inside a vacuum container 515, in which a vacuum is maintained with a vacuum pump 516. The degree of vacuum inside the vacuum container 515 is about $2 \times 10^{-4}$ Torr. The vacuum apparatus 515 can be divided into a plurality of compartments each of which is used for each process, and the optimal degree of vacuum for each process can be maintained in the corresponding compartment.

A first method for producing a layered product of the present invention comprises repeating a process unit on a rotating supporting base a predetermined number of times, the process unit including applying a resin material so as to deposit a resin layer, applying a patterning material on the resin layer, and depositing a metal thin film layer, thereby producing a layered product comprising resin layers and metal thin film layers. The method is characterized in that the patterning material is applied onto a surface of the resin layer in a contactless manner.

Techniques of applying liquid patterning material directly onto the deposition surface by coating such as reverse coating and die coating or transfer are widely used as a technique of applying a pattering material called oil margin. However, in the method for producing a layered product where resin layers and metal thin film layers are deposited sequentially on a rotating supporting base, as in the present invention, a layered product having a smaller thickness than that of a conventional layered product can be produced easily. In this case, an external pressure applied to the thin film layer during deposition cannot be ignored in such contact application methods. For example, an external pressure during deposition causes deformation of the resin layer or the metal thin film layer, the subsequent rupture of these layers, chapping of the surface of the layered product or the like to occur significantly.

To apply the patterning material on the resin surface in a contactless application manner, evaporated and vaporized patterning material can be ejected from pinholes and condensed on the surface of the resin layer, or liquid patterning material can be ejected from pinholes and applied.

First, the method in which evaporated and vaporized patterning material can be ejected from pinholes and condensed on the surface of the resin layer will be described. This method has the advantages that the patterning material can be applied in a necessary and sufficient thickness stably in a predetermined area, and its structure is simple.

Figure 2:
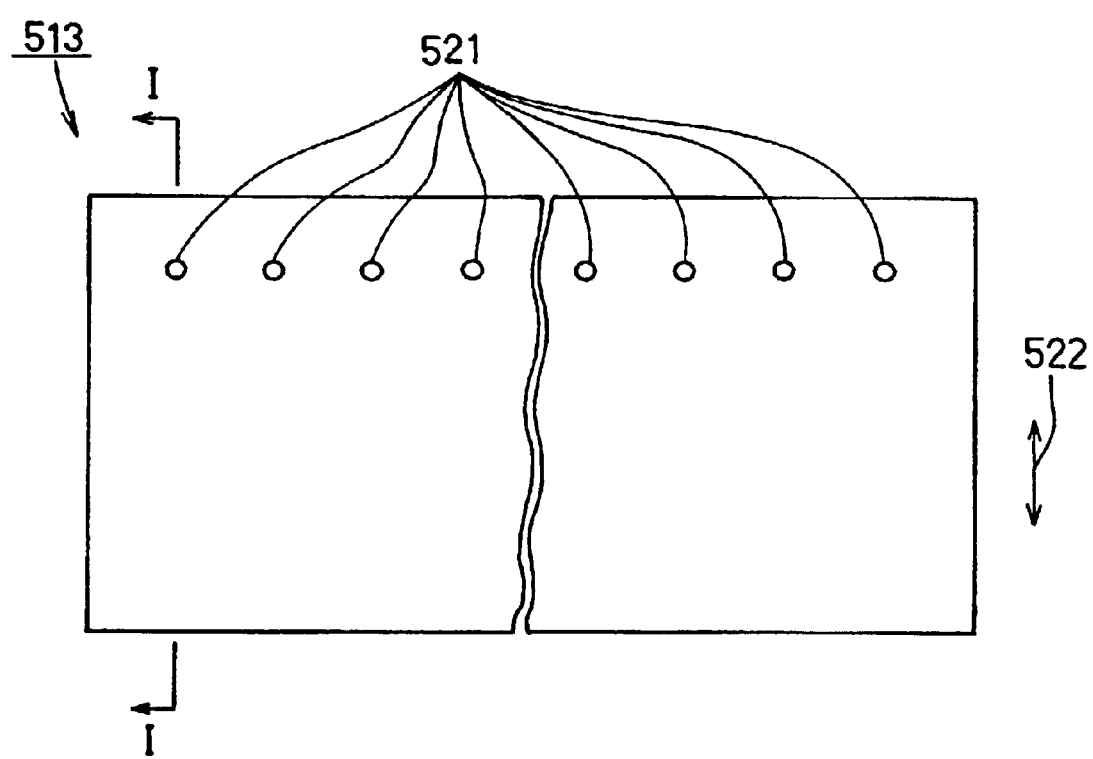
FIG. 2 is a front view of an example of an apparatus for applying pattering material.

FIG. 2 shows a front view of an example of an apparatus for applying patterning material that can eject vaporized patterning material. On the front of the apparatus 513 for applying patterning material, a predetermined number of pinholes 521 are arranged at predetermined intervals. The apparatus 513 for applying patterning material is positioned in a manner that the pinholes 521 oppose the deposition surface, and the direction indicated by arrow 522 matches the travel direction of the deposition surface. Then, the evaporated patterning material is ejected from the pinholes 521 so as to deposit the patterning material on the deposition surface, and condensed by cooling, whereby a deposition film of the patterning material is formed. Consequently, the interval and the number of pinholes 521 correspond to the interval and the number of belt-shaped depositions of the patterning material on the surface of the resin layer.

Figure 3:
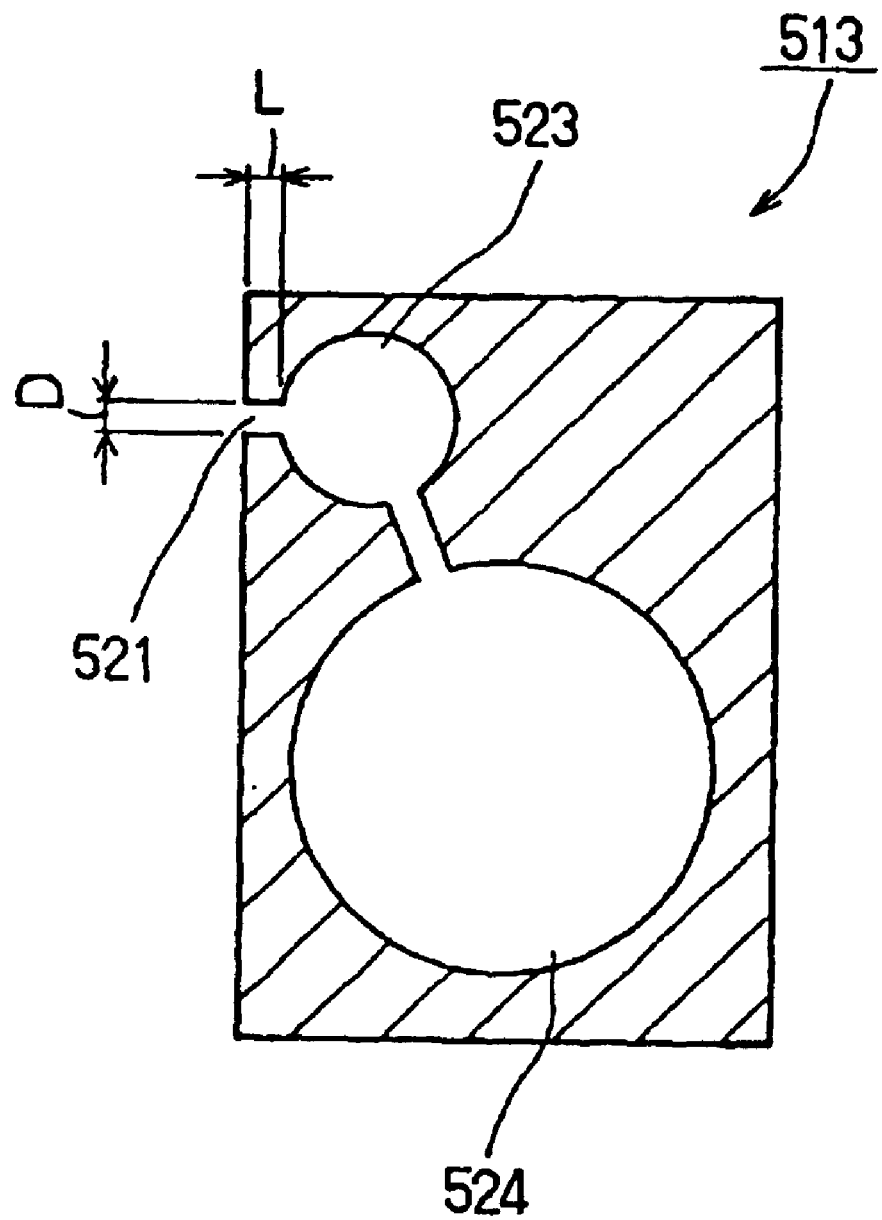
FIG. 3 is a cross-sectional view taken in the arrow direction of line I—I in FIG. 2.

FIG. 3 is a cross-sectional view taken in the arrow direction of line I—I in FIG. 2. The pinholes 521 are connected to a nozzle 523, which is connected to a container 524. In this example, patterning material is supplied to the container 524 from the outside.

Figure 4:
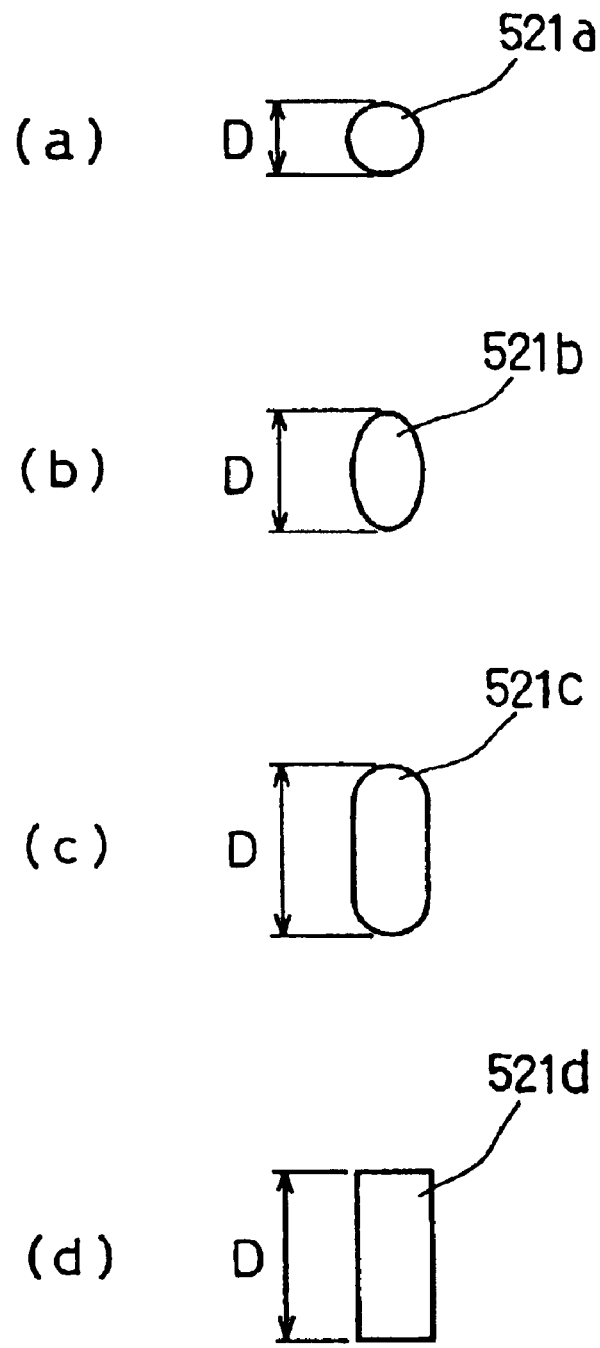
FIG. 4 is a schematic view showing an example of a shape of a pinhole viewed from the front of the apparatus for applying pattering material.

The shape of the pinholes 521 of the nozzle can be round (circular), as shown in FIG. 2, but other shapes are also possible. FIG. 4 shows examples of the shape of the pinholes viewed from the front of the apparatus for applying patterning material. For example, an elliptical shape in FIG. 4(b), an elongated shape in FIG. 4(c), and a rectangular shape in FIG. 4(d) can be used, in addition to a round shape in FIG. 4(a). In this case, when the maximum diameter D of the pinhole is 10 to 500 $\mu$m, especially 30 to 100 $\mu$m, a deposition film of the patterning material having a suitable thickness and distinct borders can be obtained. It is preferable to arrange the pinhole so that the direction of the maximum diameter of the pinhole (the vertical direction in the drawing) matches the travel direction of the deposition surface. Moreover, a plurality of pinholes having various shapes as described above can be provided close to each other so as to form one deposition position of the patterning material. In this case, when the plurality of pinholes are arranged along the travel direction of the deposition surface, the patterning material is highly likely to be applied well for forming a film. The shape, the size, the number, and the arrangement of the pinholes are selected suitably depending on various conditions such as the type of the patterning material, the application width, and the travel speed of the deposition surface.

When evaporated patterning material is ejected from the pinholes, it scatters while maintaining a certain directionality. In order to form a deposition film of the patterning material so that it has a predetermined width and distinct borders, it is preferable that the width of scattering of the ejected patterning material is narrow. For this reason, it is preferable that L/D is 1 to 10, more preferably 2 to 8, and most preferably 3 to 7, where D is the maximum diameter and L is the depth of the pinhole (see FIG. 3). When L/D is smaller than the above ranges, the patterning material scatters in a broad range, so that it is difficult to form the preferable deposition film. On the other hand, when L/D is larger than the above ranges, not only does the directionality of scattering of the patterning material not improve, but also it becomes difficult to process the pinholes, increasing the cost.

It is especially preferable that the maximum diameter D of the pinhole and the L/D satisfy the above-described ranges at the same time, because good patterning material can be obtained stably.

Next, a method of supplying the patterning material to the apparatus for applying patterning material will be described.

Figure 5:
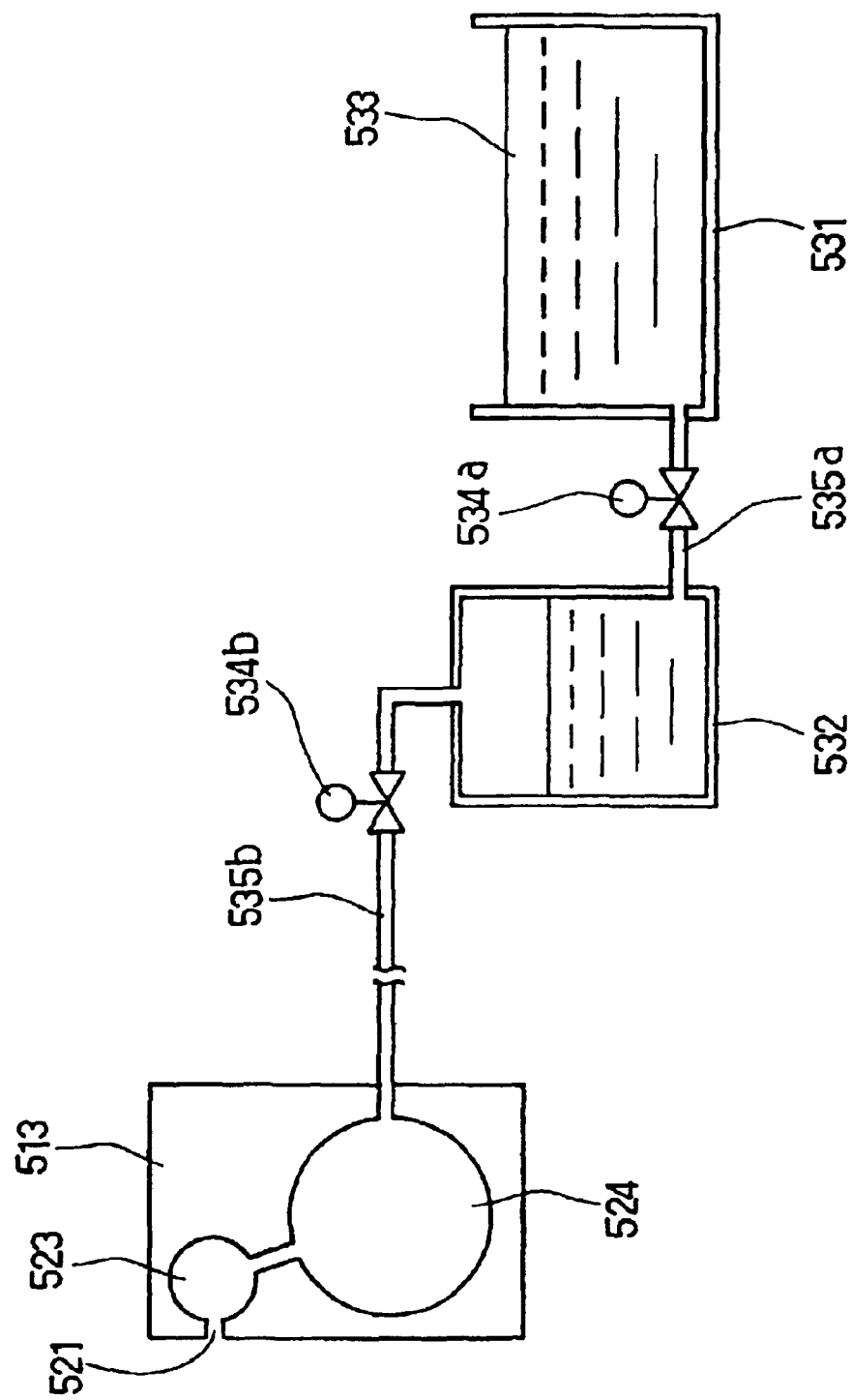
FIG. 5 is a schematic view showing an example of a structure where vaporized patterning material is supplied to the apparatus for applying pattering material.

FIG. 5 is a schematic view illustrating an example of a structure where evaporated patterning material is supplied to the apparatus for applying patterning material. Liquid patterning material 533 is accumulated in a reserve tank 531, and supplied to an evaporation device 532 through a pipe duct 535a having a valve 534a. The evaporation device 532 heats and evaporates the patterning material. The evaporated patterning material is transferred to the container 524 of the apparatus 513 for applying patterning material via a pipe duct 535b having a valve 534b. Then, the patterning material is ejected toward the deposition surface through the nozzle 523 and the pinholes 521. In this case, the pipe duct 535b and the apparatus 513 for applying patterning material are heated and kept at a predetermined temperature so that the patterning material is not condensed. The reserve tank 531 and the evaporation device 532 are provided outside the vacuum apparatus 515 (see FIG. 1). In this example, since the patterning material is evaporated by the evaporation device 532 before proceeding to the apparatus 513 for applying patterning material, patterning material vapor that is stable over time can be obtained.

Figure 6:
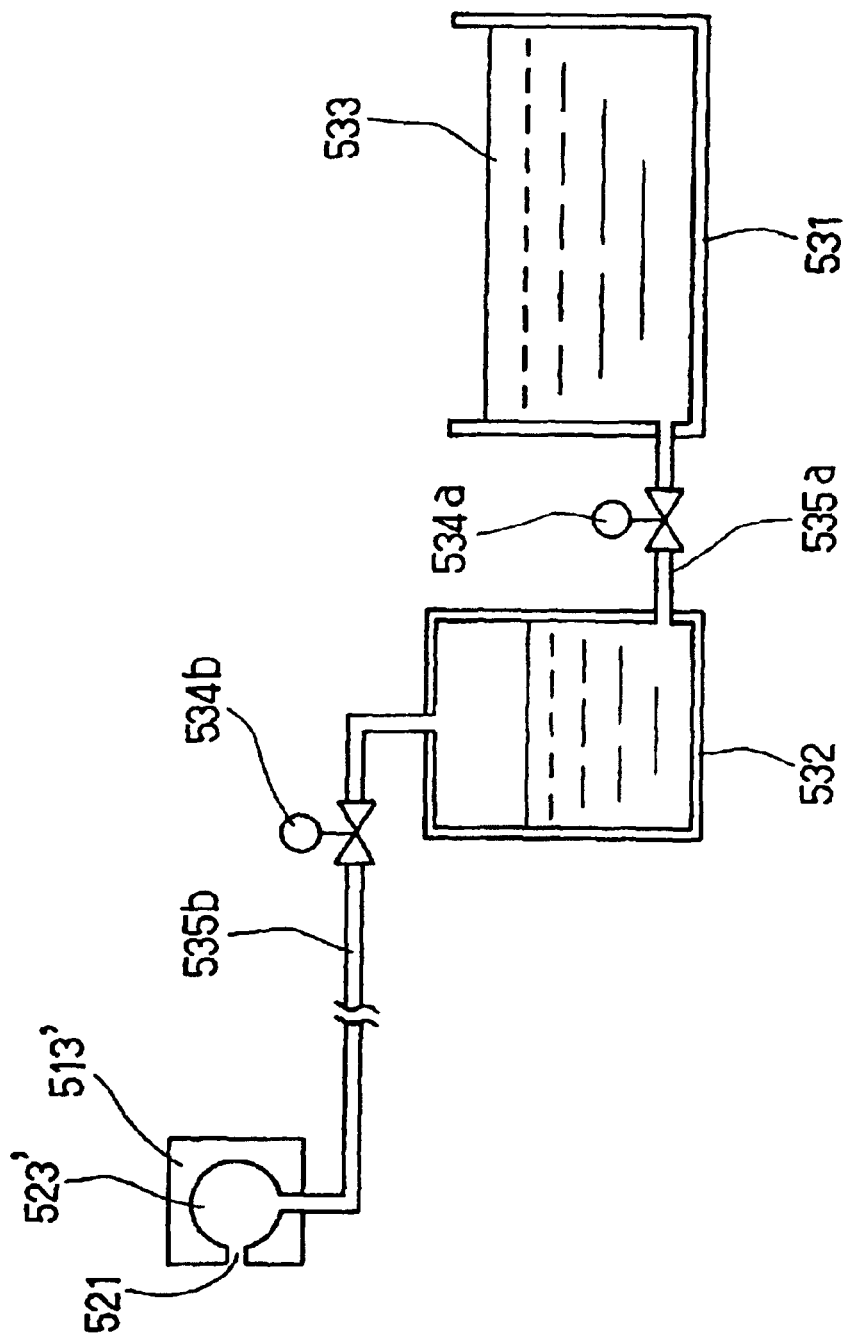
FIG. 6 is a schematic view showing another example of a structure where vaporized patterning material is supplied to the apparatus for applying pattering material.

FIG. 6 is a schematic view illustrating another example of a structure where evaporated patterning material is supplied to the apparatus for applying patterning material. This example is different from the example in FIG. 5 in that an apparatus 513' for applying patterning material that is not provided with the container 524 is used as the apparatus for applying the patterning material. More specifically, gaseous patterning material evaporated by the evaporation device 532 is supplied directly to a nozzle 523' of the apparatus 513' for applying patterning material that has been heated. This example is susceptible to the influence of a variation of the pressure of the patterning material supplied from the evaporation device 532 so that the amount of the patterning material ejected may be varied readily, which may be disadvantageous. On the other hand, the structure of the apparatus for applying patterning material is simple and the production cost can be reduced.

Figure 7:
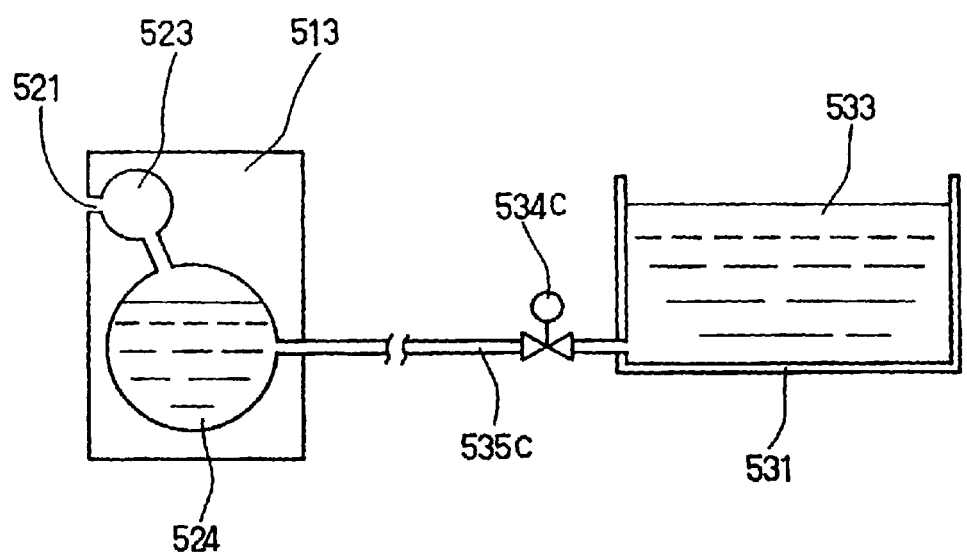
FIG. 7 is a schematic view showing an example of a structure where a liquid patterning material is supplied to the apparatus for applying pattering material.

FIG. 7 is a schematic view illustrating an example of a structure where liquid patterning material is supplied to the apparatus for applying patterning material. Liquid patterning material 533 is accumulated in a reserve tank 531, and supplied to a container 524 of the apparatus 513 for applying patterning material through a pipe duct 535c having a valve 534c. The apparatus 513 for applying patterning material is heated to the boiling point of the patterning material or more, and is evaporated in the container 524. Then, the patterning material is ejected toward the deposition surface through the nozzle 523 and the pinholes 521. In this case, the reserve tank 531 is provided outside the vacuum apparatus 515 (see FIG. 1). The patterning material can be supplied from the reserve tank 531 during the production process of a layered product, where appropriate. Alternatively, the patterning material can be supplied to the container 524 before the production process and stopped from being supplied from the reserve tank 531 during the production process. In this example, the apparatus for applying patterning material also serves as the evaporation device, so that the equipment can be simplified. On the other hand, this example is susceptible to the influence of a variation of the pressure of the patterning material vapor in the container 524 so that the amount of the patterning material ejected tends to become unstable.

Figure 8:
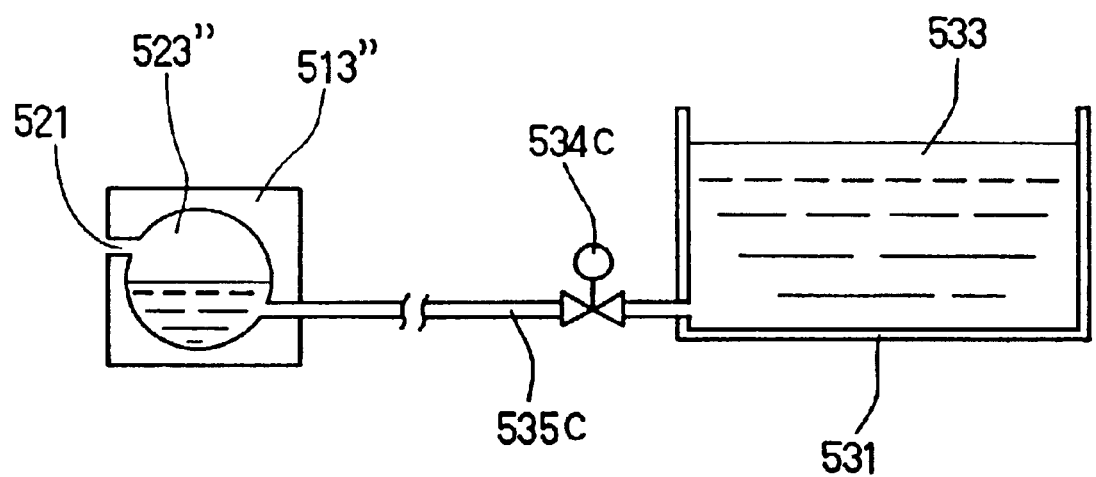
FIG. 8 is a schematic view showing another example of a structure where a liquid patterning material is supplied to the apparatus for applying pattering material.

FIG. 8 is a schematic view illustrating another example of a structure where liquid patterning material is supplied to the apparatus for applying patterning material. This example is different from the example in FIG. 7 in that an apparatus 513" for applying patterning material that is not provided with the container 524 is used as the apparatus for applying the patterning material. More specifically, liquid patterning material is supplied directly to a nozzle 523" of the apparatus 513" for applying patterning material that has been heated. This example is even more susceptible to the influence of a variation of the pressure of the patterning material vapor in the nozzle 523" than the example in FIG. 7, so that the amount of the patterning material ejected tends to become unstable. On the other hand, the structure of the apparatus for applying patterning material is simple and the production cost can be reduced.

In FIGS. 7 and 8, liquid patterning material is supplied to the apparatus for applying patterning material that has been heated. However, it is also possible to supply liquid patterning material to the apparatus for applying patterning material having room temperature, raise the temperature in the apparatus for applying patterning material to evaporate and vaporize the patterning material in the apparatus for applying patterning material, and then eject the vapor from the pinholes. However, in this case, in evaporation of the patterning material, smaller molecular weight components tend to be evaporated earlier, so that the components of the vapor may be different between the early stage and the last stage of the process. Therefore, it is necessary to perform patterning after the evaporation is stabilized.

The distance Dw between the pinholes of the apparatus for applying patterning material and the deposition surface (resin layer surface) (see FIG. 1) preferably is not larger than 500 μm, more preferably not larger than 400 μm, most preferably not larger than 300 μm. As a lower limit for this distance, at least 50 μm is preferable, at least 100 μm is even more preferable, and at least 200 μm is most preferable. Thus, as described above, when the evaporated patterning material is ejected from the pinholes, it scatters while maintaining constant directionality. Consequently, in order to form the deposition film of patterning material reliably with the intended width and with distinct borders, a small distance between the pinholes and the deposition surface is preferable. On the other hand, when the distance between the pinholes and the deposition surface is too small, it becomes difficult to control the thickness of the deposition film, the difference between the thicknesses of the deposition film at a central portion and at a peripheral portion becomes large, and the proportion of vapor that does not adhere and is scattered becomes large.

The following is an explanation of a method for depositing liquid patterning material by ejecting it from pinholes.

Figure 9:
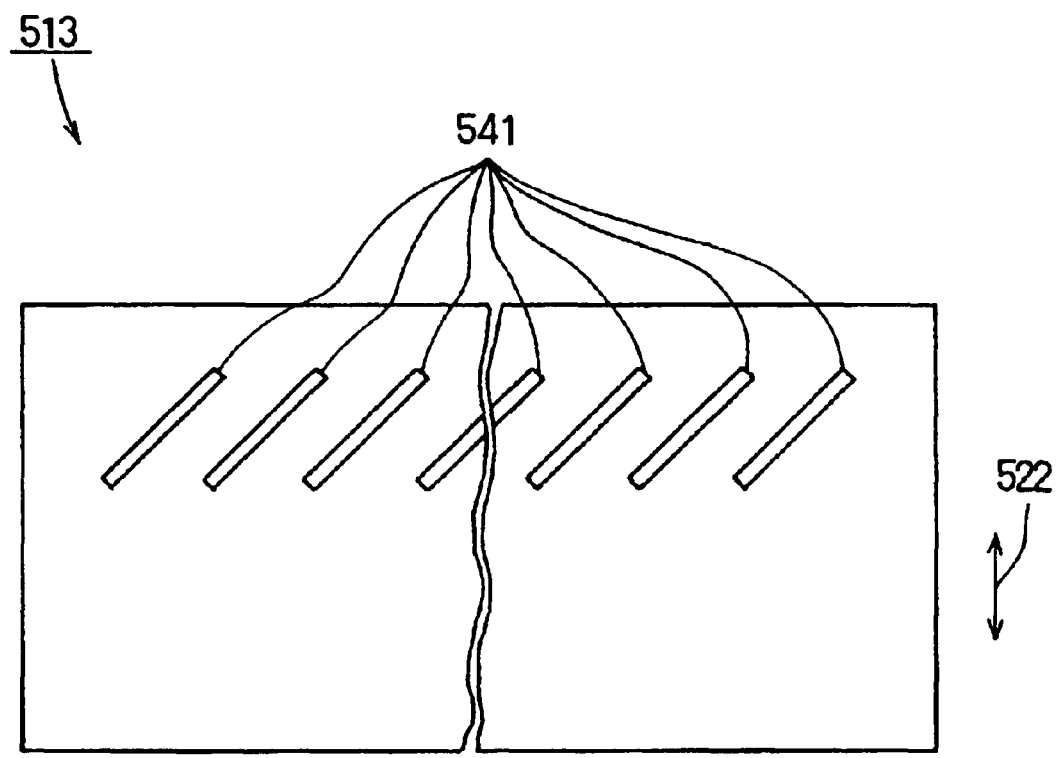
FIG. 9 is a front view showing another example of the apparatus for applying pattering material.

FIG. 9 is a front view showing an example of an apparatus for applying patterning material that can spray liquid patterning material from pinholes. The apparatus 513 for applying patterning material is arranged in a manner that the direction indicated by arrow 522 matches the travel direction of the deposition surface. On the front face of the apparatus 513 for applying patterning material, a predetermined number of nozzle heads 541 are arranged substantially at an angle of about 450 with respect to the arrow direction 522 in predetermined intervals.

Figure 10:
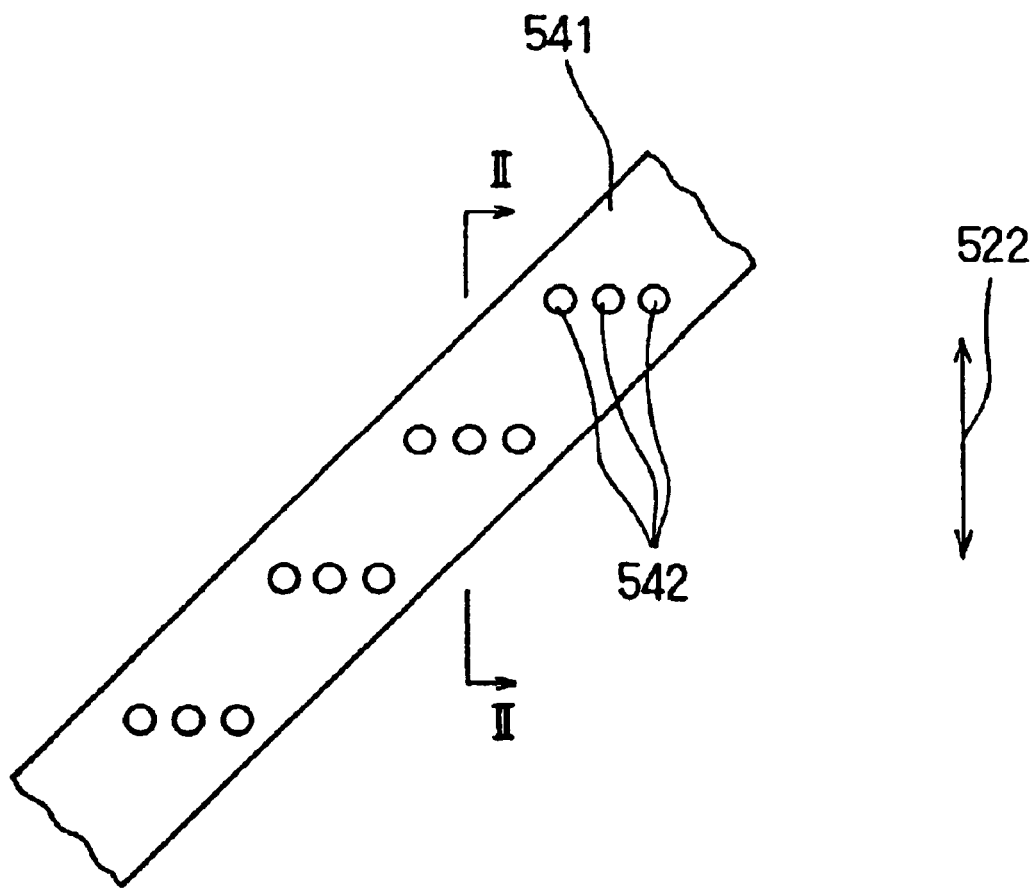
FIG. 10 is an enlarged view of a portion of a nozzle head of the apparatus for applying pattering material in FIG. 9 viewed from the front.

FIG. 10 is an enlarged view showing a portion of the nozzle head 541 in FIG. 9 taken from the front face. In FIG. 10, the arrow 522 matches the direction of the arrow 522 in FIG. 9. Pinholes 542 are arranged on the surface of the nozzle head. In the example in FIG. 10, three pinholes are arranged in predetermined intervals in the direction perpendicular to the arrow 522 to form a pinhole group, and a predetermined number of pinhole groups are arranged at predetermined intervals in the nozzle head. Projected onto a plane that is perpendicular to arrow 522, the pinholes 542 are arranged at constant intervals.

The arrangement of the pinholes is not limited to the arrangements shown in FIGS. 9 and 10.

Figure 11:
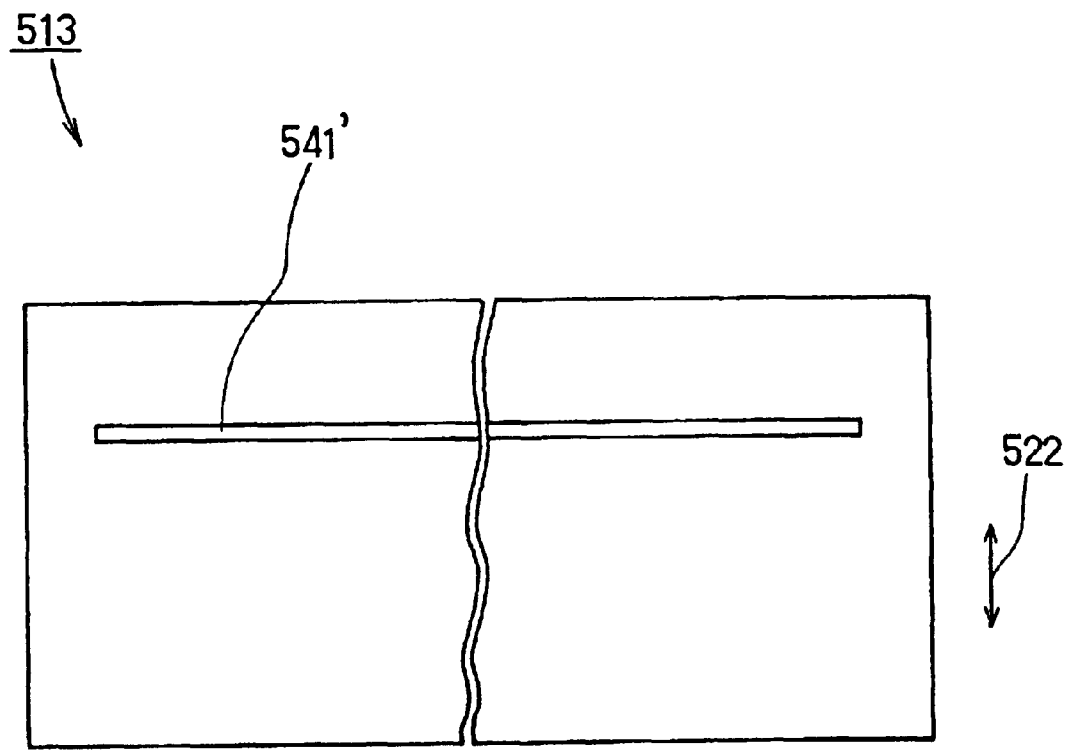
FIG. 11 is a front view showing still another example of the apparatus for applying pattering material.

FIG. 11 shows a front view of another example of an apparatus for applying patterning material that can eject liquid patterning material from pinholes. The apparatus 513 for applying patterning material is provided so that the direction indicated by arrow 522 matches the travel direction of the deposition surface. A nozzle head 541' is provided on the front face of the apparatus 513 for applying patterning material at substantially a right angle with respect to the arrow 522.

Figure 12:
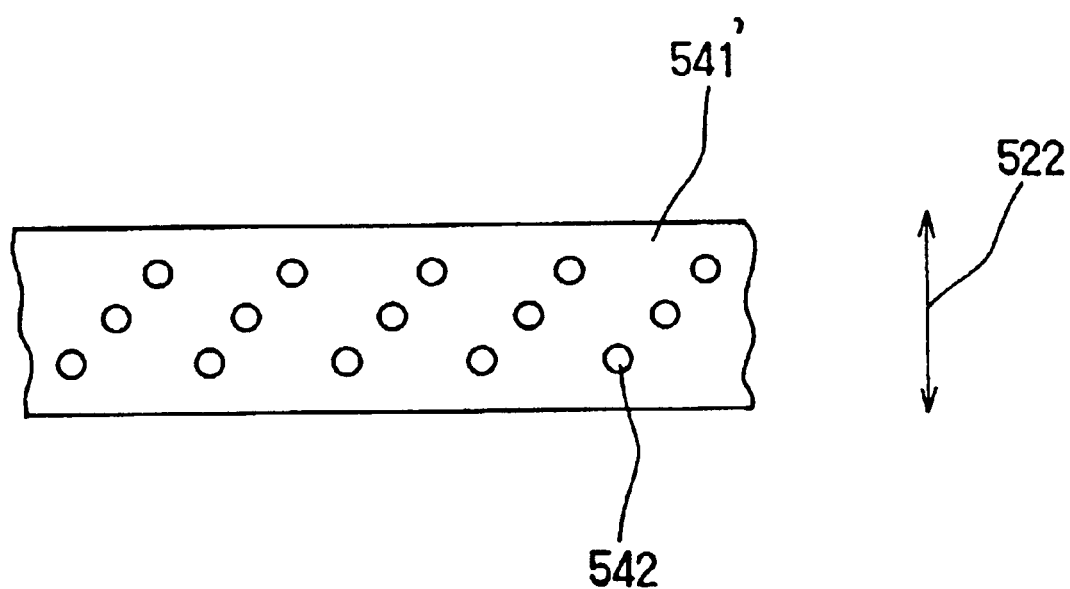
FIG. 12 is an enlarged view of a portion of a nozzle head of the apparatus for applying pattering material in FIG. 11 viewed from the front.

FIG. 12 shows an enlarged view of a portion of the nozzle head 541' in FIG. 11 taken from the front face. In FIG. 12, the arrow 522 matches the direction of the arrow 522 in FIG. 11. Pinholes 542 are arranged on the surface of the nozzle head. In the example in FIG. 12, three pinholes are arranged at predetermined intervals and at an angle of about 45° with respect to the arrow 522 to form a pinhole group, and a predetermined number of pinhole groups are arranged at predetermined intervals in the nozzle head. Projected onto a plane that is perpendicular to arrow 522, the pinholes 542 are arranged at constant intervals.

Figure 13:
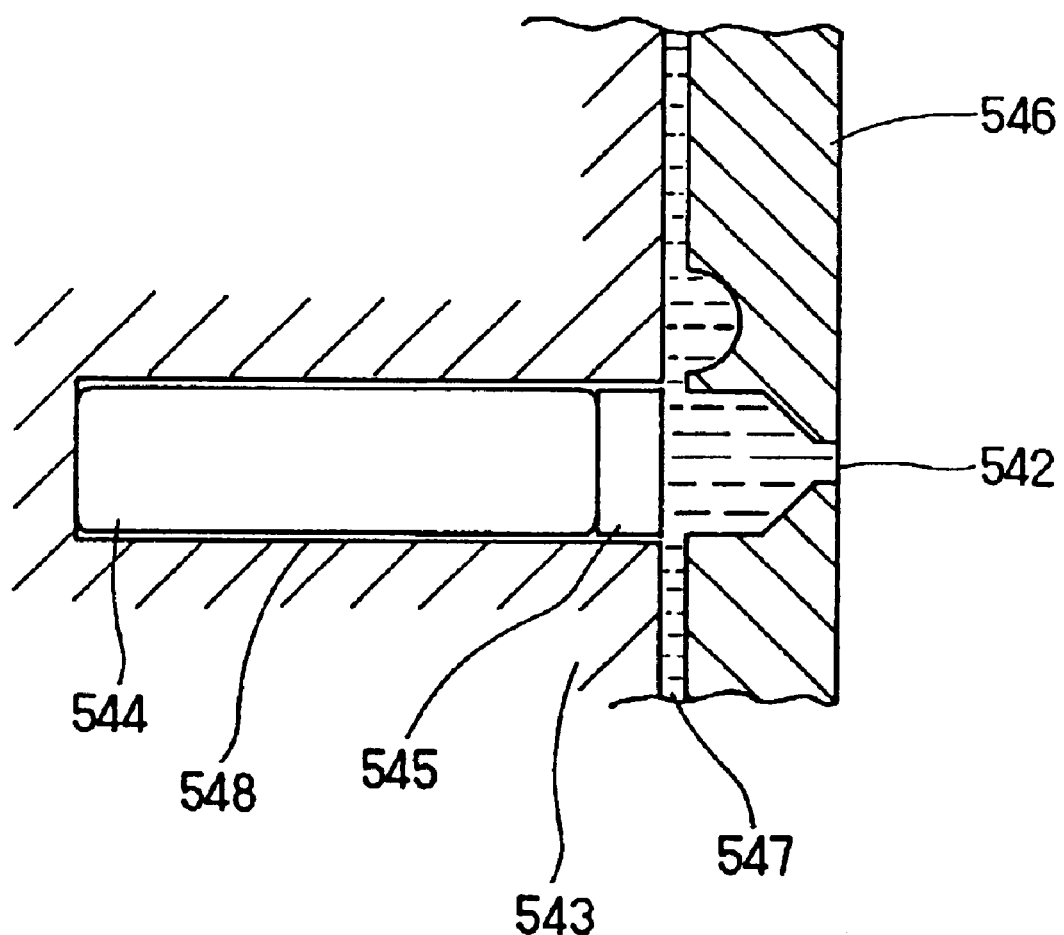
FIG. 13 is a cross-sectional view of a portion of a pinhole viewed from the arrow direction of line II—II in FIG. 10.

FIG. 13 is a cross-sectional view of a portion of a pinhole from the arrow direction of line II—II in FIG. 10. The pinhole shown in FIG. 12 has the same structure as this.

A cylinder 548 is cut into a base plate 543, at a portion that corresponds to the position of the pinhole 542. A piezoelectric element 544 and a piston head 545 are inserted into the cylinder 548 one after the other. An orifice plate 546 is provided at the front face of the base plate 543, and liquid patterning material 547 is filled between the base plate and the orifice plate. The diameter of the pinhole 542 can be designed suitably, and for example is about 70 μm.

The liquid patterning material is ejected from the pinhole 542 in the following manner. The piezoelectric effect of the piezoelectric element 544 causes the piezoelectric element 544 to contract, and the piston head 545 is retracted to the left in FIG. 13. Thus, a negative pressure develops at the front face of the piston head 545, so that the patterning material 547 is drawn into the cylinder 548 of the base plate. Thereafter, when the piezoelectric element is restored to the original position, the patterning material that has accumulated in the cylinder 548 is ejected through the pinhole 542. With this method, the patterning material can be ejected dropwise, that is, discontinuously. Consequently, the patterning material is ejected in a single ejection as one dot on the deposition surface (on the surface of the resin layer). The patterning material can be applied as a continuous liquid film by adjusting the amount of the patterning material ejected (the drop size) and the ejection intervals per ejection.

With this method, patterning material can be ejected from an array of freely selectable pinholes that are arranged perpendicularly to the travel direction of the deposition surface (that is, the surface of the resin layer). Thus, the region to which patterning material is applied can be modified easily. In addition, ejection from each pinhole easily can be started and stopped, which makes it easy to apply patterning material also in other shapes than stripes (for example, discontinuous shapes). Furthermore, compared to the method of condensing the ejected evaporated patterning material on the deposition surface as described above, the directionality of the ejected patterning material is sharper, and it is easier to apply the patterning material precisely in the desired way. What is more, since the distance between the pinholes and the deposition surface can be larger (for example, about 500 $\mu$m), the design restrictions are more relaxed, and precise control of the retraction of the apparatus for applying patterning material (described below) can be simplified.

In this method, it is preferable to charge the droplet particles of the ejected patterning material electrically, and to form an electric field in the space into which they are ejected. If the direction of the electric field is matched with the direction in which the pinholes oppose the deposition surface, the droplet particles of patterning material are accelerated toward the deposition surface. Therefore, the directionality of the ejected patterning particles becomes even sharper, and the distance between the pinholes and the deposition surface can be even larger. If the direction of the electric field points into another direction, the trajectory of the droplet particles can be bent into an arbitrary direction. Thus, the design restrictions for the device can be further relaxed. To charge the droplet particles, ionization methods such as electron beam irradiation, ion irradiation, or plasmas can be used for example.

The method for producing a layered product of the present invention includes depositing a predetermined number of resin layers and patterned metal thin film layers on a rotating supporting base. Therefore, the larger the number of depositions is, the narrower the distance between the pinholes and the deposition surface (the surface of the resin layer) becomes. Therefore, in order to maintain the interval between them in the above-described range, it is preferable to retract the apparatus 513 for applying patterning material in accordance with the progression of the deposition.

Figure 14:
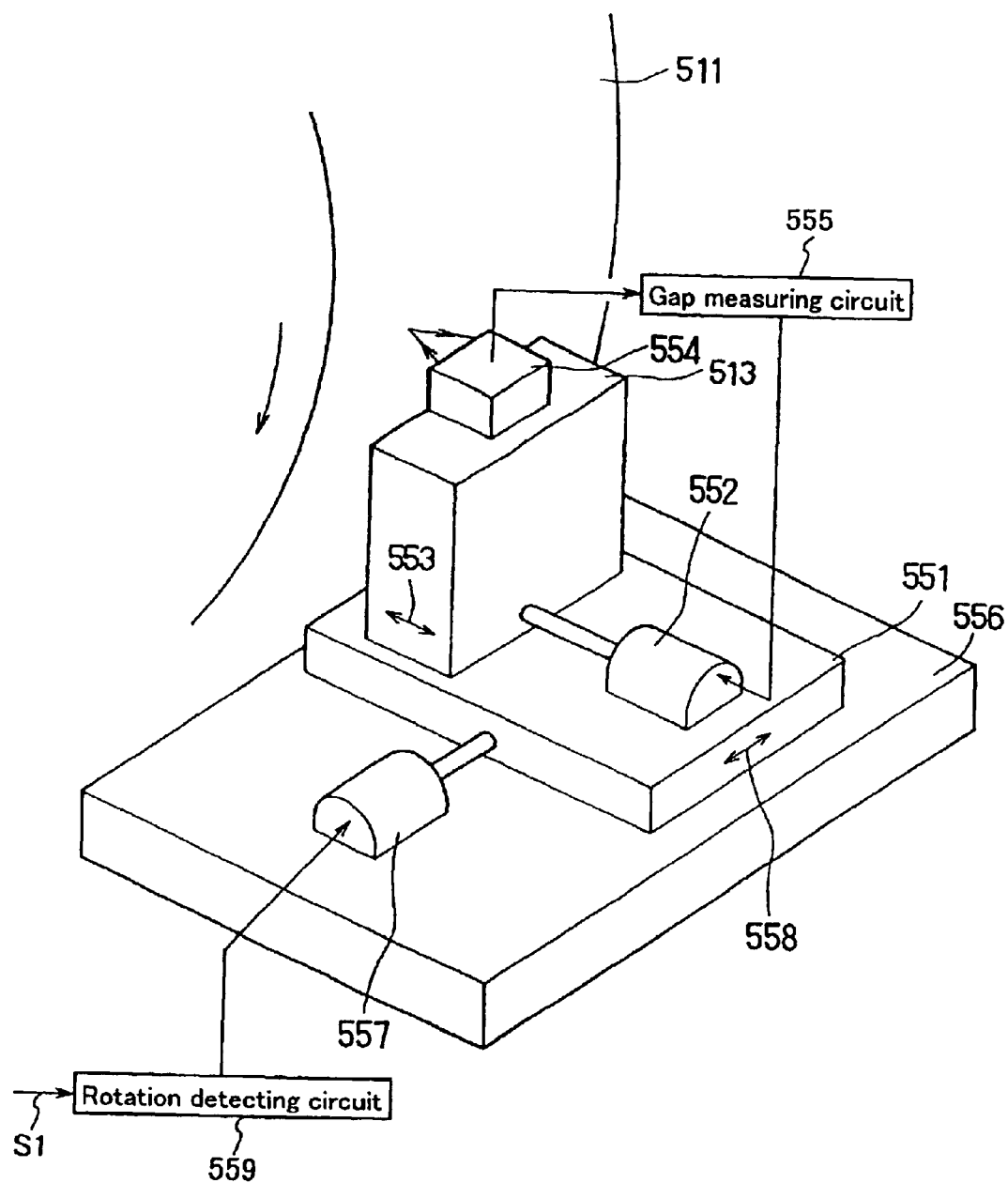
FIG. 14 is a schematic view illustrating a device for retracting the apparatus for applying pattering material and moving the application position of the patterning material.

The apparatus 513 for applying patterning material can be retracted for example by the apparatus shown in FIG. 14. More specifically, an actuator A 552 is fixed on a movable base 551. The apparatus 513 for applying patterning material is attached to the mobile terminal of the actuator A 552. The actuator A 552 can move the apparatus 513 for applying patterning material in the direction of arrow 553 on the movable base 551. A gap measuring device 554 for measuring the distance to the surface of the can roller 511 (or the circumferential surface of the layered product during the formation of the layered product) is arranged on the apparatus 513 for applying patterning material. A contactless measuring device, for example a measuring device using a laser, can be used for the gap measuring device 554. During the manufacturing of the layered product, the gap measuring device 554 keeps measuring the distance to the circumferential surface of the layered product on the surface of the can roller 511, and a signal corresponding to this measurement is sent to a gap measuring circuit 555. The gap measuring circuit 555 continuously checks whether the distance between the pinholes of the apparatus 513 for applying patterning material and the surface of the can roller 511 (or the circumferential surface of the layered product during the formation of the layered product) is within a predetermined range. When the deposition progresses and the gap measuring circuit 555 determines that this distance is smaller than the predetermined range, it instructs the actuator A 552 to retract the apparatus 513 for applying patterning material a predetermined distance, and based on this instruction, the apparatus 513 for applying patterning material is retracted a predetermined distance. Thus, the distance Dw between the pinhole end of the apparatus 513 for applying patterning material and the circumferential surface of the layered product on the can roller 511 always can be kept within a constant interval while the deposition progresses.

As an alternative to the control using the gap measuring device 554 and the gap measuring circuit 555 as explained above, the apparatus 513 for applying patterning material also can be retracted for a preset length based on the layering thickness, in accordance with the number of rotations of the can roller 511 (for example, per rotation). Moreover, fine-tuning can be performed by adding the measuring of the distance with the gap measuring device 554 as described above for verification to this configuration.

In the manufacturing method of the present invention, for each predetermined number of rotations of the rotating supporting base, the application position of the patterning material may be shifted a predetermined distance in a direction perpendicular to the travel direction of the deposition surface of the supporting base and within a plane that is parallel to the deposition surface. Thus, a layered product can be obtained in which resin layers and metal thin film layers are successively layered, and in which the position of the non-deposition portion of the metal thin film layer varies for each layer. Thus, if the layered product is used as an electronic component for example, upper and lower metal thin film layers sandwiching a resin layer can be provided easily as electrodes with different potential.

Changes in the position where patterning material is applied can be carried out with the device shown in FIG. 14. More specifically, an actuator B 557 is attached to a support base 556. The movable base 551 is attached to the mobile terminal of the actuator B 557. The actuator B 557 can move the movable base 551 on the support base 556 in the direction indicated by arrow 558. The rotation of the can roller 511 is observed by a rotation detector (not shown in the drawing), which sends a rotation signal S1 to a rotation detecting circuit 559 whenever the can roller 511 has rotated one turn. When the rotation detecting circuit 559 has counted a predetermined number of detections (for example one detection), it instructs the actuator B 557 to move the movable base 551 for a predetermined distance in a predetermined direction as indicated by arrow 558. Thereby, the movable base 551, and thus the apparatus 513 for applying patterning material, is moved a predetermined distance in a predetermined direction as indicated by arrow 558. Thus, the position where patterning material is applied can be changed each predetermined number of rotations of the can roller 511 for a predetermined distance in a direction that is perpendicular to the travel direction of the surface of the can roller 511.

A second method for producing a layered product of the present invention comprises repeating a process unit on a rotating supporting base a predetermined number of times, the process unit including applying a resin material so as to deposit a resin layer, applying a patterning material on the resin layer, and depositing a metal thin film layer, thereby producing a layered product comprising resin layers and metal thin film layers, as described above. The method is characterized in that residual patterning material is removed after the step of depositing the metal thin film layer and before the step of depositing the resin layer.

Most of the patterning material that has been deposited with the apparatus for applying patterning material is removed by being again evaporated when the metal thin film layer is formed. However, a portion remains even after the formation of the metal thin film layer, and can contribute to a number of problems, such as chapping of the deposited surface, pinholes (lack of deposition) in the resin layer or the metal thin film layer, or instabilities in the regions where the metal thin film layer is deposited. The patterning material should be applied in a necessity minimum amount so that it is not present after the formation of the metal thin film layer. However, if the amount is insufficient even slightly, the non-deposition portion of the metal thin film layer cannot be formed as intended. Thus, control thereof is very difficult. Therefore, it is necessary to remove the residual patterning material after the metal thin film layer has been deposited and before the resin layer is deposited.

The removal of the patterning material is performed by an apparatus 517 for removing patterning material, which is installed between the apparatus 514 for forming a metal thin film layer and the apparatus 512 for forming a resin layer.

There is no particular limitation regarding how the patterning material is removed, and an appropriate method can be selected in accordance with the patterning material type. The patterning material can be removed by heat and/or decomposition, for example. Examples of how the patterning material can be removed by heat include irradiation of light or use of an electric heater. Devices for irradiation of light can be simple and remove the patterning material efficiently. Here, "light" includes far infrared and infrared rays. Examples of how the patterning material can be removed by decomposition, on the other hand, include plasma irradiation, ion irradiation, and electric beam irradiation. For the plasma irradiation, for example oxide plasmas, argon plasmas, or nitrogen plasmas can be used, and among these, oxide plasmas are especially preferable.

A third method for producing a layered product of the present invention comprises repeating a process unit on a rotating supporting base a predetermined number of times, the process unit including applying a resin material so as to deposit a resin layer, applying a patterning material on the resin layer, and depositing a metal thin film layer, thereby producing a layered product comprising resin layers and metal thin film layers. The method is characterized in that at least one oil selected from the group consisting of ester oils, glycol oils, fluorocarbon oils, and hydrocarbon oils are used as the patterning material.

The patterning material is required to withstand the thermal load during the formation of the metal thin film, and ensure that no metal thin film is formed at the region where patterning material has been applied, as in the case of oil used for conventional oil margins. However, in addition to that, in the present invention, the material is required to be applied contactless in its gaseous or liquid state on a resin layer surface. Furthermore, it is required that the material does not clog the pinholes of the apparatus for applying a patterning material. Moreover, it is required to be compatible with the resin layer formed with the inventive method, and have an appropriate degree of wettability. It is required to be removable by heat or decomposition in a vacuum. Since such special conditions are added, it is preferable that the patterning material used in the present invention is an oil that is especially adapted to these conditions. When other materials than the above patterning materials are used, the surface of the layered product may be chapped, pinholes may appear in the resin layers or the metal thin film layers, or other problems such as unsteady deposition of the metal thin film layer may occur.

It is more preferable that the patterning material is an ester oil, a glycol oil, or a fluorocarbon oil. Among these, a fluorocarbon oil is most preferable.

It is preferable that the vapor pressure of the patterning material reaches 0.1 torr at a temperature in the range from 80 to 250° C. With a patterning material that does not satisfy this condition, the above-mentioned problems may occur.

Moreover, it is preferable that the average molecular weight of the oil is 200–3000, more preferably 300–3000, most preferably 350–2000. If the average molecular weight is larger than these ranges, the pinholes tend to clog. If on the other hand the average molecular weight is smaller than these ranges, the margins may not be sufficiently formed.

Embodiment 2

Figure 15:
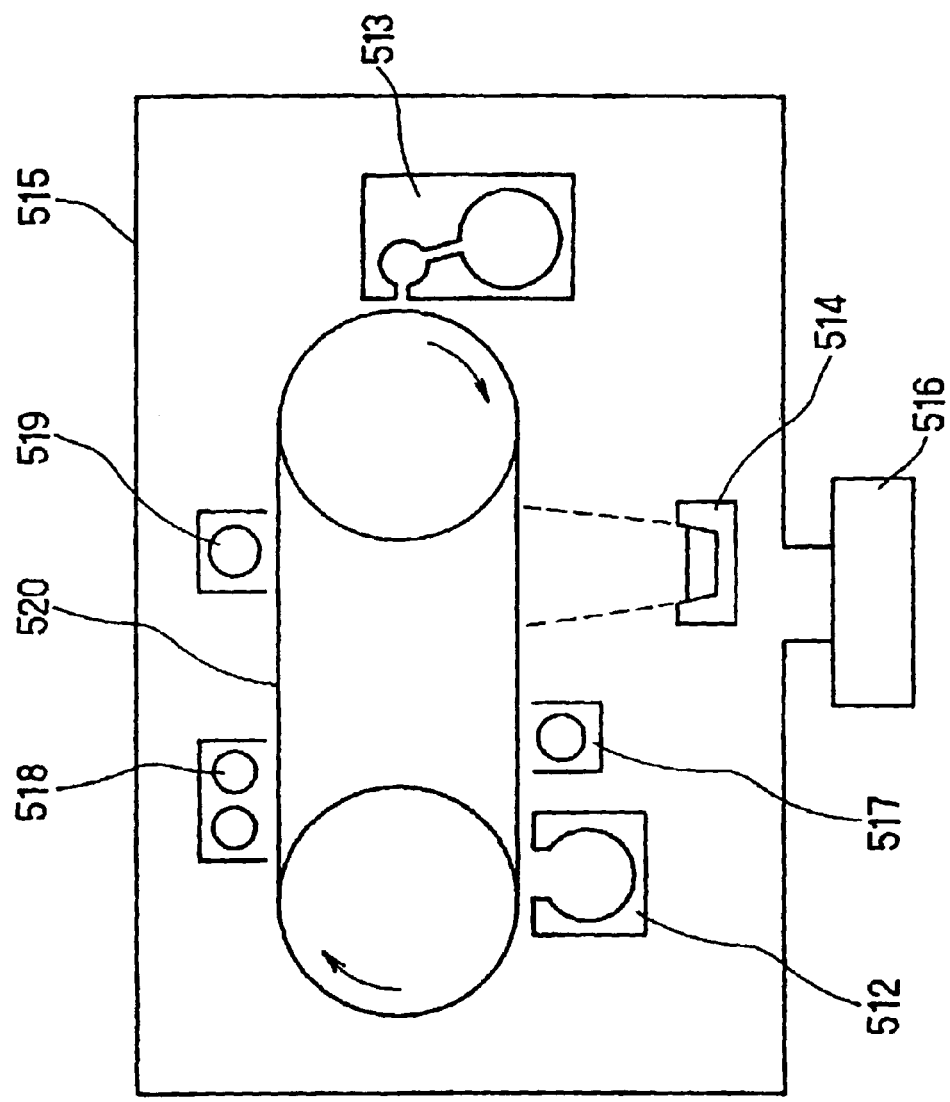
FIG. 15 is a schematic view showing another example of an apparatus with which a method of the present first invention is performed.

FIG. 15 is a schematic view showing another example of an apparatus with which the producing method of the present invention is performed.

The producing apparatus in FIG. 15 is different from that in FIG. 1 in that a belt-shaped supporting base 520 that rotates around two rolls is used instead of the cylindrical drum of the apparatus in FIG. 1 as the rotating supporting base. The belt-shaped supporting base 520 can be formed of a metal, a resin, a fabric or a combination of these.

Except for that, the apparatuses and the devices as described in Embodiment 1 can be used without any modifications.

A disk can be used as the rotating supporting base, in addition to the cylindrical drum in FIG. 1 and the belt in FIG. 15. In this case, the patterning material is applied concentrically.

The method for producing a layered product of the present invention comprises repeating a process unit on a rotating supporting base a predetermined number of times, the process unit including applying a resin material so as to deposit a resin layer, applying a patterning material on the resin layer, and depositing a metal thin film layer, thereby producing a layered product comprising resin layers and metal thin film layers. However, before, after or in the middle of the production process, there may be a process of depositing only the metal thin film layers or only the resin layers continuously without depositing either the resin layer or the metal thin film layer. Moreover, before, after or in the middle of the production process of the layered product, there may be a process of depositing another layer different from the resin layer or the metal thin film layer of the present invention.

EXAMPLE 1

A layered product for a capacitor was produced with the apparatus shown in FIG. 1.

A vacuum container 515 was evacuated to $2 \times 10^{-4}$ Torr, and the circumferential surface of the can roller 511 was maintained at 5° C.

First, a protective layer (a layer consisting only of the resin layer) portion was deposited on the circumferential surface of the can roller 511. Dicyclopentadiene dimethanoldiacrylate was used as the material of the protective layer, and evaporated so as to be deposited on the circumferential surface of the can roller 511 with the apparatus 512 for forming a resin layer. Then, a UV curing device was used as the apparatus 518 for curing resin to polymerize and cure the protective layer material deposited in the above-described manner. This operation was repeated by rotating the can roller 511 so that the protective layer having a thickness of 15 μm was formed on the circumferential surface of the can roller 511.

Then, a reinforcement layer portion was deposited. The same material as that for the protective layer was used as the resin layer material, and evaporated so as to be deposited on the protective layer with the apparatus 512 for forming a resin layer. Then, a UV curing device was used as the apparatus 518 for curing resin to polymerize and cure the resin layer material deposited in the above-described manner to a curing degree of 70%. The thickness of the thus formed resin layer was 0.6 μm. Thereafter, the surface was treated with oxygen plasma with the apparatus 519 for treating the resin surface. Next, a pattering material was applied with the apparatus 513 for applying pattering material. A fluorocarbon oil was used as the pattering material. The temperature at which the vapor pressure of this patterning material reaches 0.1 torr is 100° C. The average molecular weight of the oil is 1500. The patterning material was supplied in the manner shown in FIG. 5. The patterning material was evaporated previously with the evaporation device 532, and then supplied to the apparatus for applying patterning material that was maintained at 170° C. The apparatus shown in FIGS. 2 and 3 was used as the apparatus for applying patterning material to eject gaseous patterning material from circular pinholes having a diameter of 50 μm and a depth of 300 μm so as to be deposited in the form of a belt having a width of 150 μm. Then, aluminum was deposited with the apparatus 514 for forming a metal thin film. The deposition thickness was 300 Å, and the film resistance was 3Ω/□. Thereafter, the residual patterning material was removed by heating with a far infrared radiation heater and a plasma discharge treatment using the apparatus 517 for removing patterning material. The above-described operations were repeated 500 times by rotating the can roller 511 so as to form the reinforcement layer having a total thickness of 315 μm. The movement of the apparatus for applying patterning material in the direction perpendicular to the travel direction of the circumferential surface of the can roller 511 (the direction indicated by arrow 558 in FIG. 14) was performed with the device shown in FIG. 14 in the following pattern. When the can roller 511 had rotated one turn, the apparatus was shifted 60 μm in a first direction; after the next rotation, the apparatus was shifted 60 μm in the same first direction; after the next rotation, it was shifted 60 μm in a second direction opposite to the first direction; and after the next rotation, it was shifted 60 μm in the second direction. These shifts constituted one cycle, which was repeated thereafter. The distance Dw between the pinholes of the apparatus for applying patterning material and the deposition surface was controlled to be maintained constantly at 250 to 300 μm.

Next, a capacitance generation portion for a capacitor (an element layer portion) was deposited. The same material as that for the protective layer and the resin layer of the reinforcement layer was used as the resin layer (dielectric layer) material, and evaporated so as to be deposited on the reinforcement layer. Then, a UV curing device was used as the apparatus 518 for curing resin to polymerize and cure the dielectric layer material deposited in the above-described manner to a curing degree of 70%. The thickness of the thus formed resin layer was 0.4 μm. Thereafter, the surface was treated with oxygen plasma with the apparatus 519 for treating resin surface. Next, a pattering material was applied with the apparatus 513 for applying pattering material. A fluorocarbon oil was used as the pattering material. The temperature at which the vapor pressure of this patterning material reaches 0.1 torr is 130° C. The average molecular weight of the oil is 1800. The patterning material was supplied in the manner shown in FIG. 5. The patterning material was evaporated previously with the evaporation device 532, and then supplied to the apparatus for applying patterning material that was maintained at 170° C. The apparatus shown in FIGS. 2 and 3 was used as the apparatus for applying patterning material to eject gaseous patterning material from a circular nozzle having a diameter of 50 μm and a depth of 300 μm so as to be deposited in the form of a belt having a width of 150 μm. Then, aluminum was deposited with the apparatus 514 for forming a metal thin film. The deposition thickness was 300 Å, and the film resistance was 3Ω/□. Thereafter, the residual patterning material was removed by heating with a far infrared radiation heater and a plasma discharge treatment using the apparatus 517 for removing patterning material. The above-described operations were repeated about 2000 times by rotating the can roller 511 so as to form an element layer portion layer having a total thickness of 860 μm. The movement of the apparatus for applying patterning material in the direction perpendicular to the travel direction of the circumferential surface of the can roller 511 (the direction indicated by arrow 558 in FIG. 14) was performed with the device shown in FIG. 14 in the following pattern. When the can roller 511 had rotated one turn, the apparatus was shifted 1000 μm in a first direction; after the next rotation, the apparatus was shifted 940 μm in a second direction opposite to the first direction; after the next rotation, it was shifted 1000 μm in the first direction; after the next rotation, it was shifted 940 μm in the second direction; after the next rotation, it was shifted 1000 μm in the first direction; after the next rotation, it was shifted 1060 μm in the second direction; after the next rotation, it was shifted 1000 μm in the first direction; and after the next rotation, it was shifted 1060 μm in the second direction. These shifts constituted one cycle, which was repeated thereafter. The distance Dw between the pinholes of the apparatus for applying patterning material and the deposition surface was controlled to be maintained constantly at 250 to 300 μm.

Next, a reinforcement layer portion having a thickness of 315 μm was formed on a surface of the element layer portion. It was formed exactly in the same manner as the reinforcement layer as described above.

Finally, a protective layer portion having a thickness of 15 μm was formed on a surface of the reinforcement layer. It was formed exactly in the same manner as the protective layer as described above.

Figure 16:
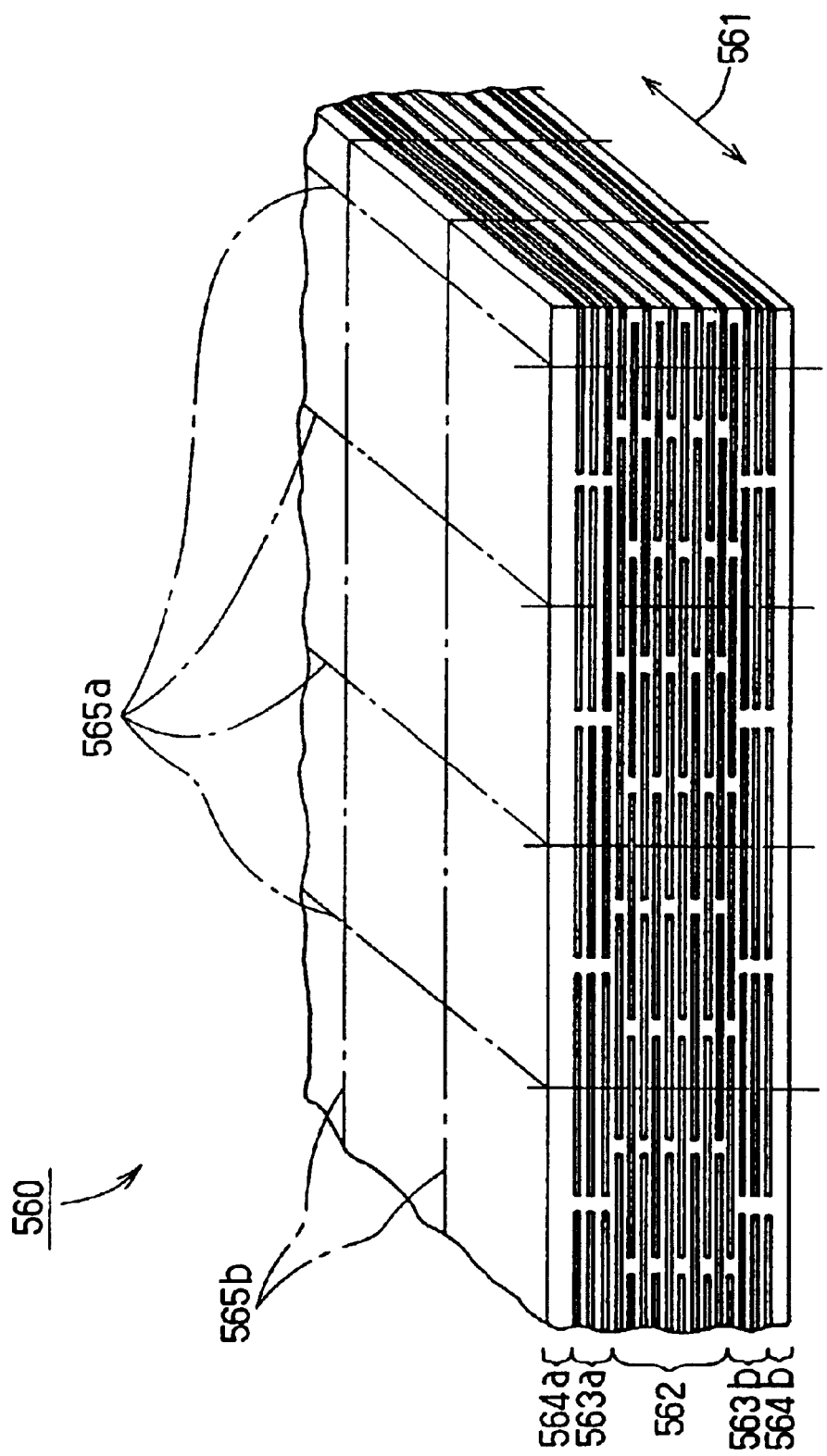
FIG. 16 is a partial perspective view showing an example of a schematic structure of a flat layered base element.

Then, the obtained cylindrical layered product was cut into 8 sections in the radial direction (separated by 45°) and removed. The sections were pressed under heat, and flat layered base elements 560 as shown in FIG. 16 were obtained. The arrow 561 in FIG. 16 indicates the travel direction of the circumferential surface of the can roller 511. The flat layered base elements were cut along the cutting planes 565a, and the cutting planes were metallized with brass by spraying so as to form external electrodes. An electrically conducting paste where an alloy comprising copper, Ni, silver or the like had been dispersed in a thermosetting phenol resin was applied to the metallized surface, heat-cured, and the resulting resin surface was plated with molten solder. After that, the pieces were cut along the cutting planes 565b in FIG. 16, and immersed in a silane coupling agent to coat the circumferential surface, whereby chip capacitors 570 as shown in FIG. 17 were obtained.

Figure 17:
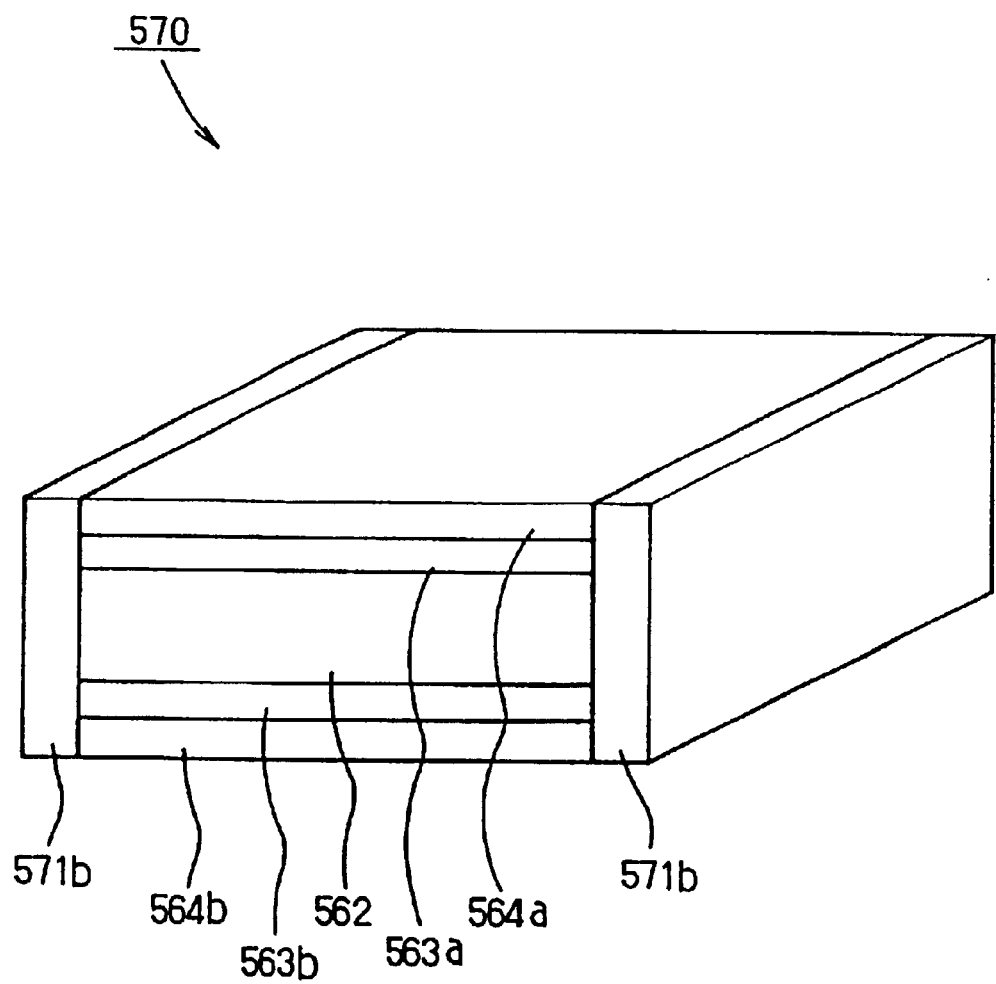
FIG. 17 is a perspective view showing a schematic structure of a chip capacitor.

In FIGS. 16 and 17, numeral 562 denotes an element layer, numerals 563a and 563b denote reinforcement layers, and numerals 564a and 564b denote protective layers. Numerals 571a and 571b denote external electrodes, which are electrically connected to the metal thin film layers exposed to the cutting planes of the element layer and the reinforcement layer.

The obtained chip capacitor had a thickness in the deposition direction of 1.5 mm, a depth of about 1.6 mm and a width (in the direction between the opposite external electrodes) of about 3.2 mm, which was small, and yet the capacitance was 0.47 $\mu$F. The withstand voltage was 50V. Furthermore, short-circuit between the metal thin film layers or ruptures of the metal thin film layer substantially were not observed. When the obtained chip capacitor was dismantled, and the surface roughnesses Ra of the surface of the dielectric layer and the surface of the metal thin film layer in the element layer portion were measured, the results were 0.005 $\mu$m and 0.005 $\mu$m, respectively. The surfaces were smooth and there were no large protrusions. The curing degrees of the resin layer (dielectric layer) of the element layer, the resin layer of the reinforcement layer and the protective layer were 95%, 95% and 90%, respectively. The width of the non-deposition portion of the metal thin film layer in the element layer portion 562 was 150 $\mu$m, and the width of the non-deposition portion of the metal thin film layer of the reinforcement layers 563a and 563b was 150 $\mu$m. Thus, the originally designed margin width was formed in a constant width.

Regarding the Second Invention

Hereinafter, the second present invention will be described with reference to the accompanying drawings.

Embodiment 3

Figure 18:
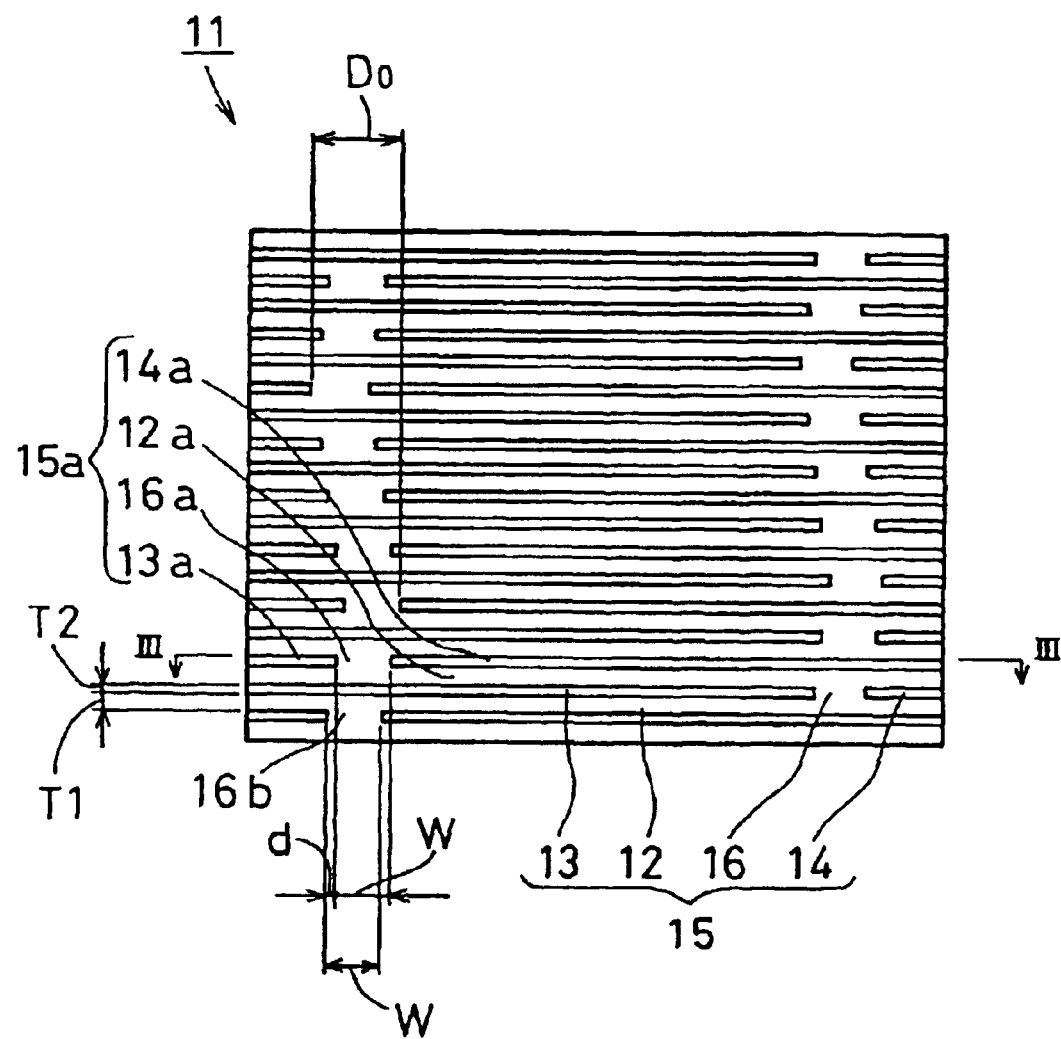
FIG. 18 is a cross-sectional view taken in the thickness direction (deposition direction) of an example of a layered product of the second invention.

FIG. 18 is a cross-sectional view of an example of the layered product of the present invention in the thickness direction (deposition direction).

A layered product 11 of the present invention includes a plurality of deposition units 15, each of which includes a dielectric layer 12, a first metal thin film layer 13 and a second metal thin film layer 14 deposited on the dielectric layer 12. The first metal thin film layer 13 and the second metal thin film layer 14 are separated by a belt-shaped electrically insulating portion 16.

Furthermore, electrically insulating portions of adjacent deposition units are required to be deposited in different positions. More specifically, as shown in FIG. 18, in the case where the deposition unit 15 is deposited adjacent to a deposition unit 15a, the electrically insulating portion 16 of the deposition unit 15 is required to be deposited in a different position from that of the electrically insulating portion 16a of the deposition unit 15a. Thus, the deposition units having the electrically insulating portions deposited in different positions are deposited sequentially. In this case, a capacitor can be formed by forming external electrodes on the side portions of the layered product (see FIG. 28). In other words, an external electrode (not shown) for connecting the first metal thin film layer 13 of the deposition unit 15 and the first metal thin film layer 13a of the deposition unit 15a adjacent thereto in substantially the same electric potential is provided, an external electrode (not shown) for connecting the second metal thin film layer 14 of the deposition unit 15 and the second metal thin film layer 14a of the deposition unit 15a in substantially the same electric potential is provided, and an electrical potential difference is provided between the external electrodes. In this case, when the electrically insulating portions 16 and 16a of the deposition unit 15 and the deposition unit 15a adjacent thereto are provided in different positions, a capacitor having electrodes and a dielectric (a portion where capacitance is generated) as follows is formed: The first metal thin film layer 13 of the deposition unit 15 and the second metal thin film layer 14a of the deposition unit 15a serve as the electrodes. A portion of the dielectric layer 12a that is sandwiched by the first metal thin film layer 13 and the second metal thin film layer 14a serves as the dielectric. Therefore, the phrase "the electrically insulating portions of the adjacent deposition units are deposited in different positions" means that the deposition positions are different to the extent that the capacitance generation portion of a capacitor can be formed, as described above. In such a situation, it is preferable to provide the electrically insulating portions so that the area of the capacitance generation portion becomes as large as possible.

Portions other than the portion of the dielectric layer 12a that is sandwiched by the first metal thin film layer 13 and the second metal thin film layer 14a make no contribution to the formation of the capacitance of the capacitor. At the same time, the second metal thin film layer 14 of the deposition unit 15 and the first metal thin film layer 13a of the deposition unit 15a do not function as the electrodes of the capacitor. However, the second metal thin film layer 14 of the deposition unit 15 and the first metal thin film layer 13a of the deposition unit 15a are significant in that they improve the adhesion strength of the external electrodes. In other words, the adhesion strength with the external electrodes depends significantly on the connection strength with the metal thin film layers, and the connection strength with the dielectric layers does not significantly contribute to it. Therefore, even if the metal thin film layers do not contribute to the capacitance generation for the capacitor, the presence of these layers can improve the adhesion strength of the external electrodes when the capacitor is formed. The presence of such metal thin film layers is very significant especially in the case of a compact layered product as the present invention. The external electrodes are formed by metal spraying or the like, and sprayed metal particles have a relatively large size. When the dielectric layer is extremely small as in the present invention, the sprayed metal particles hardly penetrate between the metal thin film layers. Moreover, since the layered product is small, an exposed metal thin film layer portion is small. Therefore, it is significantly important to make a contact area with the external electrodes as large as possible in order to ensure the adhesion strength of the external electrodes.

Figure 19:
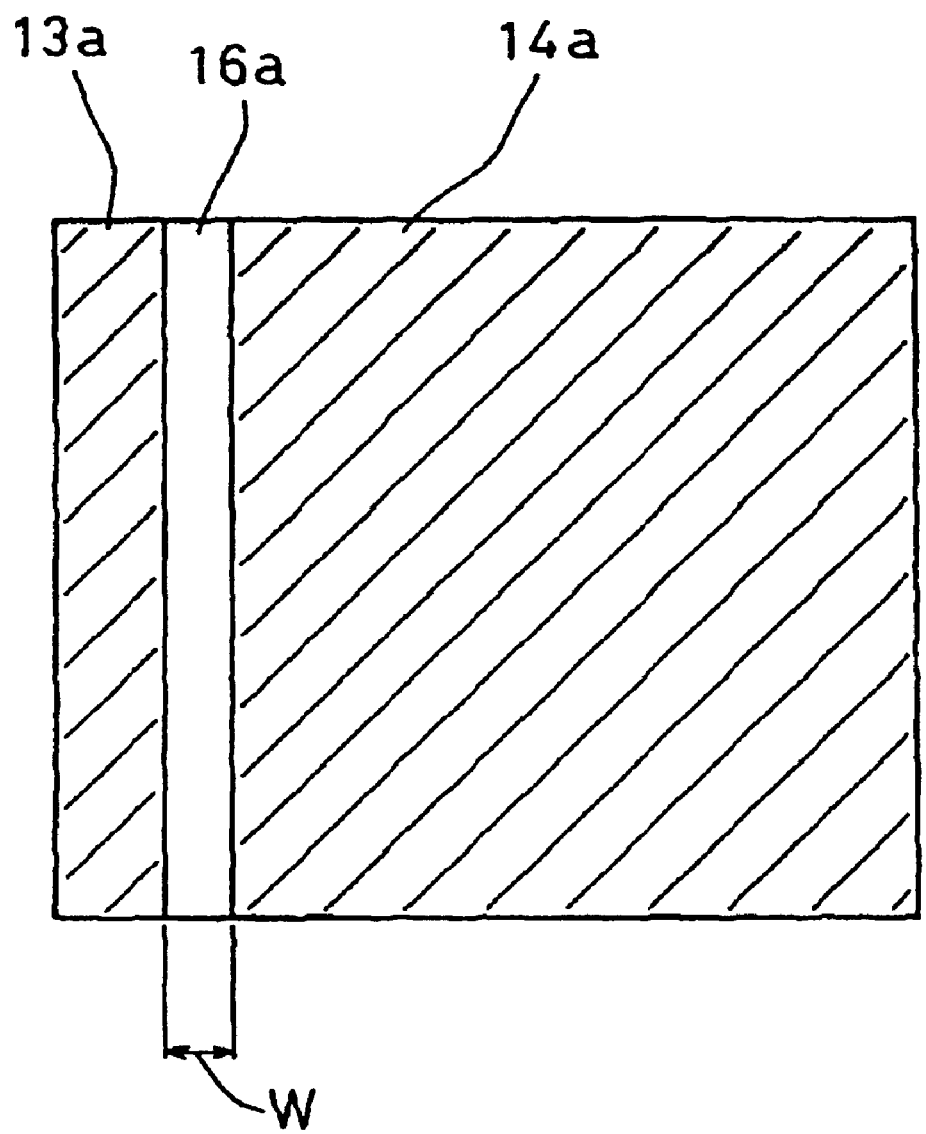
FIG. 19 is a cross-sectional view taken in the arrow direction of line III—III in FIG. 18.

The electrically insulating portion has a belt-shape having a constant width W for ease of the production. FIG. 19 shows a cross-sectional view taken in the arrow direction of line III—III in FIG. 18. The width W of the electrically insulating portion is not limited to a particular value, but preferably is about 0.03–0.5 mm, more preferably about 0.05–0.4 mm, and most preferably about 0.1–0.3 mm to ensure the capacitance generation portion (high capacitance) of the capacitor, to ensure the electrical insulation, to facilitate the production or the like.

In the layered product of the present invention, it is required that the electrically insulating portion has a belt shape, and that all the deposition positions of every other electrically insulating portion are not the same position over the layered product. More specifically, as shown in FIG. 18, with respect to the electrically insulating portion 16a of the deposition unit 15a, the position of an electrically insulating portion 16b of a deposition unit, which is one unit apart from the deposition unit 15a, is not the same position as that of the electrically insulating portion 16a, but is displaced by a distance d in the width direction of the electrically insulating portion. Alternatively, the electrically insulating portion of the deposition unit one unit apart is in the same position, and the electrically insulating portion of the deposition unit three units apart can be displaced in the width direction of the electrically insulating portion.

Figure 20:
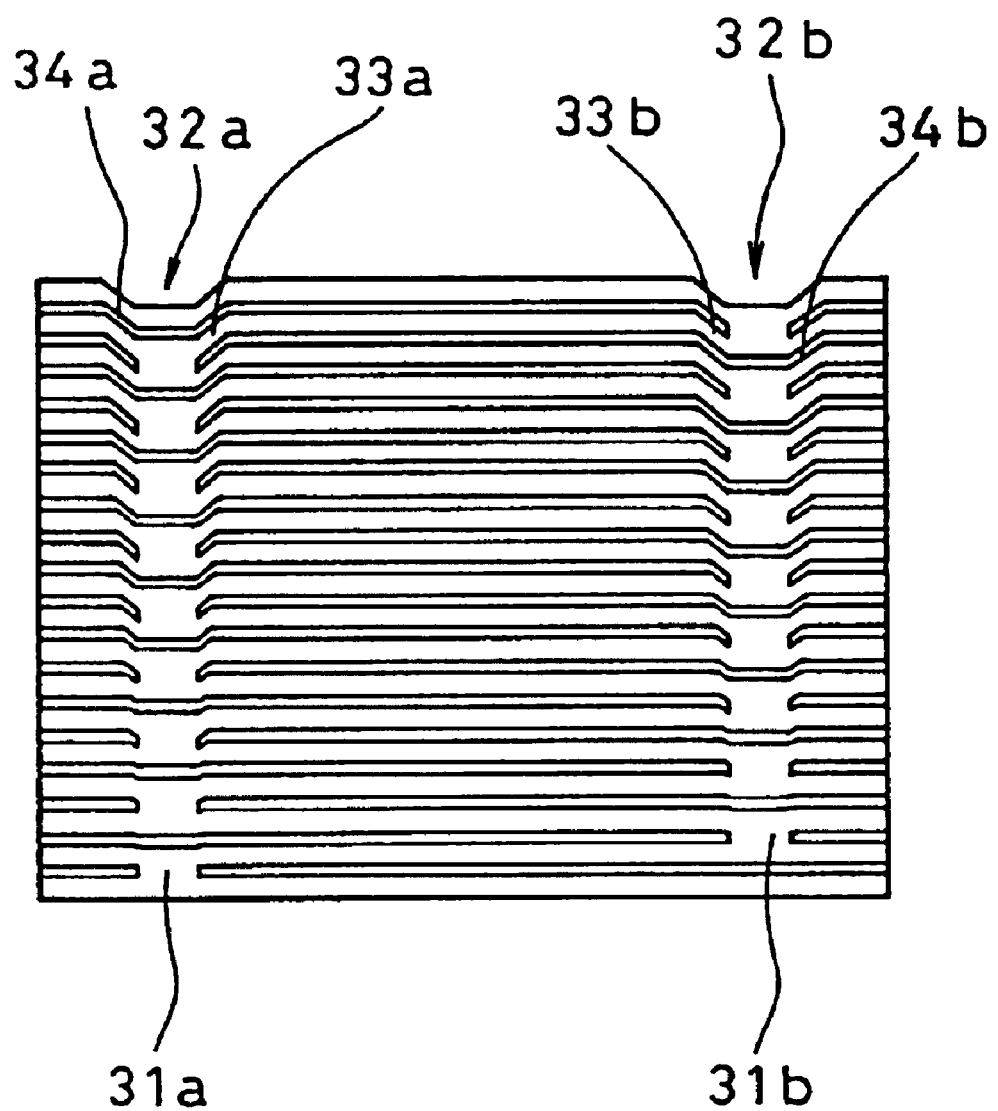
FIG. 20 is a cross-sectional view taken in the thickness direction (deposition direction) of an example of a layered product other than the present invention.

For comparison, FIG. 20 shows an example of a cross-sectional view of the layered product having d=0 constantly in the thickness direction (deposition direction). As evident from FIG. 20, since the metal thin film layer is not provided in the electrically insulating portions 31a and 31b, the thickness of the deposition of this portion is smaller relative to the overall layered product so that significant recesses 32a and 32b are generated on the upper surface of the layered product. These recesses may deteriorate the handling properties when mounting the layered product onto a printed circuit board with a solder. In addition, when such a recess is generated, the larger the depth of the recess is, the more difficult it is to apply a patterning material onto the bottom of the recess as described later in the production process of the layered product. Therefore, it is difficult to form a good electrically insulating portion having a constant width. Moreover, the generation of the recess causes inclination of the dielectric layer and the metal thin film layer deposited on the recess at both sides of the electrically insulating portion, so that the thickness of the deposition in portions 33a and 33b of the dielectric layer and portions 34a and 34b of the metal thin film layer becomes small locally. When the thickness of the deposition of the dielectric layer becomes small locally, the following problem arises. In the case where the layered product is used as a capacitor, the presence of that portion reduces the withstand voltage of the capacitor and causes a short-circuit due to pin-holes in the dielectric layer. Moreover, when the thickness of the deposition of the metal thin film layer becomes small locally, the withstand current property is likely to deteriorate in that portion.

Therefore, the lower limit of the displacement amount d of the electrically insulating portion in FIG. 18 is preferably W/20 or more, and more preferably W/10 or more, where W is the width of the belt-shaped electrically insulating portion.

On the other hand, when the displacement amount d is too large, not only is the effect of eliminating the recess on the upper surface of the layered product insignificant, but also the size of the capacitor generation portion for the capacitor is small. Therefore, the upper limit of the displacement amount d is preferably 4W or less, and more preferably 2W or less.

Either in the case where the displacement amount d is in the range of W/20 to 4W, or in the case where the displacement amount d is outside the above range, with respect to the maximum (the maximum displacement width, $D_0$ in FIG. 18) of variations of the deposition positions of the electrically insulating portions of every other deposition unit, the lower limit is preferably 6W/5 or more, and more preferably 3W/2 or more, and the upper limit is preferably 5W or less, and more preferably 4W or less. When the maximum displacement width $D_0$ is lower than this lower limit, as described with reference to FIG. 20, recesses 32a and 32b are generated on the upper surface of the layered product, so that the application of a patterning material becomes difficult. Moreover, the drop of withstand voltage of the capacitor and generation of pinholes in portions 33a and 33b of the dielectric layer, and the deterioration of the withstand current property in the portions 34a and 34b in the metal thin film layer are likely to occur. When the maximum displacement width $D_0$ is higher than this upper limit, not only is the effect of eliminating the recess on the upper surface of the layered product insignificant, but also the size of the capacitor generation portion for the capacitor is small.

The deposition positions of the electrically insulating portions of every other deposition unit can be displaced regularly or irregularly (excluding discrepancies in production).

It is preferable that the first metal thin film layer of a deposition unit is not electrically connected directly to the first metal thin film of the adjacent deposition unit (e.g., 13 and 13a), and/or the second metal thin film layer of a deposition unit is not electrically connected directly to the second metal thin film of the adjacent deposition unit (e.g., 14 and 14a). Connecting directly (contacting) the metal thin film layers means that there is no dielectric layer between them. This causes the metal thin film layer to incline toward a connecting portion, so that the metal thin film layer becomes thin in the inclined portion, which may result in a rupture.

Figure 21:
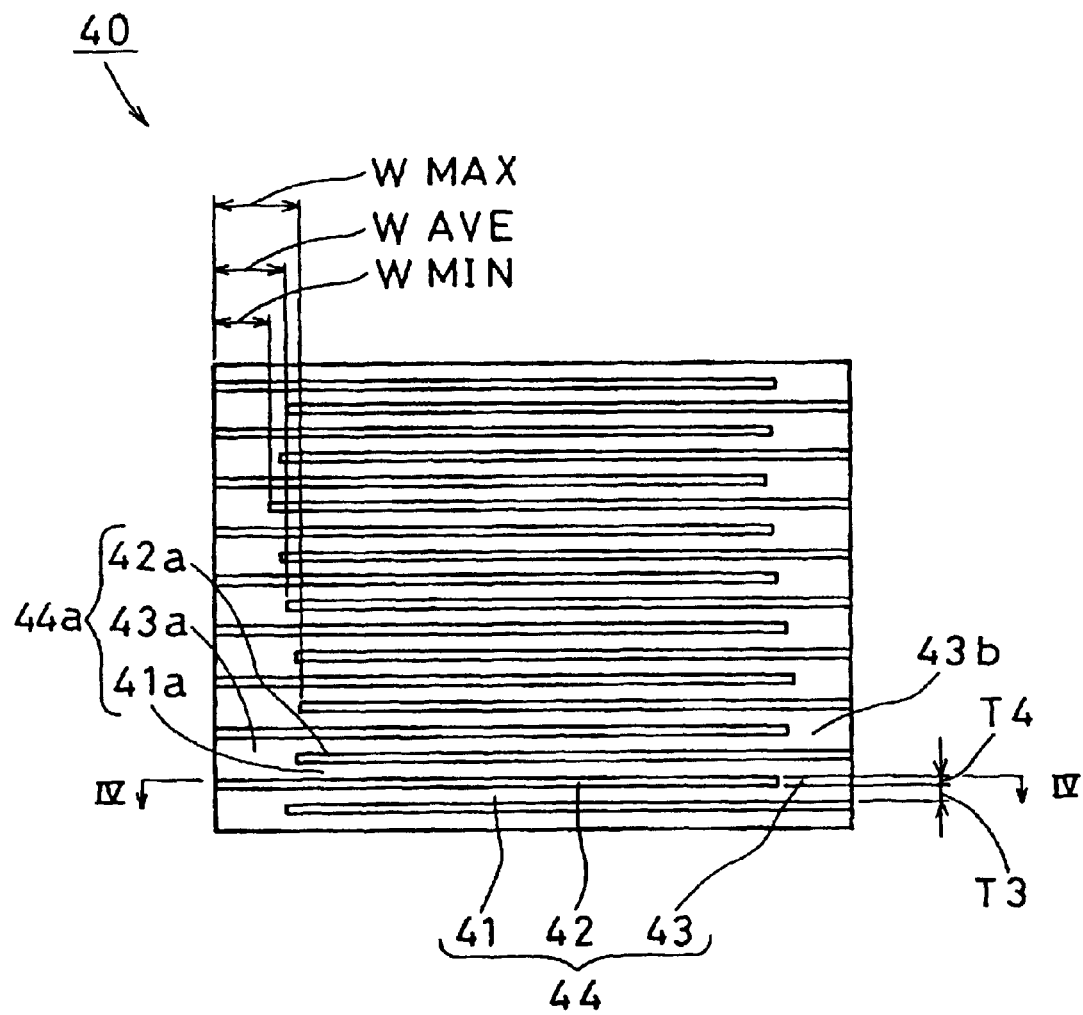
FIG. 21 is a cross-sectional view taken in the thickness direction (deposition direction) of another example of a layered product of the second invention.

FIG. 21 is a cross-sectional view of another example of the layered product of the present invention in the thickness direction (deposition direction).

A layered product 40 of this example includes a plurality of deposition units 44, each of which includes a dielectric layer 41, a metal thin film layer 42 deposited on one surface of the dielectric layer. The metal thin film layer 42 is not present in a belt-shaped electrically insulating portion 43 that is present on one end of the dielectric layer.

Furthermore, electrically insulating portions of adjacent deposition units are required to be deposited on opposite sides. More specifically, as shown in FIG. 21, in the case where a deposition unit 44a is deposited adjacent to a deposition unit 44, and when an electrically insulating portion 43 of the deposition unit 44 is on the right end of the dielectric layer 41, it is required that an electrically insulating portion 43a in the deposition unit 44a is provided on the left end of a dielectric layer 41a. In this manner, the deposition units are deposited sequentially in such a manner that the electrically insulating portions are positioned on the opposite sides. Thus, when external electrodes are formed on the side portions of the layered product (see FIG. 34), a capacitor can be formed. In other words, one external electrode is connected to the metal thin film layer 42 of the deposition unit 44, the other external electrode is connected to the metal thin film layer 42a of the adjacent deposition unit 44a, and an electrical potential difference is provided between the opposite external electrodes. The thus formed capacitor has the metal thin film layer 42 of the deposition unit 44 and the metal thin film layer 42a of the deposition unit 44a as the electrodes, and a portion sandwiched between the metal thin film layer 42 and the metal thin film layer 42a as the dielectric (capacitance generation portion). Therefore, it is preferable that the width of the electrically insulating portion is as small as possible so as to make the area of the capacitance generation portion as large as possible.

Figure 22:
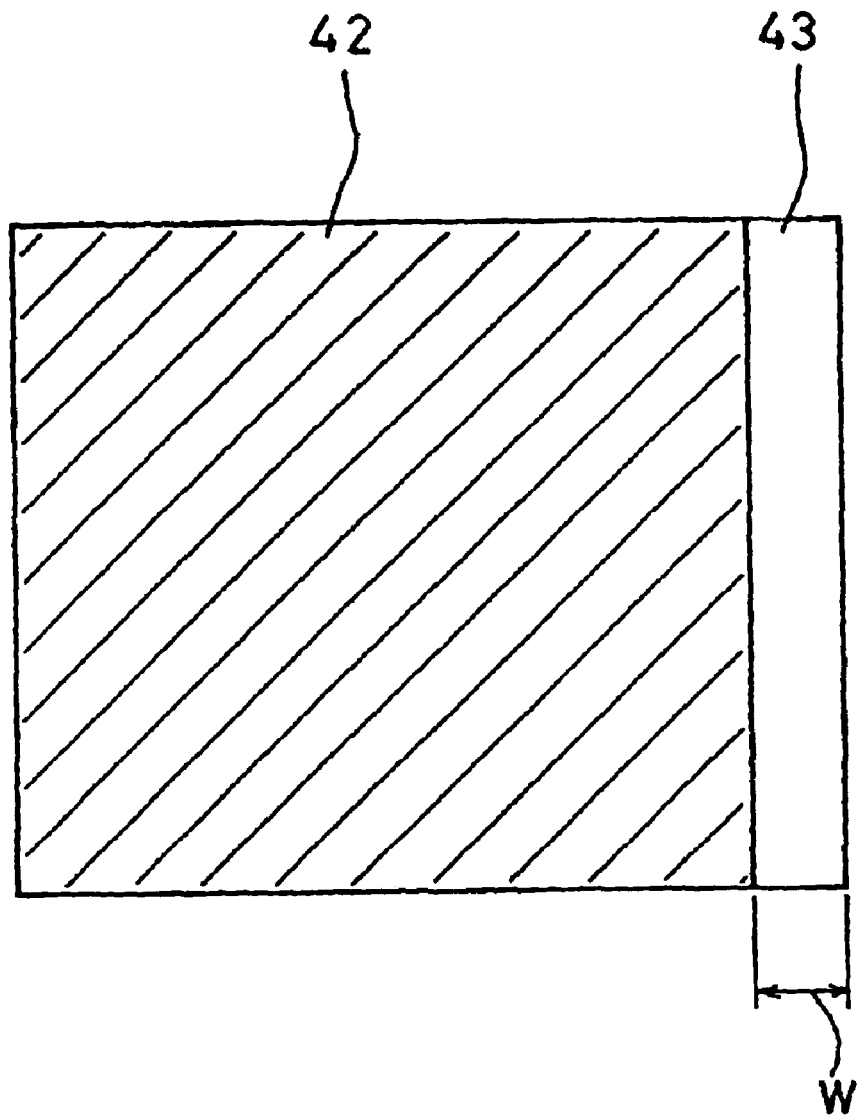
FIG. 22 is a cross-sectional view taken in the arrow direction of line IV—IV in FIG. 21.

The shape of the electrically insulating portion is a belt-shape having a constant width W to facilitate the production. FIG. 22 is a cross-sectional view taken in the arrow direction of line IV—IV in FIG. 21. The width W of the electrically insulating portion is not limited to a particular value, but preferably is about 0.03 to 0.5 mm, more preferably about 0.05 to 0.4 mm, and most preferably about 0.1 to 0.3 mm to allow high capacitance of the capacitor, to ensure the electrical insulation and to facilitate the production.

In the layered product of the present invention, it is preferable that all the widths of the belt-shaped electrically insulator of every other deposition unit are not the same over the layered product. More specifically, as shown in FIG. 21, with respect to an electrically insulating portion 43 of a deposition unit 44, the width of an electrically insulating portion 43b of the deposition unit that is one unit apart from the deposition unit 44 is different from that of the electrically insulating portion 43. Alternatively, the width of the electrically insulating portion is the same as that of the electrically insulating portion of the deposition unit that is one unit apart, and the width of the electrically insulating portion of the deposition unit three units apart can be changed.

When all the widths of the electrically insulating portions are the same, the end portion where the electrically insulating portions are provided has a small number of metal thin film layers. Therefore, the thickness of the deposition of this portion is smaller relative to the overall layered product so that a significant recess is generated on the upper surface of the layered product. This recess may deteriorate the handling properties when mounting the layered product onto a printed circuit board with a solder and may adversely affect the wettability of the solder. In addition, when such a recess is generated, the larger the depth of the recess is, the more difficult it is to apply a patterning material onto the bottom of the recess as described later in the production process of the layered product. Therefore, it is difficult to form a good electrically insulating portion having a constant width. Moreover, the generation of the recess causes inclination of the dielectric layer and the metal thin film layer deposited on the recess at a side of the electrically insulating portion, so that the thickness of the deposition of the dielectric layer and the metal thin film layer becomes small locally. When the thickness of the deposition of the dielectric layer becomes small locally, the following problem arises. In the case where the layered product is used as a capacitor, the presence of that portion reduces the withstand voltage of the capacitor and causes a short-circuit due to pin-holes in the dielectric layer. Moreover, when the thickness of the deposition of the metal thin film layer becomes small locally, the withstand current property is likely to deteriorate in that portion.

Therefore, (W MAX−W MIN)/W AVE is preferably W AVE/5 or more, and more preferably W AVE/3 or more, where W AVE is the average width of the electrically insulating portions of every other deposition unit in the overall layered product, W MAX is the maximum thereof, and W MIN is the minimum thereof, as shown in FIG. 21.

On the other hand, when the variation in the width of the electrically insulating portions is too large, and (W MAX−W MIN)/W AVE is too large, not only is the effect of eliminating the recess on the upper surface of the layered product insignificant, but also the size of the capacitor generation portion for the capacitor is small. Therefore, the upper limit of (W MAX−W MIN)/W AVE is preferably equal to or less than W AVE, and more preferably W AVE/2 or less.

The width of the electrically insulating portion of every other deposition unit can be changed regularly or irregularly (excluding discrepancies in production).

In both of the layered products in FIGS. 18 and 21, the thickness T1 (FIG. 18) or T3 (FIG. 21) of the dielectric layer (thickness of the capacitance generation portion) is preferably 1 μm or less, more preferably 0.7 μm or less, and most preferably 0.4 μm or less. A thinner dielectric layer (capacitance generation portion) can provide a capacitor having large capacitance when the layered product is used as a capacitor.

The thickness T2 of the first metal thin film layer and the second metal thin film layer of the layered product in FIG. 18 and the thickness T4 of the layered product in FIG. 21 are not limited to particular values, but preferably 100 to 500 Å, and more preferably 200 to 400 Å. The film resistance is preferably 10Ω/□ or less, and more preferably 1 to 8Ω/□, and most preferably 2 to 6Ω/□. The thicknesses of the two metal thin film layers in FIG. 18 can be different from each other, but the same thickness is preferable because a uniform thickness of the overall layered product can be obtained.

The number of depositions for the deposition units of the layered products in FIGS. 18 and 21 can be determined suitably depending on the application of the layered product, but is preferably 100 or more, because the area that the capacitor occupies on the circuit board can be small. The number larger than that is not necessarily better, and deposition can be performed in accordance with the necessary capacitance for the capacitor. The larger the number of depositions is, the larger capacitance the capacitor can have when the layered product is used as a capacitor. Furthermore, since the dielectric layer is thin, the overall thickness is not very large even if the number of depositions is large. Compared with a conventional film capacitor, the thus obtained capacitor has higher capacitance with the same volume, or is smaller with the same capacitance.

The ratio T1/T2 or T3/T4 of the thickness T1 (FIG. 18) or T3 (FIG. 21) of the dielectric layer to the thickness T2 (FIG. 18) or T4 (FIG. 21) of the metal thin film layer of each deposition unit is preferably 20 or less, more preferably 15 or less. The ratio in this range is preferable for the following reasons. When a pin-hole in a dielectric layer or the like causes opposing metal thin film layers to be electrically shorted, the self-healing function by burning or leaching of the metal thin film layer due to the overcurrent eradicates defects. Thus, the volume of the defects inside the element becomes small, so that the deterioration degree of the characteristics becomes small under the environment where humidity resistance properties or the like are required.

There is no limitation regarding the material of the dielectric layer as long as it can be deposited to a thickness of 1 μm or less and can function as a dielectric satisfactorily, but a material comprising an acrylate resin or a vinyl resin as its main component is preferable. More specifically, a polymer of a polyfunctional (meth) acrylate monomer or polyfunctional vinyl ether monomer is preferable. Of these, for example, a polymer of a dicyclopentadiene dimethanoldiacrylate or cyclohexane dimethanoldivinylether monomer or a polymer of a monomer with substituted hydrocarbon groups is preferable because of their electric properties.

As the material of the metal thin film layer, at least one selected from the group consisting of Al, Cu, Zn, Sn, Au, Ag, and Pt is preferable. Of these, Al is preferable because of its deposition property and cost-efficiency. In some cases, it is preferable to oxidize the surface of the resin layer for the purpose of improving the resistance of the metal thin film layer against humidity.

The surface roughness Ra (ten point average roughness) of the dielectric layer is preferably not more than 0.1 μm, more preferably not more than 0.02 μm. The surface roughness Ra (ten point average roughness) of the metal thin film layer is preferably not more than 0.1 μm, more preferably not more than 0.02 μm. If the surface roughness is too large, electric field concentrations occur in small protrusions on the surface, and the dielectric layer may be damaged or the metal thin film layer may be burnt. In a conventional film capacitor, external particles (for example, inorganic particles such as silica or organic particles) are mixed in a film to provide a certain level of surface roughness for good sliding properties of the film to provide a conveyance property of the film and prevent blocking between films. As long as the present invention adopts the producing method as described below, it is not necessary to mix the external particles for the above reason for the layered product of the present invention, so that a layered product having good electric characteristics can be obtained. The surface roughness Ra (ten point average roughness) of the present invention is measured with a contact-type surface meter having a diamond needle of 10 $\mu$m tip diameter and a 10 mg measuring load.

The curing degree of the dielectric layer is preferably 50% or more, in particular, 50–75% in the state of the layered product immediately after formation of the dielectric layer, and preferably 90% or more in the state of the final form such as a capacitor or the like because of its handling properties or stability of the characteristics. The curing degree means the extent of polymerization and/or cross-linking when the resin is used as the dielectric layer. If the curing degree is below these ranges, the layered product easily can be deformed by external pressure, which occurs for example in the step of pressing in the production process of the layered product or mounting the layered product. This also can lead for example to ruptures or short-circuits of the metal thin film layer. On the other hand, if the curing degree is above the above ranges, the following problems may arise. When forming external electrodes, sprayed metal particles hardly penetrate between the metal thin film layers so that the adhesion strength of the external electrodes may be reduced; or the layered product may break, for example when the cylindrical continuous layered product is removed from the can roller in the production process of the layered product as described later, or when pressed into a flat layered base element. To determine the curing degree of the present invention, the ratio of the absorbance of the C=O groups and the C=C groups (1600 cm$^{-1}$) is determined with an infrared spectrophotometer, the ratio of each monomer and the cured product is determined, and the curing degree is defined as 1 minus the reduced absorption ratio.

Embodiment 4

Next, a layered product including a reinforcement layer on at least one surface thereof will be described.

The reinforcement layer is intended to prevent the layered product portion from being damaged by thermal load or external pressure in the process of manufacturing the layered product, in the production process of an electronic component using the same, especially a capacitor, or in the process of mounting the same on a printed circuit board. Moreover, since the reinforcement layer includes a metal thin film layer, as described later, it is effective to provide the reinforcement layer in order to increase the adhesion strength of the external electrodes (see FIGS. 28 and 34). That is to say, the adhesion strength of the external electrodes mainly is affected by the strength of the connection with the metal thin film layer, whereas the strength of the connection with the dielectric layer contributes only little to the adhesion strength. Consequently, by providing a reinforcement layer comprising a metal layer, the adhesion strength of the external electrode of the capacitor can be significantly increased. In the case where the layered product is provided with external electrodes and is used as a capacitor, the reinforcement layer can function as a capacitance generation portion of the capacitor, but the capacitor design can be simplified when it does not function as such.

The effects as described above can be provided by forming the reinforcement layer only on at least one side of the layered product. However, it is more effective to form the reinforcement layer on both sides for protection of the layered product and improvement of the adhesion strength of the external electrodes.

The reinforcement layer can be deposited in contact with the layered product or can have another layer therebetween.

The thickness (overall thickness on one surface) of the reinforcement layer is preferably 20 $\mu$m or more, more preferably 50 to 500 $\mu$m, and most preferably 100 to 300 $\mu$m to provide the above-described effects of the reinforcement layer sufficiently.

Figure 23:
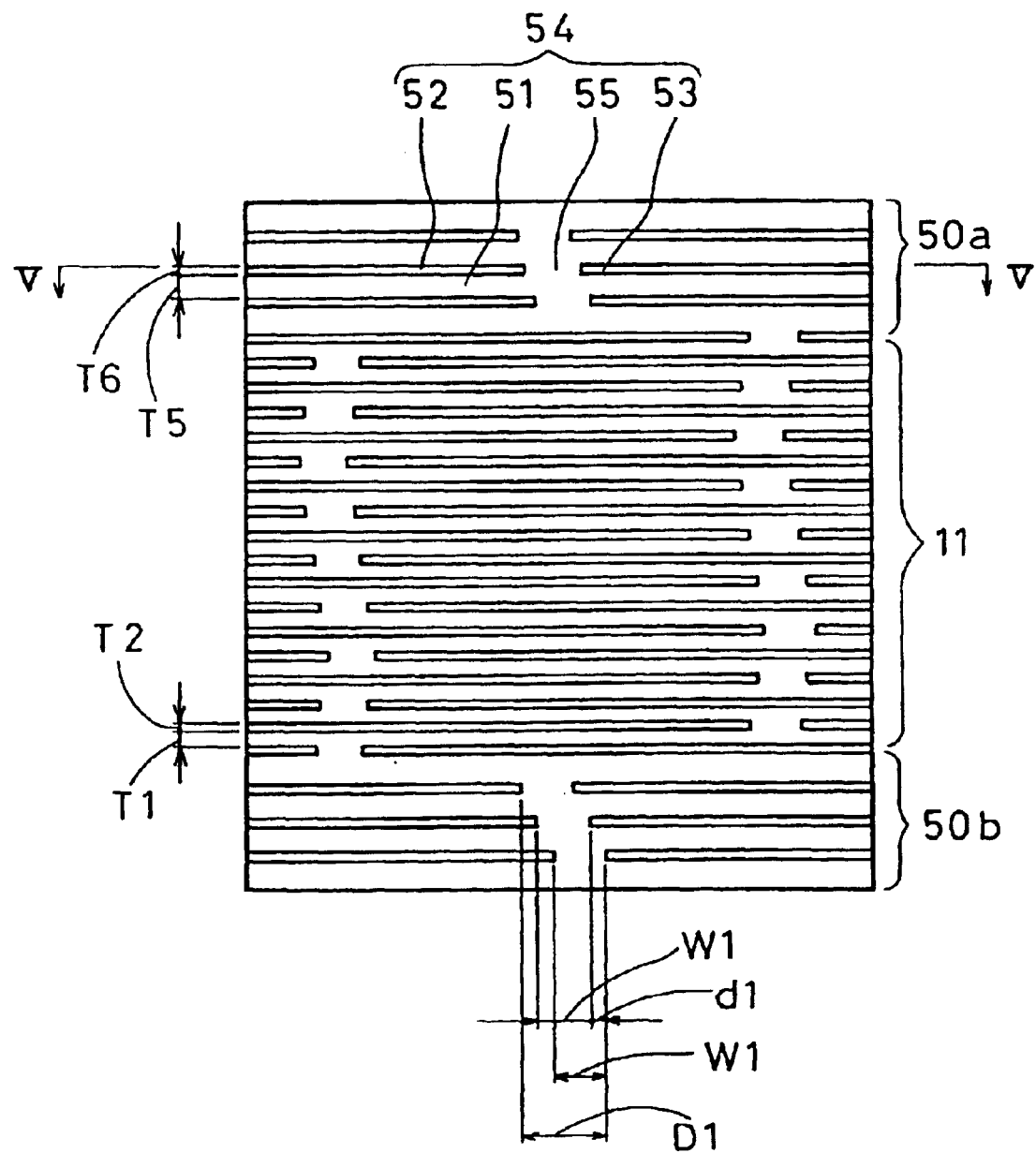
FIG. 23 is a cross-sectional view taken in the thickness direction (deposition direction) of an example of a layered product of the second invention with reinforcement layers deposited on both sides thereof.

FIG. 23 is a cross-sectional view taken in the thickness direction (deposition direction) of an example of the layered product 11 in FIG. 18 described in Embodiment 3a comprising reinforcement layers 50a and 50b deposited on both sides thereof.

The reinforcement layer shown in FIG. 23 includes at least one deposition unit 54 that includes a resin layer 51, a first metal layer 52 and a second metal layer 53 deposited on one surface of the resin layer 51. The first metal layer 52 and the second metal layer 53 are separated by an electrically insulating band 55.

The metal layer is separated into the first metal layer 52 and the second metal layer 53 by the electrically insulating band 55. If there is no electrically insulating bands, when external electrodes (see FIGS. 28 and 34) are provided, the external electrodes would be short-circuited via the metal layer.

The position in which the electrically insulating band is provided is not limited to a particular position, but it is preferable to provide it substantially in the central portion of the reinforcement layer, as shown in FIG. 23. When it is provided substantially in the same position as the electrically insulating portion of the layered product 11, a large recess may be generated on the upper surface of the layered product. Therefore, for example in mounting onto a printed circuit board with a solder, the handling properties are poor and the wettability of the solder may be adversely affected. In addition, when such a recess is generated, as the depth of the recess is larger, it is more difficult to apply a patterning material to the bottom of the recess as described later. Therefore, it is difficult to form a good electrically insulating portion or electrically insulating band having a constant width. Moreover, the generation of the recess causes inclination of the dielectric layer and the metal thin film layer deposited on the recess at both sides of the electrically insulating portion, so that the thickness of the deposition becomes small. Therefore, a reduction of the withstand voltage as a capacitor, pinholes of the dielectric layer and deterioration of the withstand current property of the metal thin film layer are likely to occur.

Figure 24:
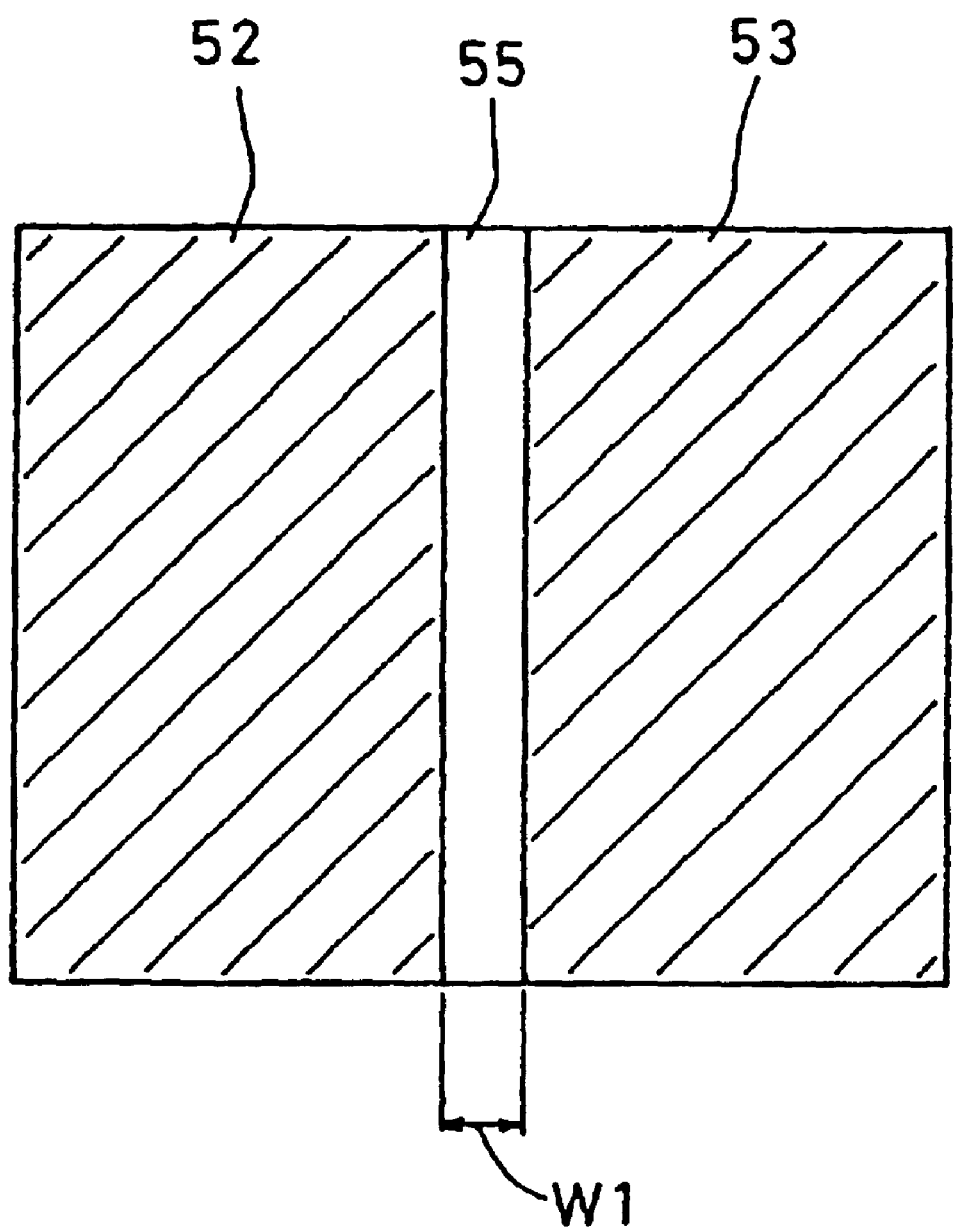
FIG. 24 is a cross-sectional view taken in the arrow direction of line V—V in FIG. 23.

The shape of the electrically insulating band is not limited to a particular shape, as long as it electrically insulates the first metal layer 52 and the second metal layer 53. In this embodiment, it is a belt shape having a constant width $W_1$ to facilitate the production. FIG. 24 is a cross-sectional view taken in the arrow direction of line V—V in FIG. 23.

It is sufficient that the reinforcement layer comprises at least one deposition unit 54. However, when two or more deposition units are deposited, it is preferable that the deposition positions of the electrically insulating bands are not the same position over the reinforcement layer (the overall reinforcement layer on one side in the case where the reinforcement layer is provided on both sides of the layered product 11). For example, it is preferable to displace the deposition positions of the electrically insulating bands of adjacent deposition units. When the electrically insulating band is a belt-shaped band having a constant width $W_1$, as shown in FIG. 23, it is preferable that the displacement amount $d_1$ of the electrically insulating bands of adjacent positions is $W_1/20$ or more. The lower limit of the displacement amount $d_1$ is preferably $W_1/15$ or more, and more preferably $W_1/10$ or more. The upper limit is preferably $4W_1$ or less, and more preferably $2W_1$ or less. Alternatively, the electrically insulating bands of adjacent deposition units can be deposited in the same position, and the position of the electrically insulating band of every other (or every second or more) deposition unit can be displaced by the displacement amount $d_1$.

When the displacement amount $d_1$ is below the lower limit, a recess may be generated in the electrically insulating portion on a surface of the layered product. Therefore, the handling properties may be poor when mounting the layered product onto a printed circuit board with a solder. In addition, when such a recess is generated, as the depth of the recess is larger, it is more difficult to apply a patterning material to the bottom of the recess as described later. Therefore, it is difficult to form a good electrically insulating band or electrically insulating portion having a constant width. Moreover, the generation of the recess causes inclination of the dielectric layer and the metal thin film layer deposited on the recess at both sides of the electrically insulating portion, so that the thickness of the deposition becomes small. Therefore, a reduction of the withstand voltage as a capacitor, pinholes of the dielectric layer and a reduction of the withstand current property of the metal thin film layer are likely to occur.

When the displacement amount $d_1$ is too large, not only is the effect of eliminating the recess on the upper surface of the layered product insignificant, but also a recess is generated on the surface of the layered product, resulting in the above-described problems, when the deposition position of the electrically insulating band matches the deposition position of the electrically insulating portion of the layered product 1.

Furthermore, with respect to the maximum (the maximum displacement width) $D_1$ (see FIG. 23) of variations of the deposition position of the electrically insulating band over the reinforcement layer (the overall reinforcement layer on one side in the case where the reinforcement layer is provided on both sides of the layered product 11), the lower limit is preferably $6W_1/5$ or more, and more preferably $3W_1/2$ or more, and the upper limit is preferably $5W_1$ or less, and more preferably $4W_1$ or less. When the maximum displacement width $D_1$ is below this lower limit, a recess is generated on the surface of the layered product, resulting in the above-described problems. When the maximum displacement width $D_1$ is above this upper limit, not only is the effect of eliminating the recess on the upper surface of the layered product insignificant, but also a recess is generated on the surface of the layered product, resulting in the above-described problems, when the deposition position of the electrically insulating band matches the deposition position of the electrically insulating portion of the layered product 1.

Figure 25:
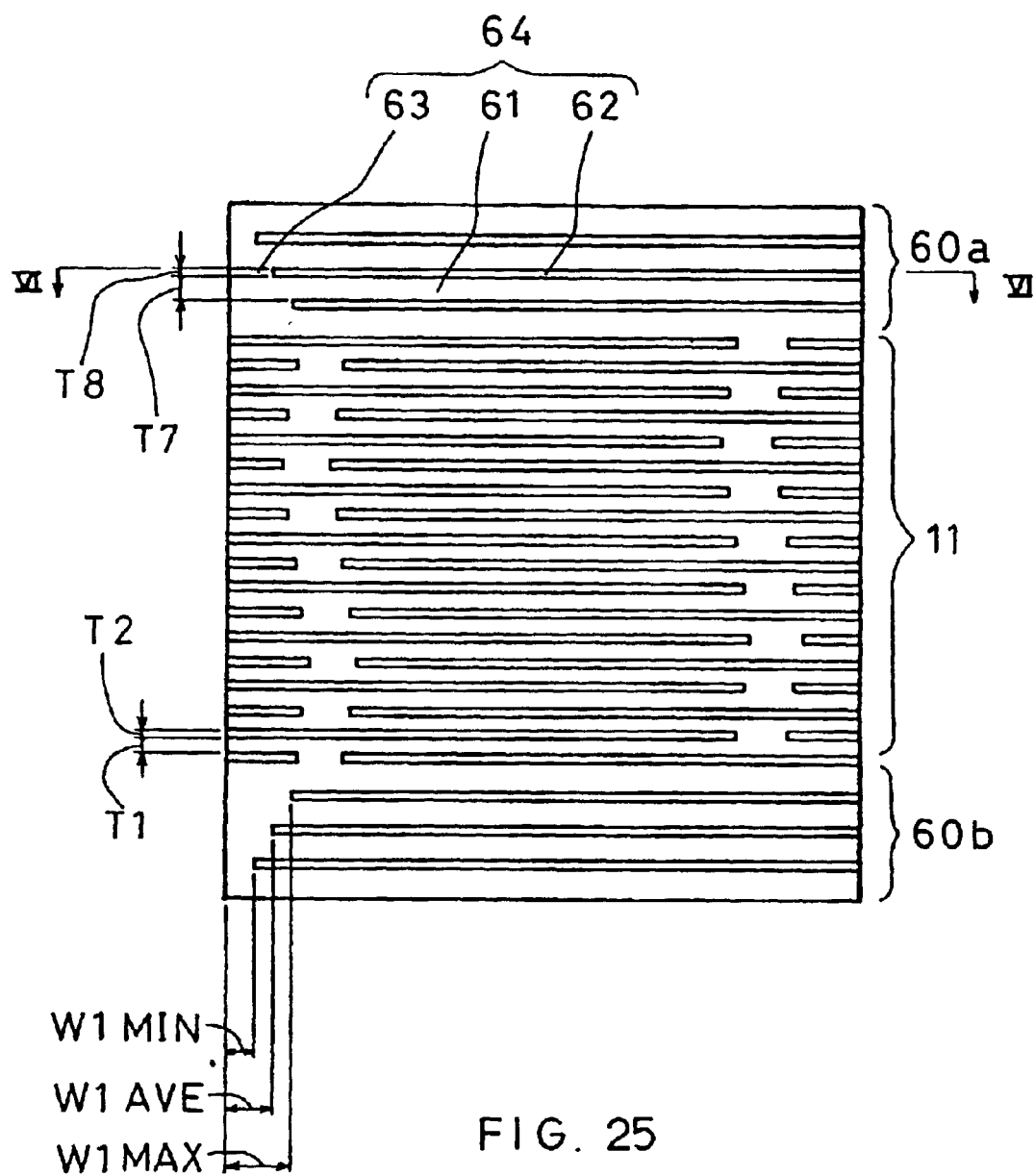
FIG. 25 is a cross-sectional view taken in the thickness direction (deposition direction) of another example of a layered product of the second invention where reinforcement layers are deposited on both sides thereof.

FIG. 25 is a cross-sectional view taken in the thickness direction (deposition direction) of an example of a layered product comprising reinforcement layers 60a and 60b having a deposition form different from that in FIG. 23 deposited on both sides of the layered product 11 in FIG. 18 described in Embodiment 3.

The reinforcement layer shown in FIG. 25 includes at least one deposition unit 64 that includes a resin layer 61 and a metal layer 62 deposited on one surface of the resin layer. There is no metal layer in a belt-shaped electrically insulating portion 63 on one end of the surface of the resin layer. If there is no electrically insulating bands, when external electrodes (see FIGS. 28 and 34) are provided, the external electrodes would be short-circuited via the metal layer.

Figure 26:
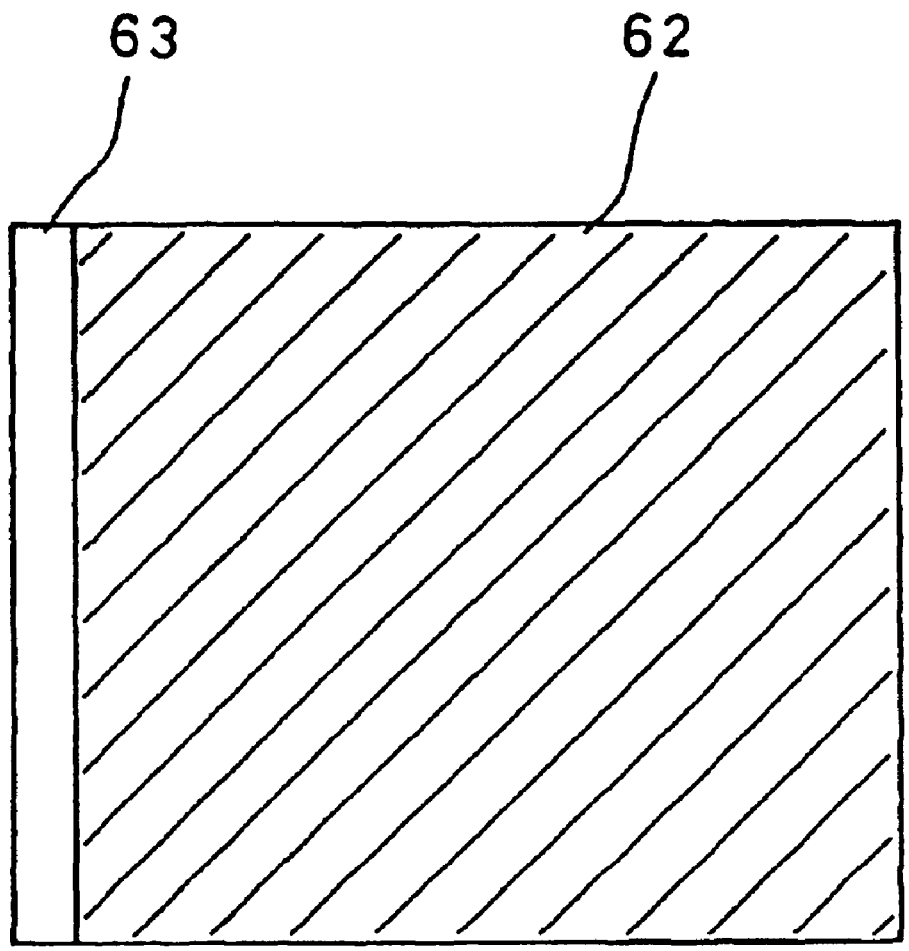
FIG. 26 is a cross-sectional view taken in the arrow direction of line VI—VI in FIG. 25.

The shape of the electrically insulating band is not limited to a particular shape, but in this embodiment, it is a belt shape having a constant width to facilitate the production or the like. FIG. 26 is a cross-sectional view taken in the arrow direction of line VI—VI in FIG. 25.

It is sufficient that the reinforcement layer comprises at least one deposition unit 64. However, when two or more deposition units are deposited, it is preferable that the widths of the electrically insulating bands are not the same over the reinforcement layer (the overall reinforcement layer on one side in the case where the reinforcement layer is provided on both sides of the layered product 11). For example, as shown in FIG. 25, it is preferable that with respect to an electrically insulating band, the width of the electrically insulating band of an adjacent deposition unit is changed and further the width of the electrically insulating band of an adjacent deposition unit is changed. Thereafter, the width of the electrically insulating band is sequentially changed in the same manner. Alternatively, the widths of the electrically insulating bands of two (or more) consecutive deposition units can be the same, and the width of the electrically insulating band of the third (or more) deposition unit can be changed.

When all the widths of the electrically insulating bands are the same, the number of deposited metal thin film layers is small in the end portion where the electrically insulating bands are formed so that the deposition thickness in this portion is small relative to the overall layered product. Thus, a significant recess may be generated on the upper surface of the layered product. This recess may deteriorate the handling properties when mounting the layered product onto a printed circuit board with a solder and may adversely affect the wettability of the solder. In addition, when such a recess is generated, as the depth of the recess is larger, it is more difficult to apply a patterning material to the bottom of the recess as described later in the production process of the layered product. Therefore, it is difficult to form a good electrically insulating band or electrically insulating portion having a constant width. Moreover, the generation of the recess causes inclination of the dielectric layer and the metal thin film layer deposited on the recess at a side of the electrically insulating portion of the layered product 11, so that the thickness of the deposition of the dielectric layer and the metal thin film layer becomes small locally. When the thickness of the deposition of the dielectric layer becomes small locally, the following problem arises. In the case where the layered product is used as a capacitor, the presence of that portion reduces the withstand voltage of the capacitor and causes a short-circuit due to pin-holes in the resin thin film layer. Moreover, when the thickness of the deposition of the metal thin film layer becomes small locally, poor conductivity is likely to occur in that portion.

Therefore, ($W_1$ MAX–$W_1$ MIN)/$W_1$ AVE is preferably $W_1$ AVE/5 or more, and more preferably $W_1$ AVE/3 or more, where $W_1$ AVE is the average width of the electrically insulating bands in the overall reinforcement layer (overall reinforcement layer on one side in the case where the reinforcement layer is provided on both sides of the layered product 11), $W_1$ MAX is the maximum thereof, and $W_1$ MIN is the minimum thereof, as shown in FIG. 25.

On the other hand, when the variation in the width of the electrically insulating portions is too large, and ($W_1$ MAX–

$W_1$ MIN)/$W_1$ AVE is too large, the effect of eliminating the recess on the upper surface of the layered product is not significant. Therefore, the upper limit of ($W_1$ MAX–$W_1$ MIN)/$W_1$ AVE is preferably $W_1$ AVE or less, and more preferably $W_1$ AVE/2 or less.

The widths of the electrically insulating bands can be changed regularly or irregularly (excluding discrepancies in production).

The thickness T5 (FIG. 23) or T7 (FIG. 25) of the resin layer of the reinforcement layer is preferably larger than the thickness T1 (FIG. 18) or T3 (FIG. 21) of the dielectric layer of the layered product in FIG. 18 or 21. Furthermore, the thickness T6 (FIG. 23) or T8 (FIG. 25) of the metal layer of the reinforcement layer is preferably larger than the thickness T2 (FIG. 18) or T4 (FIG. 21) of the metal thin film layer of the layered product in FIG. 18 or 21. Thus, the reinforcement layer has thick layers, so that when external electrodes described later are provided (see FIGS. 28 and 34), the adhesion strength of the external electrodes can be improved. The external electrodes are formed by spraying or the like, and the particles of sprayed metal are relatively rough and hardly penetrate between the metal thin film layers of the layered product 11 or 40 sufficiently. However, the thickness of the dielectric layer cannot be made large to ensure the capacitance for a capacitor. Therefore, the penetration of the sprayed metal is facilitated by making the thickness of the resin layer thick, and thus the adhesion strength of the external electrodes can be improved with ease. Furthermore, the thicker the metal layer exposed to the side is, the larger the tensile strength is. Therefore, the adhesion strength of the external electrodes can be improved by making the thickness of the metal layer thick.

More specifically, the thickness T5 or T7 of the dielectric layer is preferably 0.1 to 1 $\mu$m, and more preferably 0.1 to 0.6 $\mu$m. The thickness T6 or T8 of the metal layer is preferably 100 to 500 Å, and more preferably 200 to 400 Å. The film resistance is preferably 1 to 10$\Omega$/□ or less, and more preferably 2 to 6$\Omega$/□. The thicknesses of the first metal layer and the second metal layer in FIG. 23 can be different from each other, but the same thickness is preferable because a uniform thickness of the overall layered product can be obtained.

The materials for the resin layer and the metal layer of the reinforcement layer are not limited to particular materials. However, the materials used for the dielectric layer and the metal thin film layer are preferable for the resin layer and the metal layer, respectively, in view of production efficiency. On the other hand, in some cases, materials different from those for the dielectric layer and the metal thin film layer are preferable for the purpose of adjusting the adhesion strength with external electrodes or adjusting the curing degree or the mechanical strength of the overall layered product or the like.

The curing degree of the resin layer of the reinforcement layer is preferably 50% or more, in particular, 50–75% in the state immediately after formation of the reinforcement layer, and preferably 90% in the state of the final form such as a capacitor or the like because of its handling properties or stability of the characteristics. If the curing degree is below these ranges, the layered product easily can be deformed by external pressure, which occurs for example in the step of pressing in the production process of the layered product or mounting the layered product. On the other hand, if the curing degree is above the above ranges, the following problems may arise. When forming external electrodes, sprayed metal particles hardly penetrate between the metal layers so that the adhesion strength of the external electrodes may be reduced; or the layered product may break, for example when the cylindrical layered product is removed from the can roller in the production process of the layered product as described later, or when pressed into a flat layered base element.

In FIGS. 23 and 25, the reinforcement layer can be provided in the layered product 40 in FIG. 21, instead of the layered product 11 in FIG. 18, in the same manner as above. In this case, the above description can be applied by substituting the elements of the layered product 11 with the elements of the layered product 40 in FIG. 21, where necessary.

Embodiment 5

Next, a layered product including a protective layer on at least one surface thereof will be described.

Figure 27:
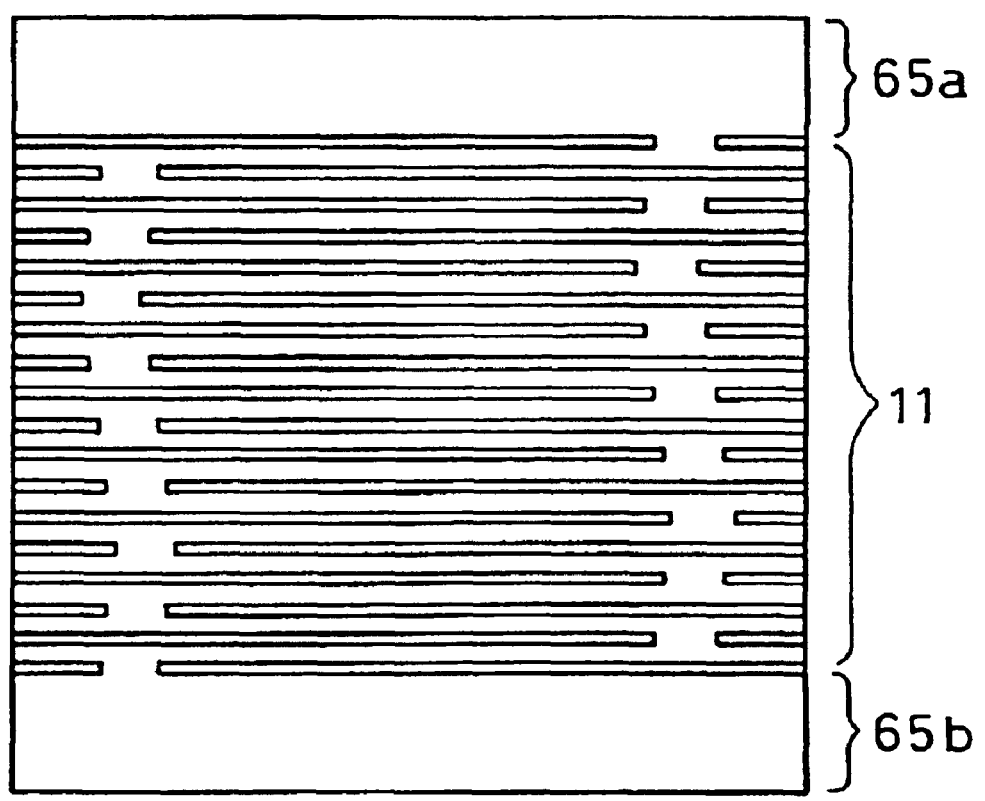
FIG. 27 is a cross-sectional view taken in the thickness direction (deposition direction) of an example of a layered product of the second invention with protective layers deposited on both sides thereof.

FIG. 27 is a cross-sectional view taken in the thickness direction (deposition direction) of an example of a layered product comprising protective layers 65a and 65b deposited on both sides of the layered product 11 in FIG. 18.

It is effective to provide the protective layer in order to prevent the portion of the layered product 11 from being damaged by thermal load or external pressure in the process of manufacturing the layered product, in the production process of en electronic component using the same, especially a capacitor, or in the process of mounting the same on a printed circuit board.

The effects as described above can be provided by forming the protective layer only on at least one side of the layered product 11. However, it is more effective to form the protective layer on both sides for protection of the layered product 11.

There is no limitation regarding the thickness of the protective layer, and the thickness can be determined suitably depending on the environment to which the layered product is exposed or the like, but is preferably 2 $\mu$m or more, more preferably 3 to 100 $\mu$m, and most preferably 5 to 20 $\mu$m to provide the above-described effects sufficiently.

In the example in FIG. 27, the protective layer is provided directly in the layered product 11. However, it is possible to deposit the protective layer via the reinforcement layer described in Embodiment 4, which is interposed between the protective layer and the layered product 11. With such an embodiment, not only can the function of protecting the layered product 11 be improved, but also the adhesion strength of the external electrodes (see FIG. 28) can be raised. A layer other than the reinforcement layer can be deposited.

There is no limitation regarding the material for the protective layer. However, the material used for the dielectric layer and/or the resin layer is preferable in view of production efficiency. On the other hand, in some cases, a material different from that for the dielectric layer and/or the resin layer can be used for the purpose of providing a specific function for the protection layer. For example, it is preferable to use an epoxy resin for higher adhesion with the reinforcement layer.

The protective layer can be colored to a specific color. This allows an improvement in accuracy of pattern recognition when mounting the layered product on a printed circuit board as an electronic component or facilitates the identification of each product. For example, coloring can be performed by mixing a colorant such as a pigment or coating the outer surface with a paint. Moreover, the protective layer can be made transparent, if necessary.

The curing degree of the protective layer is preferably 50% or more, in particular, 50–75% in the state of the layered product immediately after formation of the protective layer, and preferably 90% in the state of the final form such as a capacitor or the like, because of its handling properties or stability of the characteristics. If the curing degree is below these ranges, the layered product easily can be deformed by external pressure, which occurs for example in the step of pressing in the production process of the layered product or mounting the layered product. On the other hand, if the curing degree is above the above ranges, the layered product may break, for example when the cylindrical continuous layered product is removed from the can roller in the production process of the layered product as described later, or when pressed into a flat layered base element.

In FIG. 27, the protective layer can be provided in the layered product 40 in FIG. 21, instead of the layered product 11 in FIG. 18, in the same manner as above. In this case, the above description can be applied by substituting the elements of the layered product 11 with the elements of the layered product 40 in FIG. 21, where necessary.

Embodiment6

Next, a layered product provided with external electrodes on sides thereof will be described.

Figure 28:
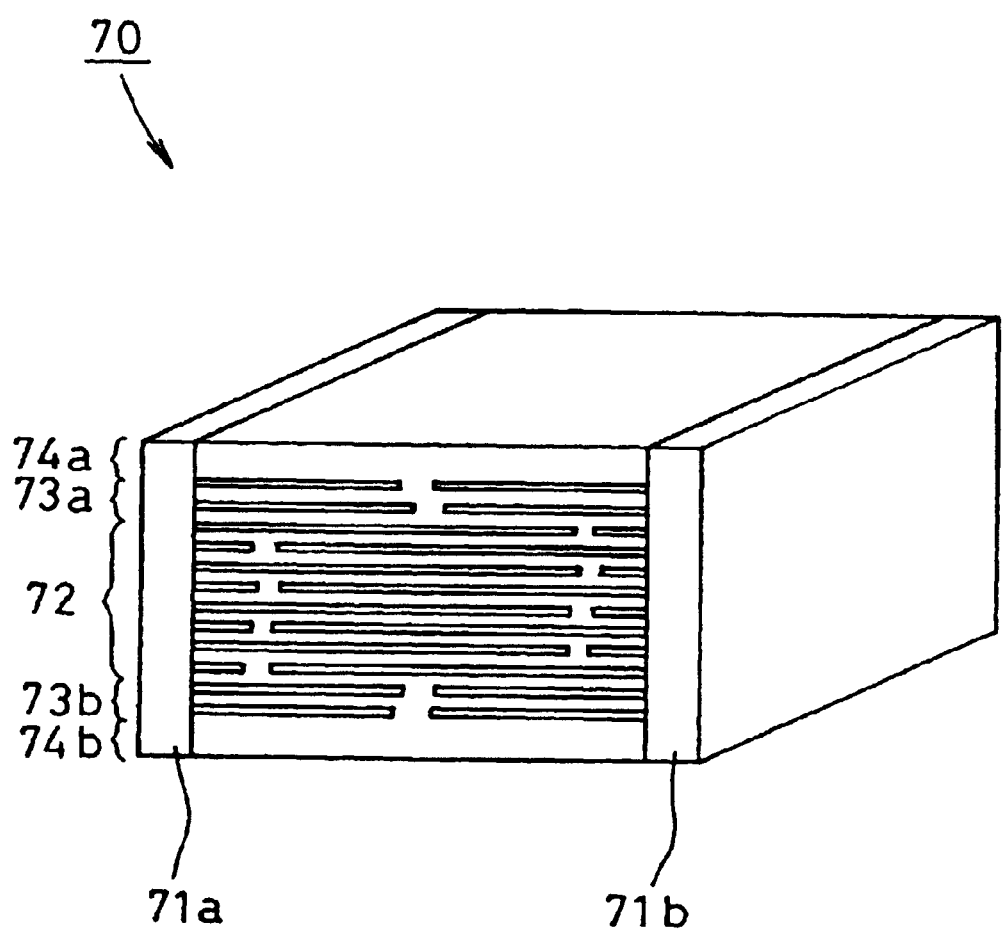
FIG. 28 is a schematic perspective view of an example of the layered product of the second invention with external electrodes formed on the sides thereof.

FIG. 28 is a schematic cross-sectional view of an example of a layered product with external electrodes 71a and 71b on sides of the layered product. In the layered product with external electrodes in FIG. 28, reinforcement layers 73a and 73b are deposited on both sides of a layered product portion 72, and protective layers 74a and 74b are deposited further thereon. The layered product 11 described in Embodiment 3 with reference to FIG. 18 is used as the layered product portion 72. The reinforcement layers 50a and 50b described in Embodiment 4 with reference to FIG. 23 are used as the reinforcement layers 73a and 73b. The protective layers 65a and 65b described in Embodiment 5 with reference to FIG. 27 are used as the protective layers 74a and 74b.

The external electrodes 71a and 71b are electrically connected to the first metal thin film layer and the second metal thin film layer of the layered product 72, respectively.

The external electrodes can be formed by metal spraying with brass or the like. In this case, the external electrodes can be constituted of a plurality of layers by spraying different types of metals. For example, an underlying layer is formed by spraying a metal having good adhesion strength with the layered product, and then an upper layer is provided thereon by spraying a metal having good adhesiveness with various metals or a resin to be contacted (deposited) further on the upper layer.

Furthermore, for a soldering property at the time of mounting, melt solder plating, melt tinning, electroless solder plating or the like can be performed. In this case, as an underlying layer, the following layer can be formed: a layer obtained by applying a conductive paste where copper powder or the like is dispersed in a thermosetting phenol resin and heating for curing; or a layer obtained by spraying a metal such as an alloy comprising copper/phosphorus/silver.

Furthermore, a bump electrode can be provided in the external electrode to facilitate the mounting onto a circuit board further. The bump electrode can be formed by selecting a material suitably from known materials or shapes.

Furthermore, a necessary outer package in accordance with the intended application can be provided. For example, a coating about several tens of angstroms thick is provided using a surface treatment agent such as a silane coupling agent for the purpose of improving resistance of the layered product against humidity or protecting exposed metal thin film layers and/or metal layers. Alternatively, a layer obtained by applying a photocurable or thermosetting resin to a thickness of about several hundreds μm and curing the resin can be provided.

The thus obtained layered product of the present invention can be used as a chip capacitor, a chip coil, a chip resistor, and a composite element including these, and used suitably as an electronic component such as a capacitor. In particular, the layered product of the present invention can be a capacitor having high capacitance, although it is small. Therefore, when it is used as a chip capacitor, the practical value is high.

In FIG. 28, instead of the layered product 11 in FIG. 18, the layered product 40 in FIG. 21 can be used as the layered product 72. In this case, the above description can be applied by substituting the elements of the layered product 11 with the elements of the layered product 40 in FIG. 21, where necessary. Furthermore, instead of the reinforcement layers 50a and 50b in FIG. 23, the reinforcement layers 60a and 60b in FIG. 25 can be used as the reinforcement layers 73a and 73b. In this case, the above description can be applied by substituting the elements of the reinforcement layers 50a and 50b with the elements of the reinforcement layers 60a and 60b in FIG. 25, where necessary.

Embodiment 7

Next, a method for producing the layered product of the present invention will be described.

Figure 29:
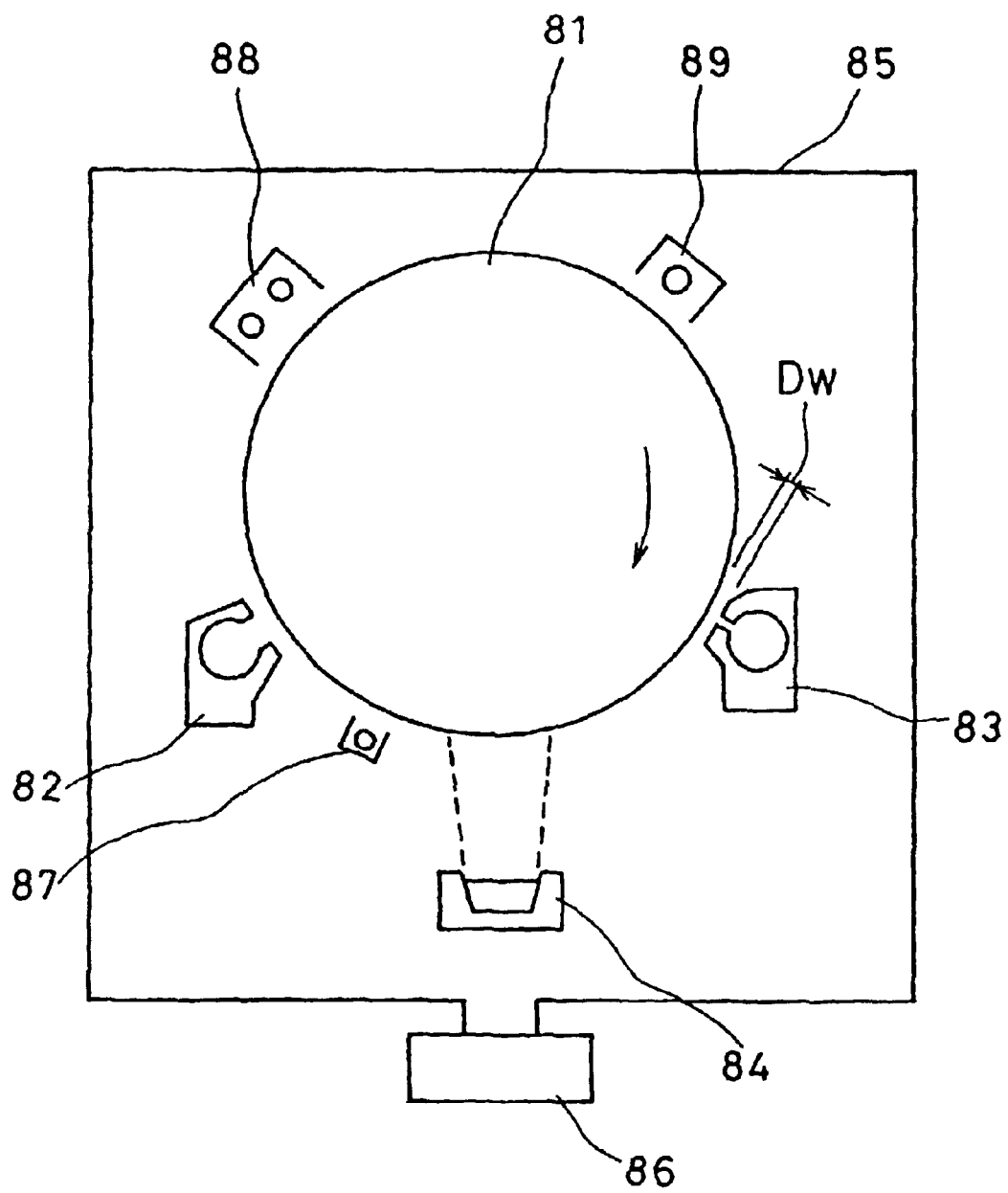
FIG. 29 is a schematic view showing an example of an apparatus with which a method for producing the layered product of the second present invention is performed.

FIG. 29 is a schematic view illustrating an example of a production apparatus for producing the layered product of the present invention.

A metal evaporation source 84 is provided at a lower portion of a can roller 81, which rotates in the direction of the arrow in FIG. 29 with constant angular velocity or constant circumferential velocity. A resin evaporation source 82 is provided downstream in the rotation direction of the can roller 81, and an apparatus 83 for applying patterning material is provided upstream thereof.

In this example, an apparatus 87 for removing patterning material is provided between the metal evaporation source 84 and the resin evaporation source 82, and an apparatus 88 for curing resin and an apparatus 89 for treating a resin surface are provided between the resin evaporation source 82 and the apparatus 83 for applying patterning material. However, these apparatuses can be omitted if desired, and are not indispensable to the present invention.

The apparatuses are installed inside a vacuum container 85, in which a vacuum is maintained with a vacuum pump 86.

The circumferential surface of the can roller 81 is smooth, preferably mirror-finished, and cooled preferably to −20° C. to 40° C., more preferably −10° C. to 10° C. The rotation velocity can be adjusted freely, but preferably is about 15 to 70 rpm.

The metal evaporation source 84 allows metal evaporation toward the surface of the can roller 81 to form the metal thin film layer of the layered product and the metal layer of the reinforcement layer. As the evaporation metal, for example, at least one selected from the group consisting of Al, Cu, Zn, Sn, Au, Ag, and Pt can be used. Instead of evaporation, the metal thin film can be formed by a known technique such as sputtering, ion plating or the like.

The resin evaporation source 82 allows a reactive monomer resin to evaporate or vaporize toward the surface of the can roller 81. The resin is deposited so as to form the dielectric layer, the resin layer of the reinforcement layer and the protective layer.

If necessary, the deposited reactive monomer resin can be polymerized and/or cross-linked with the apparatus 88 for curing resin and cured to a predetermined curing degree. As the apparatus for curing resin, an electron beam irradiation device or a UV beam irradiation device can be used, for example.

If necessary, the surface of the formed resin thin film is treated with the apparatus 89 for treating a resin surface. For example, the surface of the resin layer can be activated with an oxygen plasma to increase the adhesiveness with the metal thin film.

The apparatus 83 for applying patterning material deposits a patterning material on the surface of the resin thin film in a predetermined shape. No metal thin film is formed at the portions where the patterning material has been deposited. As the patterning material, for example, oil can be used. To apply the patterning material, evaporated and vaporized patterning material can be ejected from pinholes and condensed on the surface of the resin thin film, or liquid patterning material can be ejected. Besides these examples of contactless application methods, other application methods such as reverse coating or die coating are possible, but for the present invention, contactless application methods are preferable because no external pressure is applied to the resin surface. Especially, a method of condensing the evaporated patterning material on the surface of the resin thin film is preferable because the structure is relatively simple.

Figure 30:
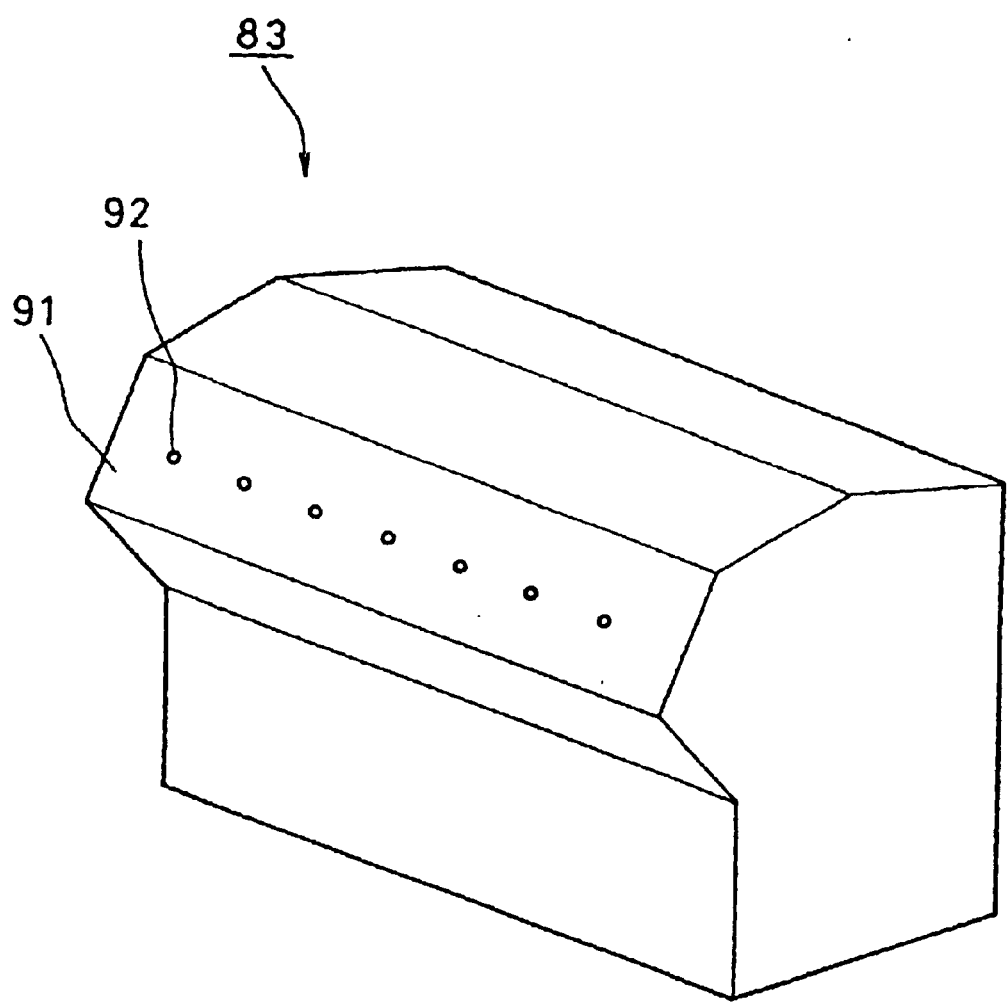
FIG. 30 is a schematic perspective view of an example of an apparatus for applying patterning material.

FIG. 30 is a schematic perspective view of an apparatus for applying patterning material that applies a belt-shaped oil film on a surface of a resin thin film by ejecting evaporated oil as an example of the apparatus for applying patterning material. The apparatus is provided in such a manner that a plane 91 of the apparatus 83 for applying patterning material is perpendicular to the normal line of the circumferential surface of the can roller 81. On the plane 91, a predetermined number of pinholes 92 for ejecting vaporized oil are arranged at predetermined intervals. The shape of the pinholes 92 can be round, as shown in FIG. 30, but elliptical, elongated, rectangular or other shapes are also possible. Alternatively, a plurality of elliptical, elongated, or rectangular pinholes can be arranged in the travel direction of the surface of the can roller.

The patterning material applied with the apparatus 83 for applying patterning material can be removed by an apparatus 87 for removing patterning material, if necessary. Most of the patterning material that has been deposited with the apparatus for applying a patterning material is removed by being again evaporated when the metal thin film layer is formed. However, a portion remains even after the formation of the metal thin film layer, and can contribute to a number of problems, such as chapping the deposited surface, causing pinholes (lack of deposition) in the dielectric layer or the metal thin film layer, or instabilities in the regions where the metal thin film layer is deposited. The patterning material should be applied in the minimum amount necessary so that it is not present after the formation of the metal thin film layer. However, if the amount is insufficient even slightly, the non-deposition portion of the metal thin film layer cannot be formed as intended. Thus, the control thereof is very difficult. Therefore, it may be preferable to remove the residual patterning material after the metal thin film layer has been deposited and before the dielectric layer is deposited.

There is no particular limitation regarding how the patterning material is removed. However, for example, when oil is used as the patterning material, the patterning material can be removed by heat evaporation by a heater, or decomposition by plasma irradiation, or a combination thereof. In this case, oxygen plasma, argon plasma, nitrogen plasma, or the like can be used for the plasma irradiation, but among these, oxygen plasma is most preferable.

The layered product of the present invention is produced by repeating a process unit a predetermined number of times, the process unit including applying a resin material with the resin evaporation source 82, thereby forming a dielectric layer, applying a patterning material on the dielectric layer with the apparatus 83 for applying patterning material, and depositing a metal thin film layer with the metal evaporation source 84.

In this case, the $2n^{th}$ (n is a natural number) application of the patterning material is performed in a different position from that of the $2n-1^{th}$ application. Moreover, all the positions of the $2n^{th}$ application of the patterning material are not the same, and all the positions of the $2n-1^{th}$ application of the patterning material are not the same. In the thus produced layered product, an electrically insulating portion is formed in a belt-shape in a non-end portion of the dielectric layer, and the deposition positions of the electrically insulating portions of adjacent deposition units are different. In addition, the deposition positions of the electrically insulating portions of every other deposition unit are not the same in the overall layered product. Alternatively, in the thus produced layered product, an electrically insulating portion is formed in a belt-shape in an end portion of the dielectric layer, and the electrically insulating portions of adjacent deposition units are positioned on opposite sides. In addition, the widths of the electrically insulating portions of every other deposition unit are not the same in the overall layered product.

Furthermore, it is preferable to displace the position of the $2n+1^{th}$ application of the patterning material with respect to the position of the $2n-1^{th}$ application of the patterning material by W/20 to 4W, where W is the application width of the belt-shaped patterning material, and to displace the position of the $2n+2^{th}$ application of the patterning material with respect to the position of the $2n^{th}$ application of the patterning material by W/20 to 4W. In the thus produced layered product, the displacement amount of the deposition positions of the electrically insulating portions of every other deposition unit is W/20 or more and not more than 4W, where W is the width of the belt-shaped electrically insulating portion.

Furthermore, it is preferable that both the maximum of the variations of the positions of the $2n^{th}$ application of the patterning material and the maximum of the variations of the positions of the $2n-1^{th}$ application of the patterning material are 6W/5 to 5W, where W is the application width of the belt-shaped patterning material. In the thus produced layered product, the maximum of the variations of the deposition positions of the electrically insulating portions of every other deposition unit are 6W/5 to 5W in the overall layered product.

In the process of producing the layered product, since the deposition thickness becomes larger as the deposition units are deposited sequentially, it is preferable to retract the apparatus 83 for applying patterning material as the deposition progresses, not only in the case where the patterning material is directly applied by coating or the like, but also in the case where deposition is performed by a contactless method. In other words, in FIG. 29, it is preferable to deposit layers while constantly maintaining a constant distance Dw between the circumferential surface of the layered product that is being formed on the can roller 81 and the pinhole end of the apparatus for applying patterning material at a predetermined interval. This is because the patterning material diffuses with a certain directionality especially when vaporized oil is ejected for deposition, so that a variation of the distance Dw changes the application width, whereby the electrically insulating portion having a predetermined width cannot be obtained stably.

Figure 31:
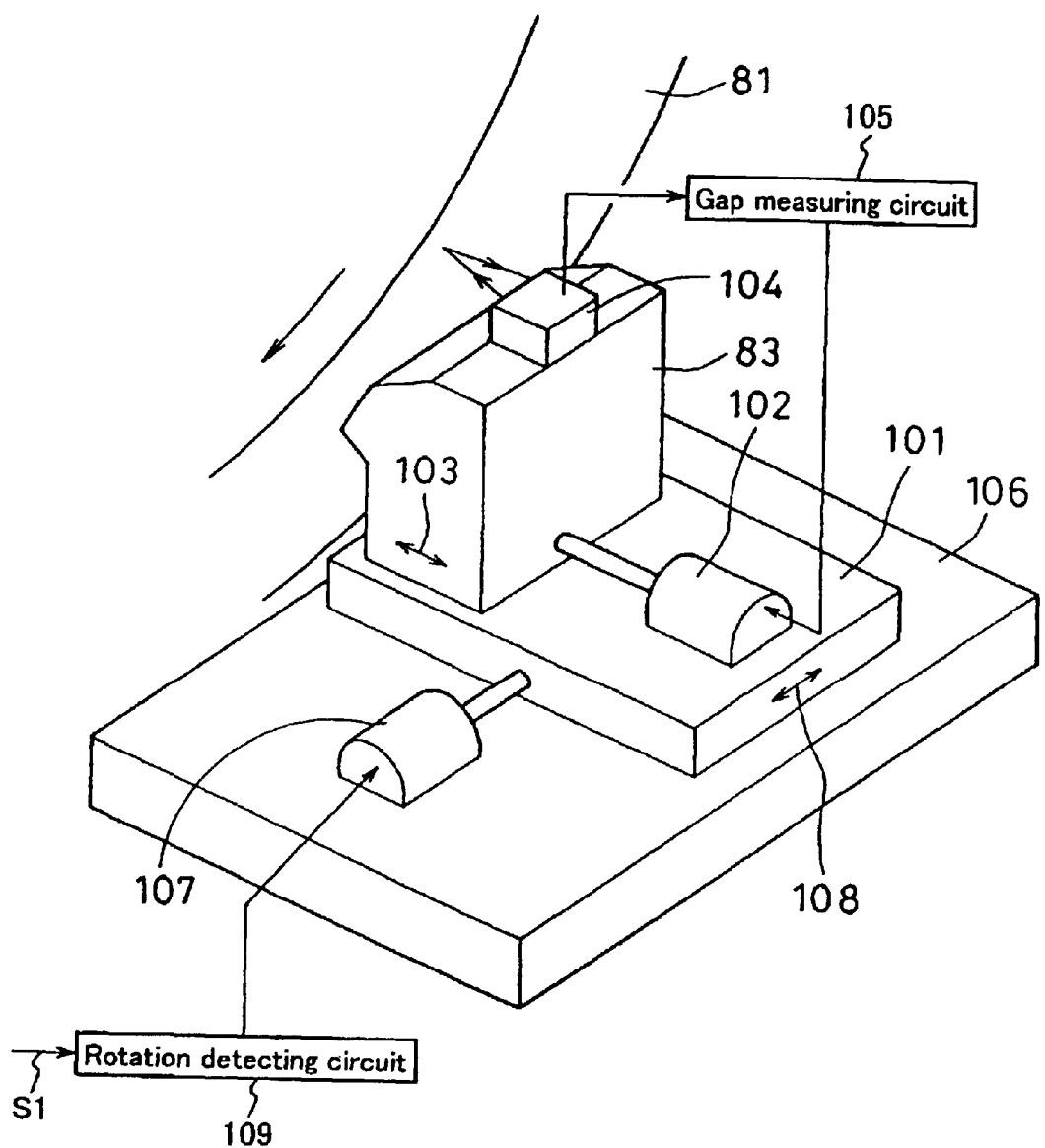
FIG. 31 is a schematic view illustrating a device for retracting the apparatus for applying patterning material and moving the application position of the patterning material.

The retraction of the apparatus for applying patterning material and the movement of the deposition position of the patterning material can be performed, for example by an apparatus as shown in FIG. 31.

First, the apparatus for applying patterning material is retracted in the following manner. An actuator A 102 is fixed on a movable base 101. The apparatus 83 for applying patterning material is attached to the mobile end of the actuator A 102. The actuator A 102 can move the apparatus 83 for applying patterning material in the direction of arrow 103 on the movable base 101. A gap measuring device 104 for measuring the distance to the surface of the can roller 81 (the circumferential surface of the layered product in the process of the formation of the layered product) is provided on the apparatus 83 for applying patterning material. A contactless measuring device, for example a measuring device using a laser, can be used for the gap measuring device 104. During the manufacturing of the layered product, the gap measuring device 104 keeps measuring the distance to the circumferential surface of the layered product on the surface of the can roller 81, and a signal corresponding to this measurement is sent to a gap measuring circuit 105. The gap measuring circuit 105 continuously checks whether the distance between the nozzle end of the apparatus 83 for applying patterning material and the surface of the can roller 81 (the circumferential surface of the layered product during the formation of layers) is within a predetermined range. When the deposition progresses and the gap measuring circuit 105 determines that this distance is smaller than the predetermined range, it instructs the actuator A 102 to retract the apparatus 83 for applying patterning material a predetermined distance, and based on this instruction, the apparatus 83 for applying patterning material is retracted a predetermined distance. Thus, the distance Dw between the pinhole end of the apparatus 83 for applying patterning material and the circumferential surface of the layered product on the can roller 81 always can be kept within a constant interval while the deposition progresses.

As an alternative to the control using the gap measuring device 104 and the gap measuring circuit 105 as described above, the apparatus for applying patterning material also can be retracted for a preset length based on the layering thickness, in accordance with the number of rotations of the can roller 81 (for example, per rotation). Moreover, fine-tuning can be performed in this configuration by using also the gap measuring device 104 described above for distance measurement for verification.

Next, the position where the patterning material is applied can be changed in the following manner. An actuator B 107 is attached to a support base 106. The movable base 101 is attached to the mobile end of the actuator B 107. The actuator B 107 can move the movable base 101 on the support base 106 in the direction indicated by arrow 108. The rotation of the can roller 81 is observed by a rotation detector (not shown in the drawing), which sends a rotation signal S1 to a rotation detecting circuit 109 whenever the can roller 81 has rotated one turn. When the rotation detecting circuit 109 has counted a predetermined number of detections of the rotation signal S1 (for example one detection), it instructs the actuator B 107 to move the movable base 101 for a predetermined distance in a predetermined direction as indicated by arrow 108. Thereby, the movable base 101, and thus the apparatus 83 for applying patterning material, is moved a predetermined distance in a predetermined direction as indicated by arrow 108. Thus, the position where patterning material is applied can be changed for every predetermined number of rotations of the can roller 81 for a predetermined distance in a direction that is perpendicular to the rotation and travel direction of the surface of the can roller 81.

Thus, a cylindrical continuous layered product where the dielectric layer and the metal thin film layer separated by the electrically insulating portion are deposited sequentially is formed on the circumferential surface of the can roller 81. When a predetermined number of times of deposition is completed, the cylindrical continuous layered product is divided in the radial direction (e.g., into 8 sections by every 45°) and removed from the can roller 81. The sections are pressed under heat and pressure, and flat layered base elements are obtained.

Figure 32:
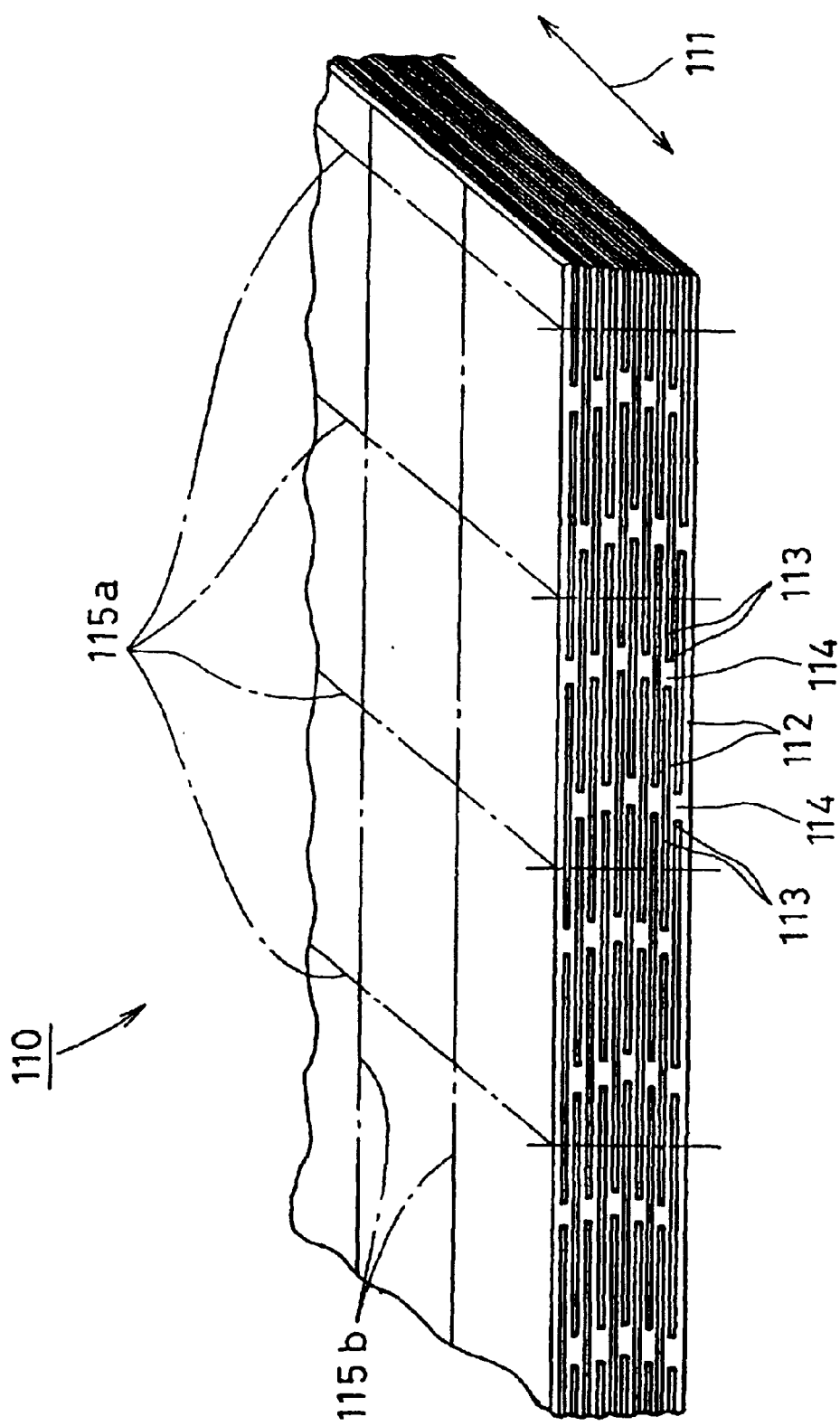
FIG. 32 is a partial perspective view showing an example of a schematic structure of a flat layered base element.

FIG. 32 is a partial perspective view illustrating the outline of the structure of the flat layered base element obtained in the above-described manner. In FIG. 32, arrow 111 indicates the travel direction (circumferential direction) on the can roller 81.

As shown in FIG. 32, in the layered base element 110, a dielectric layer 112 and a metal thin film layer 113 separated by an electrically insulating portion 114 are deposited sequentially. Thereafter, the layered base element is cut along cutting planes 115*a* and 115*b*, so that the layered product as shown in FIG. 18 can be obtained.

Figure 33:
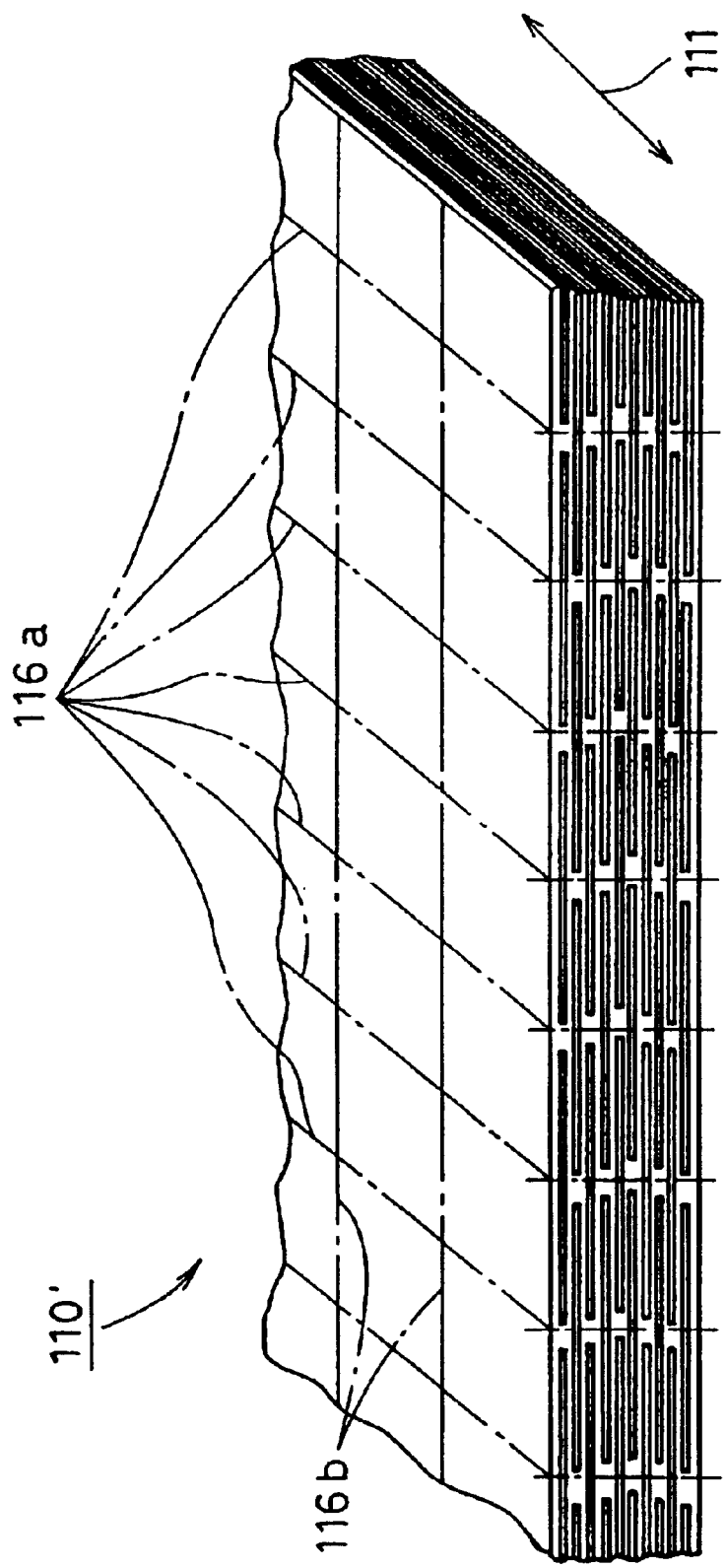
FIG. 33 is a partial perspective view showing another example of a schematic structure of a flat layered base element.

Furthermore, as shown in FIG. 33, when the layered base element 110' obtained in the same manner is cut along cutting planes 116*a* and 116*b*, the layered product as shown in FIG. 21 can be obtained.

For depositing the reinforcement layer shown in Embodiment 4, the apparatus for applying patterning material in the apparatus shown in FIG. 29 is moved (to a predetermined position in the direction indicated by arrow 108 in FIG. 31) in the first stage or the last stage of deposition, so that the patterning material is applied in a desired deposition position of the electrically insulating band, and the can roller 81 is rotated a predetermined number of turns. The thickness of the resin layer and/or the metal layer can be made different from the thickness of the dielectric layer and/or the metal thin film layer simply by adjusting the rotational speed of the can roller 81 or depositing the resin layer or the metal layer by rotating a plurality of turns with shielding plates provided in the resin evaporation source 82 and/or the metal evaporation source 84.

For depositing the protective layer shown in Embodiment 5, in the apparatus shown in FIG. 29, the can roller 81 is rotated a predetermined number of turns while the metal evaporation source 84 is shielded or metal evaporation is stopped in the first stage or the last stage of deposition, thereby depositing only the resin layer.

In the apparatus shown in FIG. 29, the layered product is formed on the cylindrical can roller 81. However, the supporting base on which the layered product is formed is not limited thereto, and any supporting base can be used, as long as it rotates in a vacuum apparatus. For example, the layered product can be formed on a belt-shaped supporting base that rotates around a plurality of rolls. The belt-shaped supporting base can be formed of a metal, a resin, a fabric or a complex of these. In addition, a rotating disk also can be used. In this case, the electrically insulating portions are formed concentrically.

Thus, the method for producing a layered product of the present invention allows the layered product of the present invention to be produced a simple method, efficiently and inexpensively.

Next, the present invention will be described by way of specific examples.

EXAMPLE 2

A layered product was produced with the apparatus shown in FIG. 29.

A vacuum container 85 was evacuated to $2\times10^{-4}$ Torr, and the circumferential surface of the can roller 81 was maintained at 5° C.

First, a portion that was to serve as a protective layer was deposited on the circumferential surface of the can roller 81. Dicyclopentadiene dimethanoldiacrylate was used as the material of the protective layer, and evaporated so as to be deposited on the circumferential surface of the can roller 81. Then, a UV curing device was used as the apparatus 88 for curing resin to polymerize and cure the protective layer material deposited in the above-described manner. This operation was repeated by rotating the can roller 81 so that the protective layer having a thickness of 15 $\mu$m was formed on the circumferential surface of the can roller 81.

Then, a portion that was to serve as a reinforcement layer was deposited. The same material as that for the protective layer was used as the resin layer material, and evaporated so as to be deposited on the protective layer. Then, a UV curing device was used as the apparatus 88 for curing resin to polymerize and cure the resin layer material deposited in the above-described manner. The thickness of the thus formed resin layer was 0.6 $\mu$m. Thereafter, the surface was treated with oxygen plasma with the apparatus 89 for treating resin surface. Next, a pattering material was applied with the apparatus 83 for applying pattering material. A fluorocarbon oil was used as the pattering material, and it was evaporated and ejected from a pinhole having a diameter of 50 $\mu$m so as to be deposited in the form of a belt having a width of 150 $\mu$m. Then, aluminum was deposited with a metal evaporation source 84. The deposition thickness was 300 Å, and the film resistance was 4$\Omega$/□. Thereafter, the residual patterning material was removed by heating with a far infrared radiation heater and a plasma discharge treatment using the apparatus 87 for removing patterning material. This operation was repeated 500 times by rotating the can roller 81 so that the reinforcement layer having a total thickness of 315 $\mu$m was formed. The movement of the apparatus for applying patterning material in the direction perpendicular to the travel direction of the circumferential surface of the can roller 81 (the direction indicated by arrow 108 in FIG. 31) was performed with the device shown in FIGS. 30 and 31 in the following pattern. When the can roller 81 had rotated one turn, the apparatus was shifted 60 $\mu$m in a first direction; after the next rotation, the apparatus was shifted 60 $\mu$m in the same first direction; after the next rotation, it was shifted 60 $\mu$m in a second direction opposite to the first direction; and after the next rotation, it was shifted 60 $\mu$m in the second direction. These shifts constituted one cycle, which was repeated thereafter. The distance Dw between the pinholes 92 of the apparatus for applying patterning material and the deposition surface was controlled to be maintained constantly at 250 to 300 $\mu$m.

Next, a layered product portion comprising a dielectric layer and a metal thin film layer was deposited. The same material as that for the protective layer and the resin layer was used as the dielectric layer material, and evaporated so as to be deposited on the resin layer. Then, a UV curing device was used as the apparatus 88 for curing resin to polymerize and cure the dielectric layer material deposited in the above-described manner. The thickness of the thus formed dielectric layer was 0.4 $\mu$m. Thereafter, the surface was treated with oxygen plasma with the apparatus 89 for treating resin surface. Next, a pattering material was applied to a portion corresponding to an electrically insulating portion with the apparatus 83 for applying pattering material. A fluorocarbon oil was used as the pattering material, and it was evaporated and ejected from a pinhole having a diameter of 50 $\mu$m so as to be deposited in the form of a belt having a width of 150 $\mu$m. Then, aluminum was deposited with a metal evaporation source 84. The deposition thickness was 300 Å, and the film resistance was 4$\Omega$/□. Thereafter, the residual patterning material was removed by heating with a far infrared radiation heater and a plasma discharge treatment using the apparatus 87 for removing patterning material. This operation was repeated about 2000 times by rotating the can roller 81 so that the layered product portion having a total thickness of 860 $\mu$m was formed. The movement of the apparatus for applying patterning material in the direction perpendicular to the travel direction of the circumferential surface of the can roller 81 (the direction indicated by arrow 108 in FIG. 31) was performed with the device shown in FIGS. 30 and 31 in the following pattern. When the can roller 81 had rotated one turn, the apparatus was shifted 1000 $\mu$m in a first direction; after the next rotation, the apparatus was shifted 940 $\mu$m in a second direction opposite to the first direction; after the next rotation, it was shifted 1000 $\mu$m in the first direction; after the next rotation, it was shifted 940 $\mu$m in the second direction; after the next rotation, it was shifted 1000 $\mu$m in the first direction; after the next rotation, it was shifted 1060 $\mu$m in the second direction; after the next rotation, it was shifted 1000 $\mu$m in the first direction; and after the next rotation, it was shifted 1060 $\mu$m in the second direction. These shifts constituted one cycle, which was repeated thereafter. The distance Dw between the pinholes 92 of the apparatus for applying patterning material and the deposition surface was controlled to be maintained constantly at 250 to 300 $\mu$m.

Next, a reinforcement layer portion having a thickness of 315 $\mu$m was formed on a surface of the layered product portion. The method thereof was exactly the same as the method for the reinforcement layer as described above.

Finally, a protective layer portion having a thickness of 15 $\mu$m was formed on a surface of the reinforcement layer. The method thereof was exactly the same as the method for the protective layer as described above.

Then, the obtained cylindrical layered product was cut into 8 sections in the radial direction (separated by 45°) and removed. The sections were pressed under heat, and flat layered base elements as shown in FIG. 32 were obtained (in reality, the reinforcement layer and the resin layer were deposited on the upper and lower surfaces). The flat layered base elements were cut along the cutting planes 115a, and the cutting planes were metallized with brass by spraying so as to form external electrodes. An electrically conducting paste where an alloy comprising copper, Ni, silver or the like had been dispersed in a thermosetting phenol resin was applied to the metallized surface, heat-cured, and the resulting resin surface was plated with molten solder. After that, the pieces were cut along the cutting planes 115b in FIG. 32, and immersed in a silane coupling agent to coat the circumferential surface, whereby chip capacitors as shown in FIG. 28 were obtained.

The width of the electrically insulating portion of the capacitance generation portion for a capacitor was 150 $\mu$m. The displacement amount d of the deposition positions of the electrically insulating portions of every other deposition unit was 60 μm. The maximum displacement width D of the deposition positions of the electrically insulating portions of every other deposition unit in the overall layered product was 270 μm. The width of the electrically insulating band of the reinforcement layer was 150 μm, and it was positioned substantially in a central portion in the width direction. The displacement amount $d_1$ of the deposition positions of the electrically insulating bands of adjacent deposition units was 60 μm. The maximum displacement width $D_1$ of the deposition positions of the electrically insulating bands in the overall reinforcement layer was 270 μm.

The obtained chip capacitor had a thickness in the deposition direction of 1.5 mm, a depth of about 1.6 mm and a width (in the direction between the opposite external electrodes) of about 3.2 mm, which was small, and yet the capacitance was 0.47 μF. The withstand voltage was 50V. Irregularities on the upper and lower surfaces in the deposition direction substantially were not observed, and a difference between the uppermost point and the lowest point in the irregularities was 10 μm or less. When the chip capacitor was mounted onto a printed circuit board with solder, there were no problems such as the external electrodes falling off. Furthermore, when the obtained chip capacitor was dismantled, and the surface roughnesses Ra of the surface of the dielectric layer and the surface of the metal thin film layer were measured, the results were 0.005 μm and 0.005 μm, respectively. The curing degrees of the dielectric layer, the resin layer and the protective layer were 95%, 95% and 90%, respectively.

EXAMPLE 3

The conditions under which the patterning material is applied for a layered product comprising dielectric layers and metal thin film layers in Example 2 were changed as follows. The diameter of the pinhole of the apparatus for applying patterning material was changed to 75 mm, and the patterning material was applied in the shape of a belt having a width of 200 mm. The movement of the apparatus for applying patterning material in the direction perpendicular to the travel direction of the circumferential surface of the can roller 81 (the direction indicated by arrow 108 in FIG. 31) was performed with the device shown in FIGS. 30 and 31 in the following pattern. When the can roller was rotated one turn, the apparatus was shifted 1000 μm in a first direction; after the next rotation, it was shifted 940 μm in a second direction opposite to the first direction; after the next rotation, it was shifted 1000 μm in the first direction; after the next rotation, it was shifted 940 μm in the second direction; after the next rotation, it was shifted 1000 μm in the first direction; after the next rotation, it was shifted 1060 μm in the second direction; after the next rotation, it was shifted 1000 μm in the first direction; and after the next rotation, it was shifted 1060 μm in the second direction. These shifts constituted one cycle, which was repeated thereafter.

Figure 34:
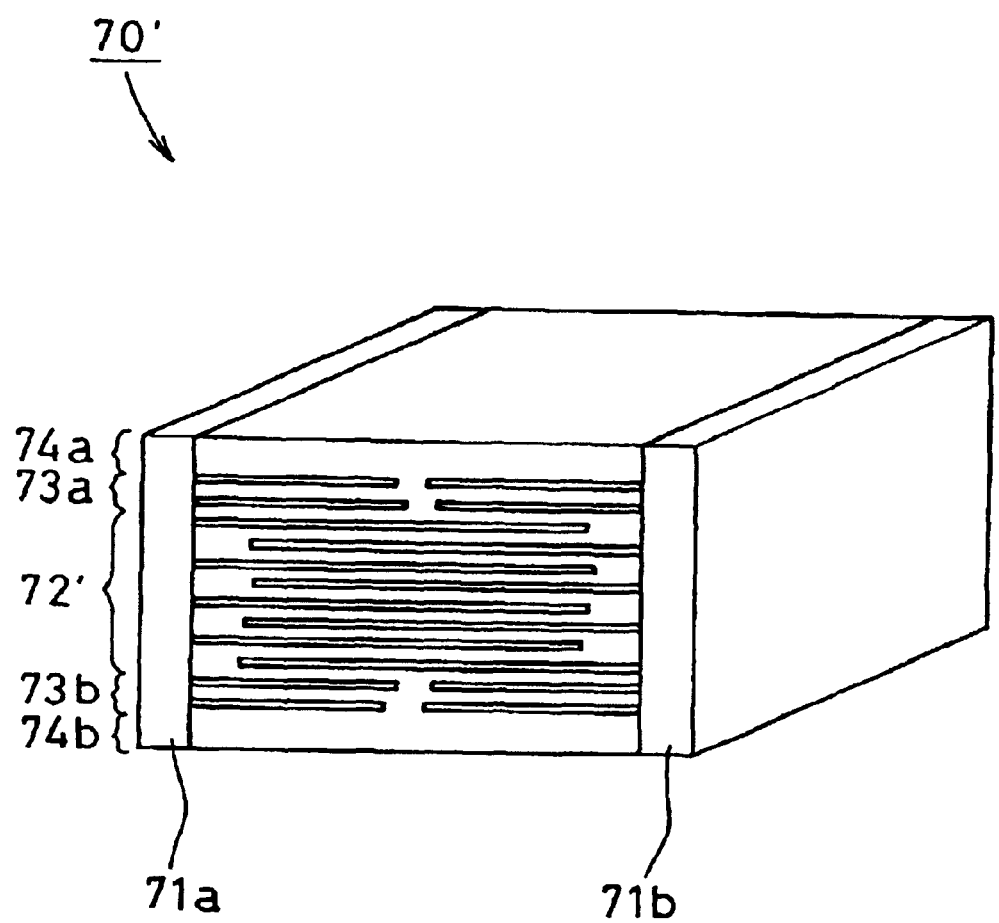
FIG. 34 is a schematic perspective view of a chip capacitor according to Example 3.

The layered base element shown in FIG. 33 was obtained in the same manner as in Example 2 except for the conditions described above (however, in reality, the reinforcement layer and the resin layer were deposited on the upper and lower surfaces). The layered base element was cut along the cutting planes 116a, and the cutting planes were metallized with brass by spraying so as to form external electrodes. An electrically conducting paste where an alloy comprising copper powder had been dispersed in a thermosetting phenol resin was applied to the metallized surface, heat-cured, and the resulting resin surface was plated with molten solder. After that, the pieces were cut along the cutting planes 116b in FIG. 33, and immersed in a silane coupling agent to coat the circumferential surface, whereby chip capacitors 70' as shown in FIG. 34 were obtained.

The average width W AVE of the electrically insulating portion of the capacitance generation portion for a capacitor was 140 μm. The maximum width W MAX was 200 μm. The minimum width W MIN was 80 μm.

The obtained chip capacitor had a thickness in the deposition direction of 1.5 mm, a depth of about 1.6 mm and a width (in the direction between the opposite external electrodes) of about 3.2 mm, which was small, and yet the capacitance was 0.47 μF. The withstand voltage was 50V. Irregularities on the upper and lower surfaces in the deposition direction substantially were not observed. When the chip capacitor was mounted onto a printed circuit board with solder, there were no problems such as the external electrodes falling off. Although the number of metal thin film layers that are connected to the external electrodes is larger than that of Example 2, sufficient adhesion strength was obtained. This is believed to be because the interval between the metal thin film layers is broad, so that sprayed metal particles can penetrate between the metal thin film layers sufficiently, and the metal layer of the reinforcement layer contributes to the adhesion strength. Furthermore, when the obtained chip capacitor was dismantled, and the surface roughnesses Ra of the surface of the dielectric layer and the surface of the metal thin film layer were measured, the results were 0.005 μm and 0.005 μm, respectively. The curing degrees of the dielectric layer, the resin layer and the protective layer were 95%, 95% and 90%, respectively.

COMPARATIVE EXAMPLE 1

Chip capacitors were produced in the same manner as in Example 2, except that there was no displacement of the deposition positions of the electrically insulating portions of the layered product portion, nor displacement of the deposition positions of the electrically insulating bands of the reinforcement layer.

The obtained chip capacitor had a thickness in the deposition direction of 1.5 mm, a depth of about 1.6 mm and a width (in the direction between the opposite external electrodes) of about 3.2 mm. On the upper surface in the deposition direction, there were two recesses in the electrically insulating portion of the layered product portion and one recess in the electrically insulating band of the reinforcement layer. The depth of the former was about 30 μm, and the depth of the latter was about 30 μm. The capacitance was 0.40 μF, which did not satisfy the required specification. The capacitance was smaller than that of Example 2, because it is estimated that the recess in the electrically insulating portion caused a rupture in a part of the metal thin film layer. The withstand voltage was 16V, which did not satisfy the required specification. It is estimated that the withstand voltage was smaller than that of Example 2 because the recess in the electrically insulating band caused the thickness of the dielectric layer to become thin locally. When the chip capacitor was mounted onto a printed circuit board with solder, the wettability of the solder was poor due to the recesses. There was no problem of the external electrodes falling off.

COMPARATIVE EXAMPLE 2

Figure 35:
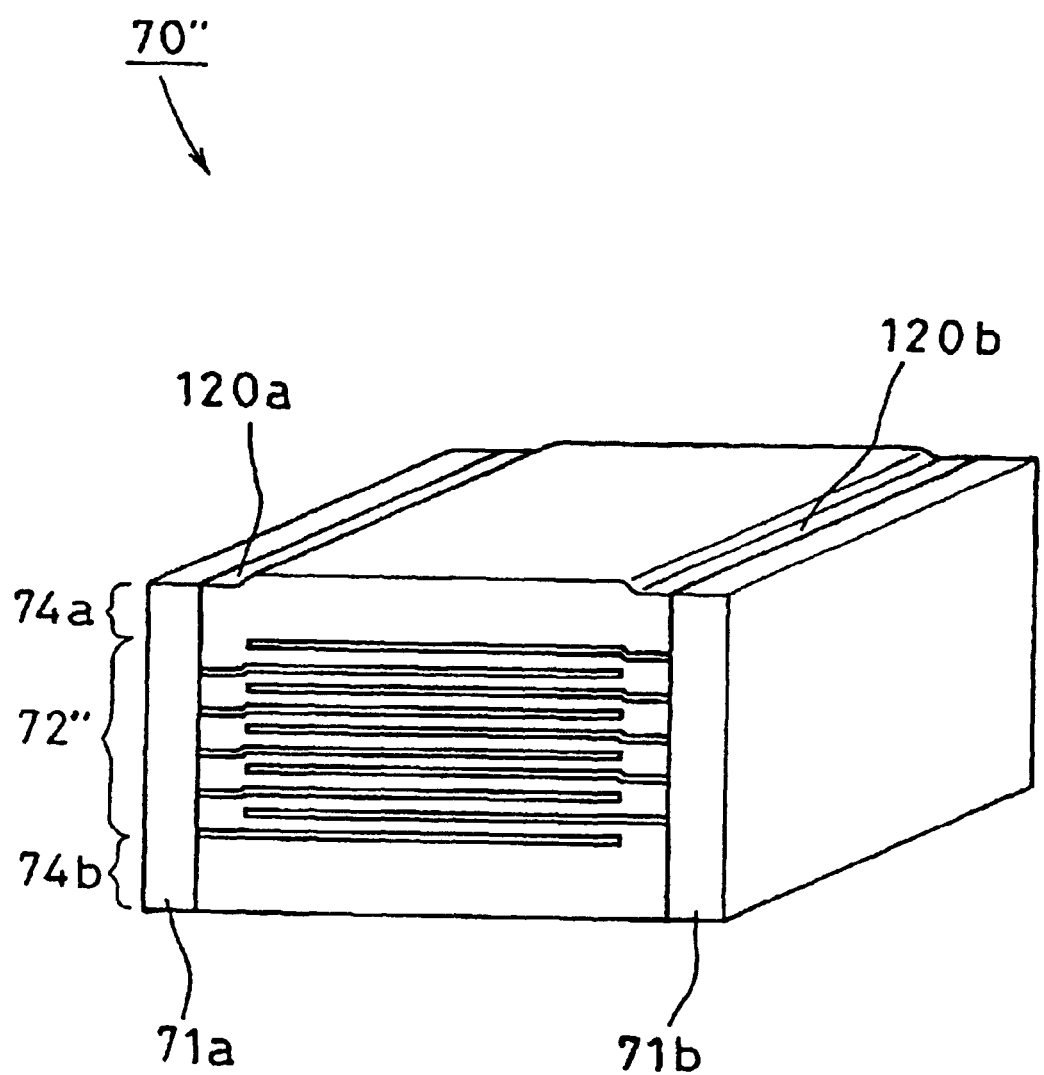
FIG. 35 is a schematic perspective view of a chip capacitor according to Comparative Example 2.

A chip capacitor 70" as shown in FIG. 35 was produced under production conditions that were modified from those of Example 3. The production conditions were as follows. The movement pattern of the apparatus for applying patterning material in the direction perpendicular to the travel direction of the circumferential surface of the can roller 81 (direction indicated by arrow 108 of FIG. 31) was changed, and all the widths of the electrically insulating portions were the same. In addition, protective layers 74a and 74b are deposited directly on and below the layered product portion 72" that functions as a capacitor without providing the reinforcement layer. Other than that, the chip capacitor was produced in the same manner as in Example 3.

The obtained chip capacitor had a thickness in the deposition direction of 0.9 mm (this was thinner that that of Example 2, because there was no reinforcement layer), a depth of about 1.6 mm and a width (in the direction between the opposite external electrodes) of about 3.2 mm. As shown in FIG. 35, there were recesses 120a and 120b at the end portions on the upper surface where there were a small number of metal thin film layers. The depth of the recess was 30 $\mu$m. The capacitance as a capacitor was 0.40 $\mu$F, which did not satisfy the required specification. Although the thickness of the dielectric layer, the number of depositions or some other conditions were the same as those of Example 3, the capacitance was smaller than that of the capacitor of Example 3. This is believed to be because steps were generated in portions corresponding to the recesses 120a and 120b, as shown in FIG. 35, and in these portions, a rupture occurred in a part of the metal thin film layer. The withstand voltage was 16V, which did not satisfy the required specification. It is estimated that the withstand voltage was smaller than that of Example 3 because the recess in the electrically insulating portion caused the thickness of the dielectric layer to become thin locally. When the chip capacitor was attempted to be mounted onto a printed circuit board with solder, the external electrodes fell off or poor electric connection occurred in some cases. This is believed to be because, unlike Example 3, there were no metal layers of the reinforcement layer portion that contributes the adhesion strength with the external electrodes, so that sufficient adhesion strength was not obtained. Furthermore, the wettability of the solder was slightly poorer due to the recesses on the surface.

The embodiments and the examples disclosed in this application are intended to describe the technical idea of the first and second invention and are to be considered as illustrative and not limiting the present first and second inventions. The present invention may be embodied in other forms without departing from the spirit or essential characteristics thereof and the scope of the invention, and all changes which come within the meaning and range of equivalency of the claims are intended to be embraced therein.

INDUSTRIAL APPLICABILITY

Regarding the First Invention

The method for producing a layered product of the present first invention can be utilized widely to produce various layered products that require compactness, high performance and low cost, for example a magnetic recording medium such as a magnetic tape, a wrapping material, and an electronic component. In particular, the present invention can be used suitably to produce electronic components whose required levels have become significantly high. For example, when the present invention is utilized to produce a capacitor, especially as a chip capacitor, compact and high capacitance capacitors having stable qualities can be obtained at low cost. In addition, when the present invention is utilized to produce a chip coil, a noise filter, or other electronic components, compactness, high performance, quality stability and low cost of these electronic components can be achieved.

Regarding the Second Invention

The layered product of the second present invention can be utilized widely for various layered products that require compactness, high performance and low cost, for example a magnetic recording medium such as a magnetic tape, a wrapping material, and an electronic component. In particular, the present invention can be used suitably for electronic components whose required levels have become significantly high. For example when the present invention is used for a capacitor, especially as a chip capacitor, compact and high capacitance capacitors having stable qualities can be obtained at low cost. In addition, when the present invention is utilized to produce a chip coil, a noise filter, or other electronic components, compactness, high performance, quality stability and low cost of these electronic components can be achieved.

Furthermore, the capacitor of the second present invention has a similar appearance and structure to those of a conventional chip type film capacitor and yet allows compactness and high performance to higher extent than the conventional capacitor. Therefore, the present invention can be used for applications whose required specifications cannot be satisfied by the conventional chip type film capacitor.

Furthermore, the method for producing the layered product of the second present invention can be utilized to produce the layered product that can be used for various applications.

What is claimed is:

1. A method for producing a layered product comprising:
   repeating a process unit on a rotating supporting base a predetermined number of times,
   the process unit including:
      applying a resin material so as to deposit a resin layer;
      applying a patterning material on the resin layer; and
      depositing a metal thin film layer;
   thereby producing a layered product comprising resin layers and metal thin film layers,
   wherein the application of the patterning material is perfomed by ejecting gaseous patterning material from a pinhole of an apparatus for applying patterning material opposed to a surface of the resin layers so as to be applied onto the surface of the resin layer, and
   a maximum diameter D of the pinhole is 10 $\mu$m to 500 $\mu$m.

2. The method for producing a layered product according to claim 1, wherein a shape of the pinhole is round, elliptical, elongated, or rectangular, and a single pinhole or a plurality of pinholes are provided.

3. The method for producing a layered product according to claim 1,
   wherein liquid patterning material is supplied to the apparatus for applying patterning material that has been heated, and is evaporated in the apparatus for applying patterning material so that the patterning material becomes gaseous, and then the gaseous patterning material is ejected through the pinhole of the apparatus for applying patterning material toward the surface of the resin layer.

4. The method for producing a layered product according to claim 1,
   wherein liquid patterning material is supplied to the apparatus for applying patterning material, the apparatus for applying patterning material is heated so as to evaporate the patterning material in the apparatus for applying patterning material so that the patterning material becomes gaseous, and then the gaseous patterning material is ejected through the pinhole of the apparatus for applying patterning material toward the surface of the resin layer.

5. A method for producing a layered product comprising:
repeating a process unit on a rotating supporting base a predetermined number of times, the process unit including:
applying a resin material so as to deposit a resin layer;
applying a patterning material on the resin layer in a contactless manner; and
depositing a metal thin film layer,
thereby producing a layered product comprising resin layers and metal thin film layers, wherein
the application of the patterning material is performed by ejecting gaseous patterning material from a pinhole of an apparatus for applying patterning material opposed to a surface of the resin layer so as to be applied onto the surface of the resin layer, and
L/D is 1 to 10, where D is a maximum diameter of the pinhole, and L is a depth of the pinhole.

6. The method for producing a layered product according to claim 5, wherein a shape of the pinhole is round, elliptical, elongated, or rectangular, and a single pinhole or a plurality of pinholes are provided.

7. The method for producing a layered product according to claim 5, wherein a maximum diameter D of the pinhole is 10 $\mu$m to 500 $\mu$m.

8. The method for producing a layered product according to claim 5,
wherein liquid patterning material is supplied to the apparatus for applying patterning material that has been heated, and is evaporated in the apparatus for applying patterning material so that the patterning material becomes gaseous, and then the gaseous patterning material is ejected through the pinhole of the apparatus for applying patterning material toward the surface of the resin layer.

9. The method for producing a layered product according to claim 5,
wherein liquid patterning material is supplied to the apparatus for applying patterning material, the apparatus for applying patterning material is heated so as to evaporate the patterning material in the apparatus for applying patterning material so that the patterning material becomes gaseous, and then the gaseous patterning material is ejected through the pinhole of the apparatus for applying patterning material toward the surface of the resin layer.

10. A method for producing a layered product comprising:
repeating a process unit on a rotating supporting base a predetermined number of times, the process unit including:
applying a resin material so as to deposit a resin layer;
applying a patterning material on the resin layer in a contactless manner; and
depositing a metal thin film layer;
thereby producing a layered product comprising resin layers and metal thin film layers, wherein
the application of the patterning material is performed by supplying gaseous patterning material to an apparatus for applying patterning material that has been heated, and then ejecting the gaseous patterning material toward a surface of the resin layer through a pinhole of the apparatus for applying patterning material opposed to the surface of the resin layer.

11. A method for producing a layered product comprising:
repeating a process unit on a rotating supporting base a predetermined number of times, the process unit including:
applying a resin material so as to deposit a resin layer;
applying a patterning material on the resin layer in a contactless manner; and
depositing a metal thin film layer;
thereby producing a layered product comprising resin layers and metal thin film layers, wherein
the application of the patterning material is performed by ejecting liquid patterning material from a pinhole of an apparatus for applying patterning material opposed to a surface of the resin layer so that the patterning material is applied onto the surface of the resin layer.

12. The method for producing a layered product according to claim 11, wherein the liquid patterning material is ejected dropwise.

13. The method for producing a layered product according to claim 12, wherein a continuous liquid film of the patterning material is formed on the surface of the resin layer.

14. The method for producing a layered product according to claim 11, wherein the patterning material is ejected by a piezoelectric element.

15. The method for producing a layered product according to claim 11, wherein a plurality of pinholes of the apparatus for applying patterning material are arranged in a direction perpendicular to a travel direction of the surface of the resin layer.

16. The method for producing a layered product according to claim 15, wherein the patterning material is ejected selectively from the plurality of pinholes.

17. The method for producing a layered product according to claim 11, wherein the ejected liquid patterning material is charged with electricity.

18. The method for producing a layered product according to claim 11, wherein an electric field is present in a space where the patterning material is ejected.

19. A method for producing a layered product comprising:
repeating a process unit on a rotating supporting base a predetermined number of times, the process unit including:
applying a resin material so as to deposit a resin layer;
applying a patterning material on the resin layer in a contactless manner; and
depositing a metal thin film layer;
thereby producing a layered product comprising resin layers and metal thin film layers, wherein
a position at which the patterning material is applied is changed every predetermined number of rotations of the supporting base.

20. A method for producing a layered product comprising:
repeating a process unit on a rotating supporting base a predetermined number of times, the process unit including:
applying a resin material so as to deposit a resin layer;
applying a patterning material on the resin layer; and
depositing a metal thin film layer;
thereby producing a layered product comprising resin layers and metal thin film layers, wherein
residual patterning material is removed, after the step of depositing the metal thin film layer and before the step of depositing the resin layer.

21. The method for producing a layered product according to claim 20, wherein the patterning material is removed by heating.

22. The method for producing a layered product according to claim 21, wherein the heating is performed by light irradiation.

23. The method for producing a layered product according to claim 20, wherein the patterning material is removed by decomposition.

24. The method for producing a layered product according to claim 23, wherein the decomposition is performed by at least one selected from the group consisting of plasma irradiation, ion irradiation, and electron irradiation.

25. The method for producing a layered product according to claim 20, wherein the resin material is cured until a curing degree of the resin layer reaches 50 to 95% after being applied.

26. The method for producing a layered product according to claim 20, wherein the surface of the resin layer is treated before the step of applying the patterning material.

27. The method for producing a layered product according to claim 26, wherein the surface is treated with oxygen plasma.

28. A method for producing a layered product comprising:
repeating a process unit on a rotating supporting base a predetermined number of times, the process unit including:
applying a resin material so as to deposit a resin layer;
applying a patterning material on the resin layer; and
depositing a metal thin film layer,
thereby producing a layered product comprising resin layers and metal thin film layers, wherein
the patterning material is at least one oil selected from the group consisting of ester oils and fluorocarbon oils.

29. The method for producing a layered product according to claim 28, wherein a vapor pressure of the patterning material reaches 0.1 torr at a temperature in a range from 80 to 250° C.

30. The method for producing a layered product according to claim 28, wherein an average molecular weight of the oil is 200 to 3000.

31. The method for producing a layered product according to claim 28, wherein the resin material is cured until a curing degree of the resin layer reaches 50 to 95% after being applied.

32. The method for producing a layered product according to claim 28, wherein the surface of the resin layer is treated before the step of applying the patterning material.

33. A method for producing a layered product comprising:
repeating a process unit on a rotating supporting base a predetermined number of times, the process unit including:
applying a resin material so as to deposit a resin layer;
applying a patterning material on the resin layer in a contactless manner; and
depositing a metal thin film layer;
thereby producing a layered product comprising resin layers and metal thin film layers, wherein
the resin material is cured until a curing degree of the resin layer reaches 50 to 95% after being applied.

34. A method for producing a layered product comprising:
repeating a process unit on a rotating supporting base a predetermined number of times, the process unit including:
applying a resin material so as to deposit a resin layer;
applying a patterning material on the resin layer in a contactless manner; and
depositing a metal thin film layer;
thereby producing a layered product comprising resin layers and metal thin film layers, wherein
the surface of the resin layer is treated before the step of applying the patterning material.

35. The method for producing a layered product according to claim 34, wherein the surface is treated with oxygen plasma.

36. A method for producing a layered product comprising:
repeating a process unit a predetermined number of times, the process unit including:
applying a resin material so as to deposit a dielectric layer;
applying a patterning material in a belt-shape on the dielectric layer; and
depositing a metal thin film layer,
thereby producing a layered product comprising dielectric layers and metal thin film layers,
wherein a position of $2n^{th}$ (n is a natural number) application of the patterning material is different from that of $2n-1^{th}$ application, and
all the positions of the $2n^{th}$ application of the patterning material are not the same, and
all the positions of the $2n-1^{th}$ application of the patterning material are not the same.

37. The method for producing a layered product according to claim 36,
wherein a position of $2n+1^{th}$ application of the patterning material with respect to the position of the $2n-1^{th}$ application of the patterning material is displaced by W/20 to 4W, where W is an application width of the belt-shaped.

38. The method for producing a layered product according to claim 36,
wherein a maximum of variations of the positions of the $2n^{th}$ application of the patterning material and a maximum of variations of the positions of the $2n-1^{st}$ application of the patterning material is 6W/5 to 5W, where W is an application width of the belt-shaped patterning material.

* * * * *